(12) United States Patent
Akimoto et al.

(10) Patent No.: US 8,502,216 B2
(45) Date of Patent: Aug. 6, 2013

(54) SEMICONDUCTOR DEVICE

(75) Inventors: Kengo Akimoto, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 591 days.

(21) Appl. No.: 12/612,700

(22) Filed: Nov. 5, 2009

(65) Prior Publication Data

US 2010/0117075 A1    May 13, 2010

(30) Foreign Application Priority Data

Nov. 7, 2008    (JP) ................... 2008-286278

(51) Int. Cl.
*H01L 29/26* (2006.01)
(52) U.S. Cl.
USPC .................. 257/43; 257/40; 257/E29.079
(58) Field of Classification Search
USPC ...................... 257/40, 43, E29.079
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Park et al., "Improvements in the device characteristics of amorphous indium gallium zinc oxide thin-film transistors by Ar plasma treatment," Appl. Phys. Lett., vol. 90, pp. 262106-1-262106-3, 2007.

(Continued)

*Primary Examiner* — Lynne Gurley
*Assistant Examiner* — Vernon P Webb
(74) *Attorney, Agent, or Firm* — Eric J. Robinson; Robinson Intellectual Property Law Office, P.C.

(57) ABSTRACT

An object is to prevent an impurity such as moisture and oxygen from being mixed into an oxide semiconductor and suppress variation in semiconductor characteristics of a semiconductor device in which an oxide semiconductor is used. Another object is to provide a semiconductor device with high reliability. A gate insulating film provided over a substrate having an insulating surface, a source and a drain electrode which are provided over the gate insulating film, a first oxide semiconductor layer provided over the source electrode and the drain electrode, and a source and a drain region which are provided between the source electrode and the drain electrode and the first oxide semiconductor layer are provided. A barrier film is provided in contact with the first oxide semiconductor layer.

11 Claims, 29 Drawing Sheets

(56) References Cited

U.S. PATENT DOCUMENTS

| | | | |
|---|---|---|---|
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1* | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0239335 A1 | 9/2009 | Akimoto et al. | |
| 2009/0269881 A1 | 10/2009 | Furuta et al. | |
| 2009/0278122 A1 | 11/2009 | Hosono et al. | |
| 2009/0280050 A1 | 11/2009 | Hosono et al. | |
| 2010/0055832 A1* | 3/2010 | Akimoto et al. | 438/104 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2007-073705 A | 3/2007 |
| JP | 2007-096055 | 4/2007 |
| JP | 2007-115808 | 5/2007 |
| JP | 2007-123861 | 5/2007 |
| JP | 2008-042088 A | 2/2008 |
| JP | 2008-535205 | 8/2008 |
| WO | WO-2007/089048 | 8/2007 |

OTHER PUBLICATIONS

Jeong et al., "High performance thin film transistors with cosputtered amorphous indium gallium zinc oxide channel," Appl. Phys. Lett., vol. 91, pp. 113505-1-113505-3, 2007.

Kimura et al., "Trap densities in amorphous-InGaZnO4 thin-film transistors," Appl. Phys. Lett., vol. 92, pp. 133512-1-133512-3, 2008.

International Search Report (Application No. PCT/JP2009/068735) Dated Nov. 24, 2009.

Written Opinion (Application No. PCT/JP2009/068735) Dated Nov. 24, 2009.

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m(m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2007, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest'09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates. D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZNO TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al. "Current Staus of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU OR ZN] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered AI2O3 Gate Insulator,", Appl. Phys Lett. (Applied Physics Letters) , Sep. 1, 2003, vol. 83, No. 9, pp. 1755-1757.

* cited by examiner

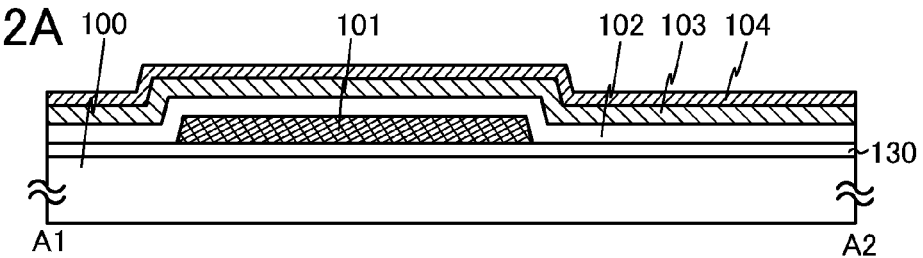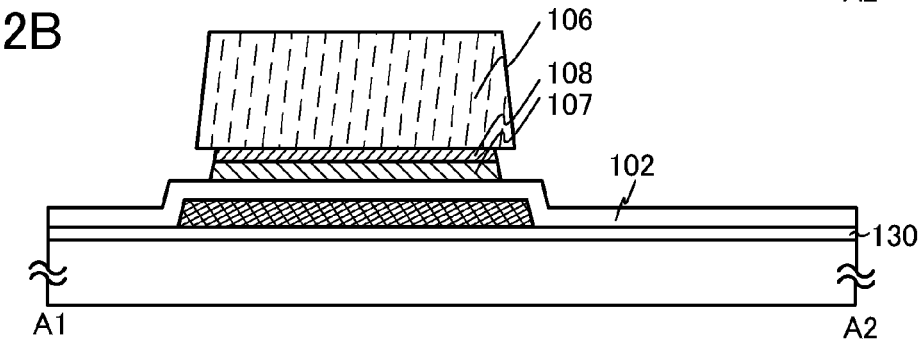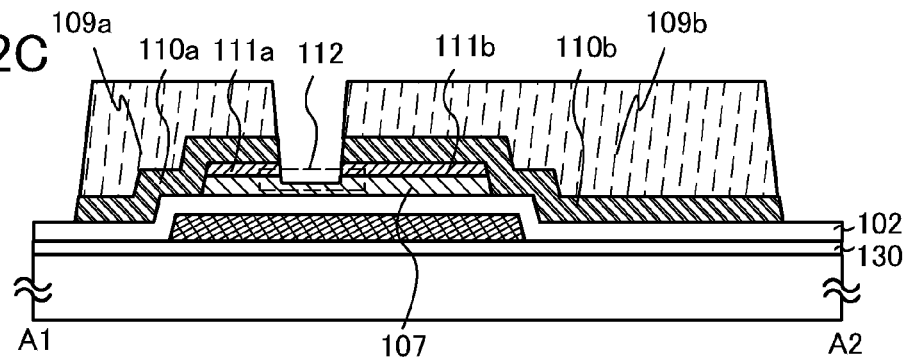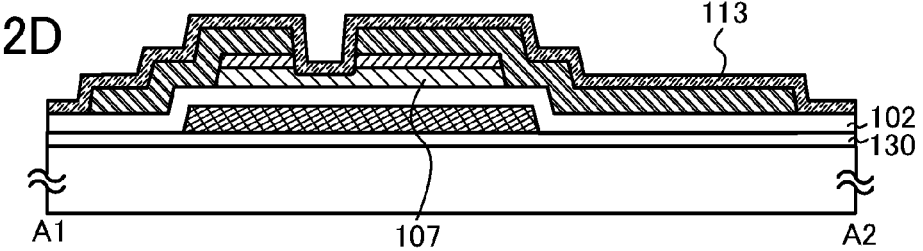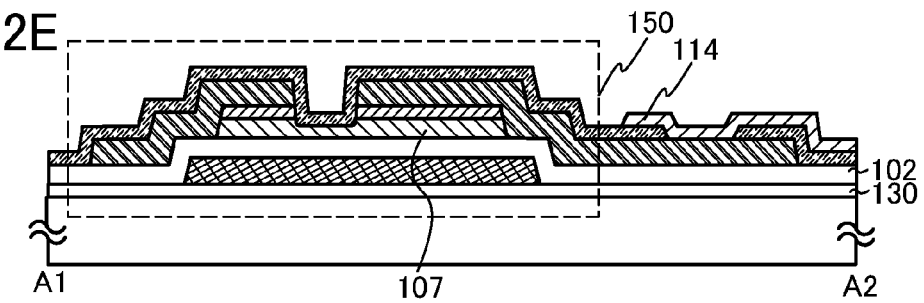

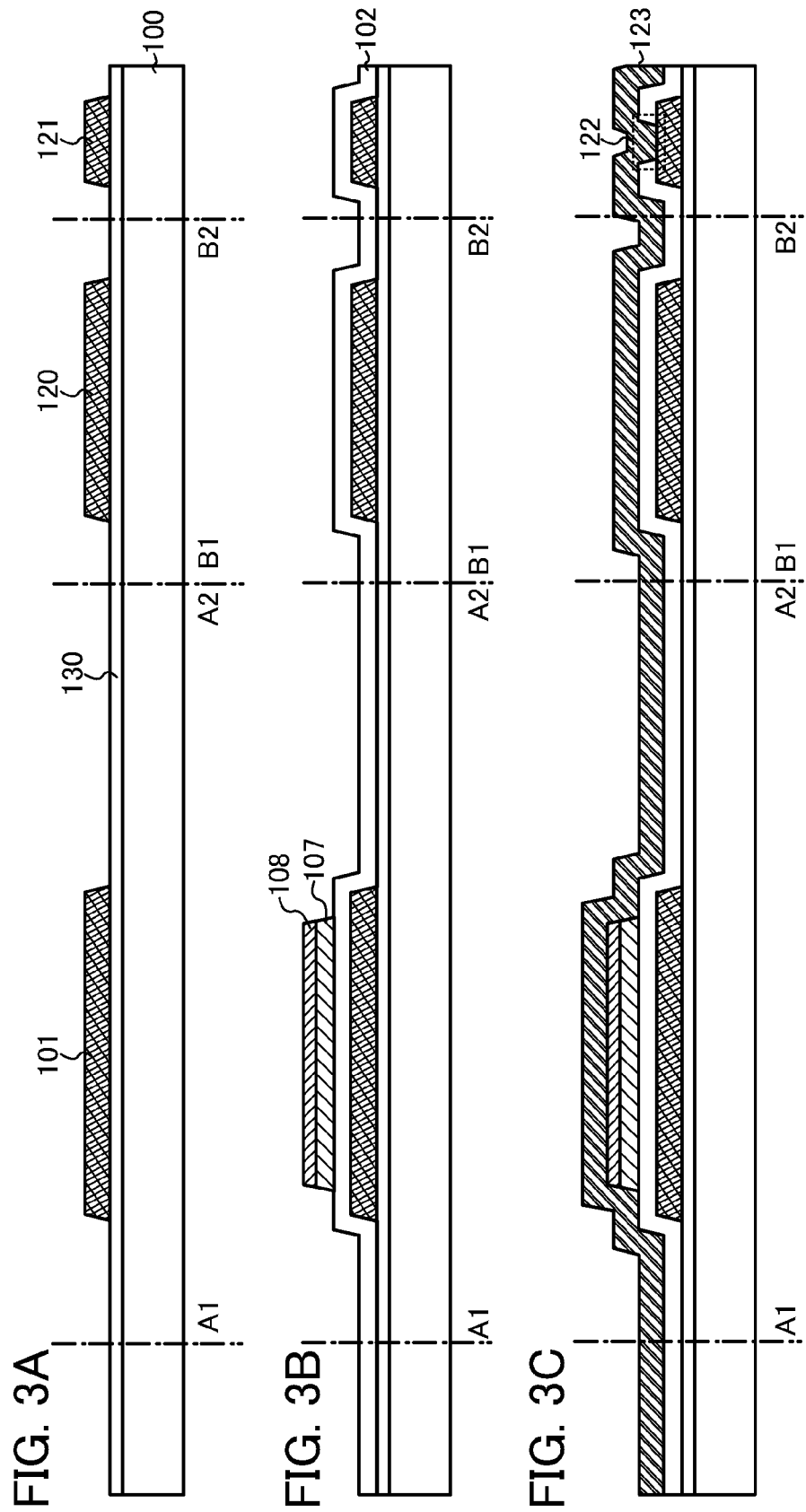

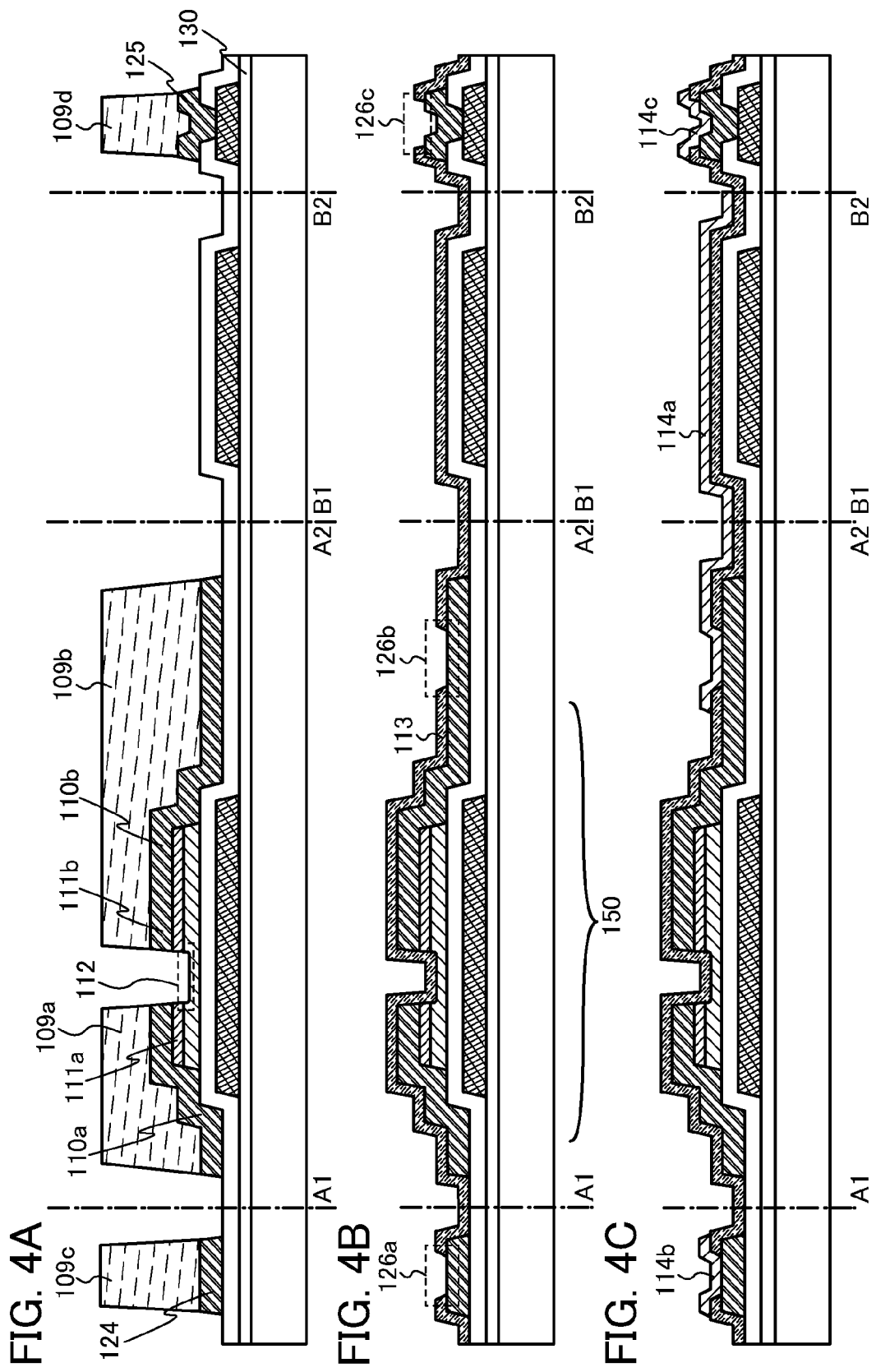

FIG. 5A1
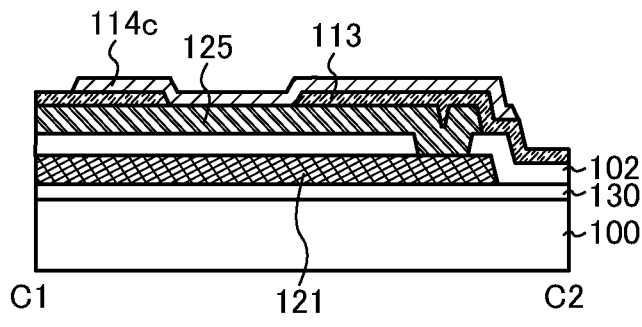
FIG. 5A2
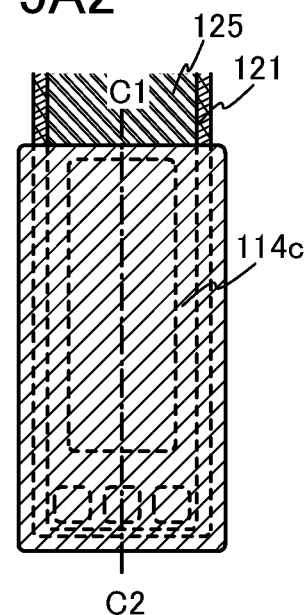
FIG. 5B1
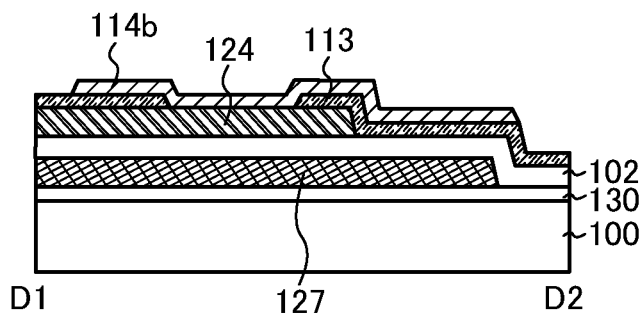
FIG. 5B2
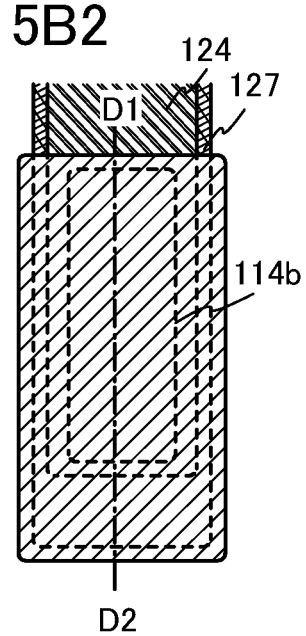

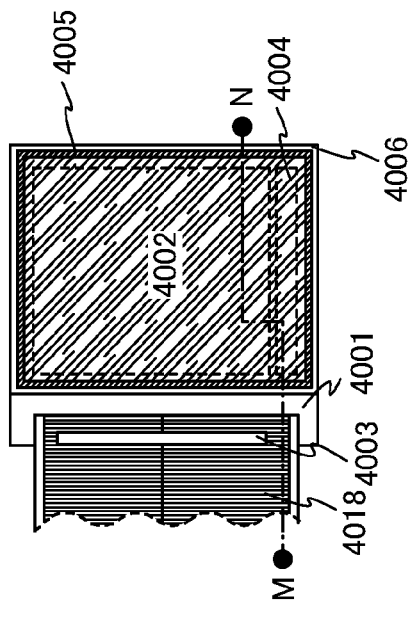
FIG. 22A1
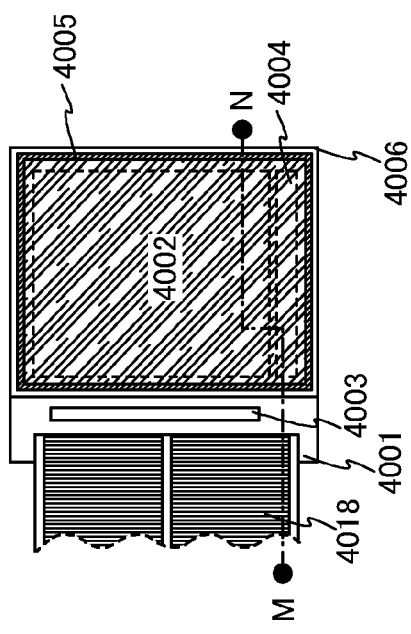
FIG. 22A2
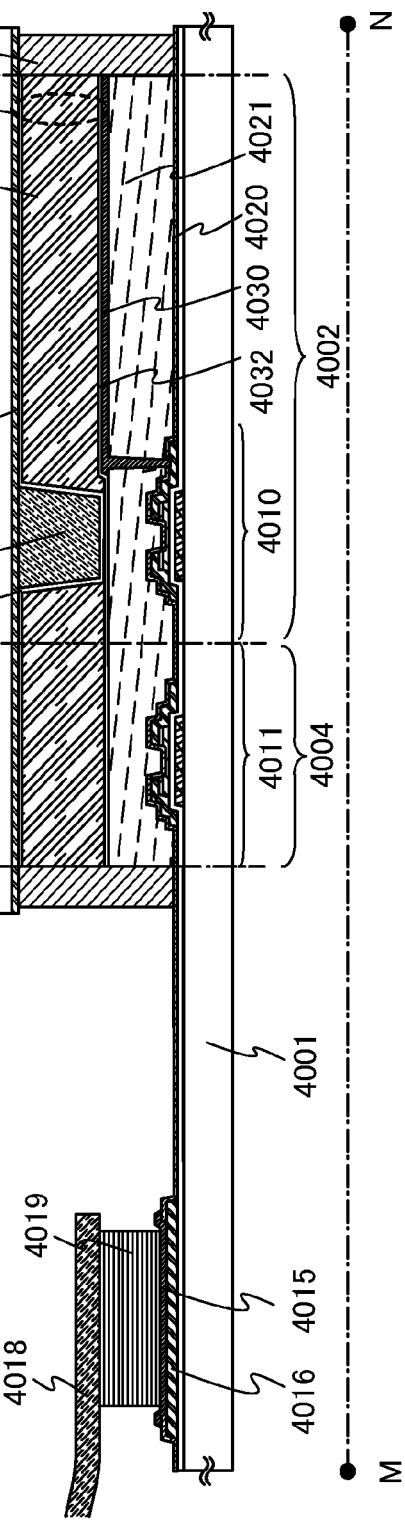
FIG. 22B

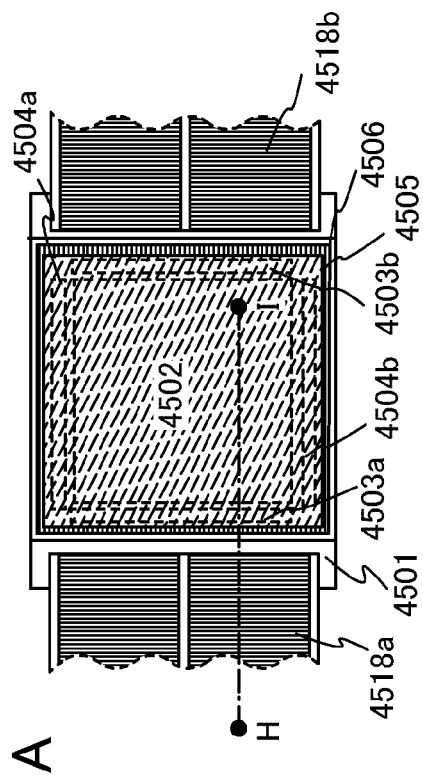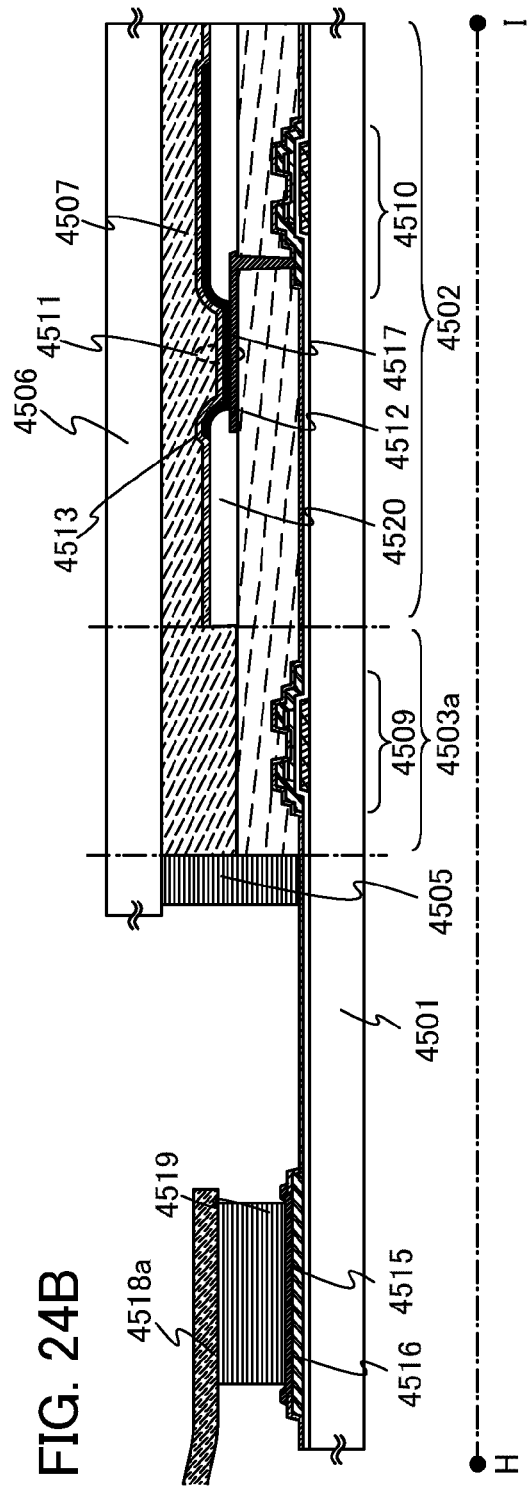

SEMICONDUCTOR DEVICE

TECHNICAL FIELD

The present invention relates to a semiconductor device in which an oxide semiconductor is used and a manufacturing method thereof.

BACKGROUND ART

As typically seen in a liquid crystal display device, a thin film transistor formed over a flat plate such as a glass substrate is manufactured using amorphous silicon or polycrystalline silicon. A thin film transistor manufactured using amorphous silicon has low field effect mobility, but can be formed over a larger glass substrate. In contrast, a thin film transistor manufactured using crystalline silicon has high field effect mobility, but due to a crystallization step such as laser annealing, such a transistor is not always suitable for being formed over a larger glass substrate.

Techniques have attracted attention, in which a thin film transistor using an oxide semiconductor is manufactured and applied to electronic devices or optical devices. For example, Patent Document 1 and Patent Document 2 disclose a technique by which a thin film transistor is manufactured using zinc oxide or an In—Ga—Zn—O based oxide semiconductor for an oxide semiconductor film and such a transistor is used as a switching element or the like of an image display device.

REFERENCE

[Patent Document 1] Japanese Published Patent Application No. 2007-123861.
[Patent Document 2] Japanese Published Patent Application No. 2007-096055.

DISCLOSURE OF INVENTION

Semiconductor characteristics of such an oxide semiconductor are significantly influenced by an oxygen vacancy concentration in the oxide semiconductor. Therefore, in order to suppress variation in the semiconductor characteristics of an oxide semiconductor, it is important to suppress oxidation-reduction reaction of the oxide semiconductor and keep the oxygen vacancy concentration. Thus, mixing of moisture and oxygen into an oxide semiconductor has been prevented by providing an oxide film or a nitride film mainly including silicon over the oxide semiconductor.

However, by using a silicon oxide film or a silicon nitride film, it has been difficult to satisfactorily prevent moisture and oxygen from being mixed into the oxide semiconductor. In addition, if the thickness of a silicon oxide film or a silicon nitride film is increased in order to prevent penetration of moisture and oxygen, a crack is easily caused.

Moreover, there is a problem in that semiconductor characteristics of an oxide semiconductor are changed when an impurity such as an alkali metal (Li, Cs, Na, or the like), an alkaline earth metal (Ca, Mg, or the like), or another metal element as well as moisture and oxygen are diffused into the oxide semiconductor.

In view of the aforementioned problems, an object is to prevent an impurity such as moisture and oxygen from being mixed into an oxide semiconductor and suppress variation in semiconductor characteristics of a semiconductor device in which an oxide semiconductor is used. Another object is to provide a semiconductor device with high reliability.

An embodiment of the present invention disclosed is a semiconductor device including a gate electrode layer provided over a substrate having an insulating surface, a gate insulating film provided over the gate electrode layer, a source electrode and a drain electrode which are provided over the gate insulating film, a first oxide semiconductor layer provided over the source electrode and the drain electrode, and a source region and a drain region which are provided between the source electrode and the drain electrode and the first oxide semiconductor layer. In the semiconductor device, a barrier film is provided in contact with the first oxide semiconductor layer.

Another embodiment of the present invention disclosed is a semiconductor device including a gate electrode layer provided over a substrate having an insulating surface, a gate insulating film provided over the gate electrode layer, a first oxide semiconductor layer provided over the gate electrode layer with the gate insulating film interposed therebetween, a source region and a drain region which are provided separately from each other over the first oxide semiconductor layer, a source electrode provided over and in contact with the source region, and a drain electrode provided over and in contact with the drain region. In the semiconductor device, a barrier film is provided in contact with the first oxide semiconductor layer.

Another embodiment of the present invention disclosed is a semiconductor device including a gate electrode layer provided over a substrate having an insulating surface, a gate insulating film provided over the gate electrode layer, a first oxide semiconductor layer provided over the gate insulating film, a channel protective layer provided in a region overlapping with a channel formation region of the first oxide semiconductor layer, a source electrode and a drain electrode which are provided over the first oxide semiconductor layer, and a source region and a drain region between the first oxide semiconductor layer and the source electrode and the drain electrode. In the semiconductor device, a barrier film is provided in contact with the channel protective layer.

In the aforementioned structure, the barrier film includes one or more of an aluminum oxide film, an aluminum nitride film, an aluminum oxynitride film, and an aluminum nitride oxide film. The thickness of the barrier film is preferably greater than or equal to 1 nm and less than or equal to 200 nm.

In addition, in the aforementioned structure, a base insulating film may be provided over the substrate having an insulating surface. The base insulating film includes one or more of an aluminum oxide film, an aluminum nitride film, an aluminum oxynitride film, and an aluminum nitride oxide film.

Further, in the aforementioned structure, the gate insulating film includes one or more of an aluminum oxide film, an aluminum nitride film, an aluminum oxynitride film, and an aluminum nitride oxide film.

Furthermore, in the aforementioned structure, the channel protective layer includes one or more of an aluminum oxide film, an aluminum nitride film, an aluminum oxynitride film, and an aluminum nitride oxide film. The thickness of the channel protective layer is greater than 0 nm and less than or equal to 5 nm.

In the aforementioned structure, the source region and the drain region are second oxide semiconductor layers having higher conductivity than the first oxide semiconductor layer.

An example of oxide semiconductors which can be used in this specification includes $InMO_3(ZnO)_m$ (m>0). Here, "M" is a metal element or a plurality of metal elements selected from gallium (Ga), iron (Fe), nickel (Ni), manganese (Mn) and cobalt (Co). For example, when M is Ga, only Ga is included, or the above metal element is included in addition to Ga, for example, M includes Ga and Na, Ga and Fe, or the like. Further, in the above oxide semiconductor, a transition metal element such as Fe or Ni, or an oxide of the transition metal may be included as an impurity element in addition to the element included as M. In this specification, among the above oxide semiconductors, an oxide semiconductor including at least gallium as M is referred to as an In—Ga—Zn—O based oxide semiconductor, and a thin film using the material is referred to as an In—Ga—Zn—O based non-single-crystal film in some cases.

Note that the term "semiconductor device" in this specification refers to devices in general that can operate by utilizing semiconductor characteristics, and display devices, electro-optical devices, semiconductor circuits, and electronic devices are included in the category of the semiconductor device.

According to an embodiment of the present invention, a film having a high barrier property against an impurity such as moisture and oxygen is used to prevent an impurity such as moisture and oxygen from being mixed into an oxide semiconductor, so that variation in semiconductor characteristics of a semiconductor device in which an oxide semiconductor is used can be suppressed. Further, reliability of the semiconductor device can be improved.

BRIEF DESCRIPTION OF DRAWINGS

FIGS. 2A to 2E illustrate a manufacturing method of the semiconductor device according to Embodiment 1;

FIGS. 3A to 3C illustrate a manufacturing method of a semiconductor device according to Embodiment 1;

FIGS. 4A to 4C illustrate the manufacturing method of the semiconductor device according to Embodiment 1;

FIGS. 5A1 and 5A2 and FIGS. 5B1 and 5B2 illustrate the semiconductor device according to Embodiment 1;

FIGS. 22A1 and 22A2 and FIG. 22B illustrate semiconductor devices according to Embodiment 5;

FIGS. 24A and 24B illustrate a semiconductor device according to Embodiment 7;

BEST MODE FOR CARRYING OUT THE INVENTION

Figure 1A:
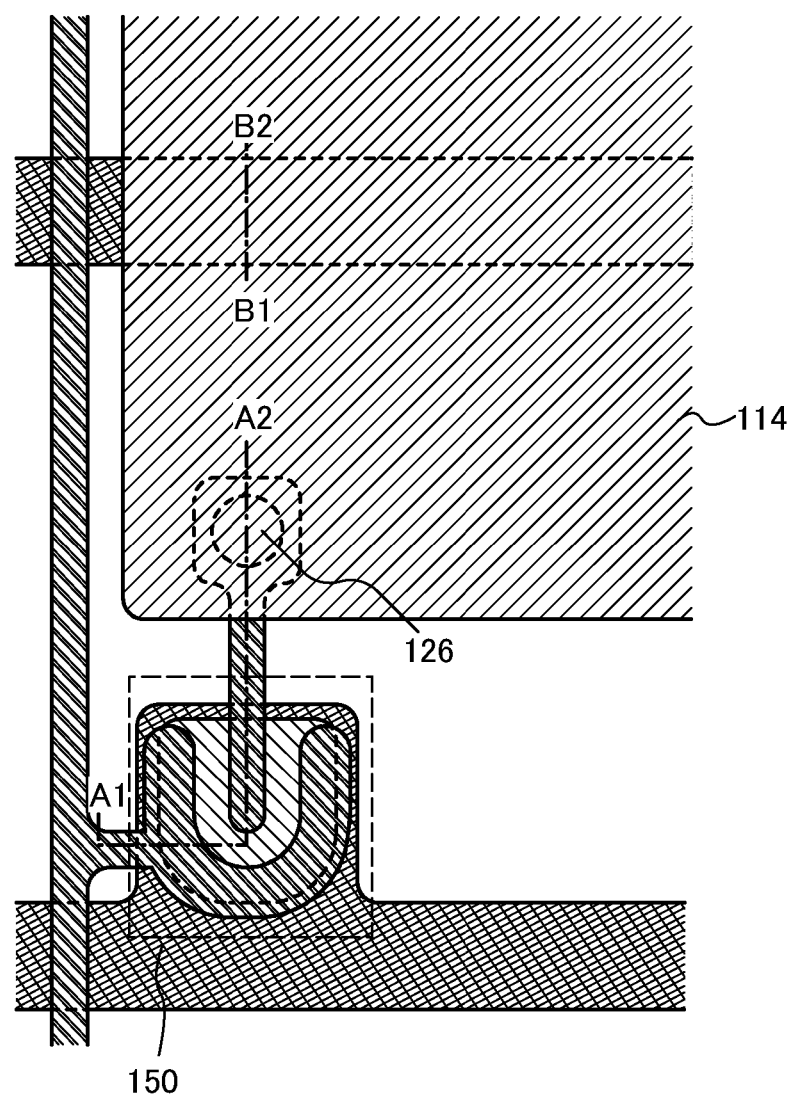
FIG. 1A is a plan view of a semiconductor device according to Embodiment 1.

The embodiments will be described with reference to the drawings. Note that the present invention is not limited to the description in the embodiments below, and it is apparent to those skilled in the art that modes and details of the present invention can be changed in various ways without departing from its spirit. Further, structures and methods according to different embodiments can be carried out with appropriate combination. In structures and methods of the invention described below, the same reference numeral is given to the same parts or parts having similar functions, and repeated description thereof is omitted.

In this specification, a "film" means what is formed over an entire surface and is not patterned. A "layer" means what is patterned into a desired shape with a resist mask or the like. This discrimination between "film" and "layer" is for convenience, and they are used without any discrimination in some cases. Also as for each layer in a stacked-layer film, the "film" and the "layer" are used without any discrimination in some cases.

Note that in this specification, numerals such as "first", "second", and "third" which are included in a term are given for convenience in order to distinguish elements, do not limit the number, the arrangement, and the order of the steps.

Embodiment 1

In this embodiment, semiconductor devices and manufacturing methods thereof are described with reference to FIGS. 1A and 1B, FIGS. 2A to 2E, FIGS. 3A to 3C, FIGS. 4A to 4C, FIGS. 5A1, 5A2, 5B1, and 5B2, and FIG. 6.

Figure 1B:
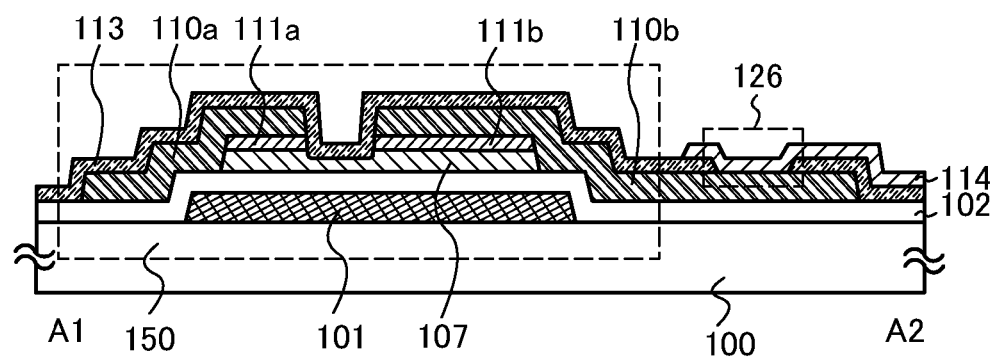
FIG. 1B is a cross-sectional view taken along line A1-A2 in FIG. 1A.

FIGS. 1A and 1B illustrate a pixel including a thin film transistor of this embodiment. FIG. 1A is a plan view and FIG. 1B is a cross-sectional view taken along line A1-A2 in FIG. 1A.

A thin film transistor 150 illustrated in FIGS. 1A and 1B is a so-called inverted-staggered thin film transistor. The thin film transistor 150 includes a gate electrode layer 101 provided over a substrate 100, a gate insulating film 102 covering the gate electrode layer 101, an oxide semiconductor layer 107 provided over the gate insulating film 102, a pair of oxide semiconductor layers 111a and 111b which are provided over and in contact with the oxide semiconductor layer 107 and are separated from each other, and a pair of conductive layers 110a and 110b which are in contact with the pair of oxide semiconductor layers 111a and 111b respectively and are separated from each other.

The oxide semiconductor layer 107 is formed using an In—Ga—Zn—O based non-single-crystal film. In addition, the oxide semiconductor layers 111a and 111b, which are formed using In—Ga—Zn—O based non-single-crystal films having higher conductivity than the oxide semiconductor layer 107, form a source region and a drain region. Further, the conductive layers 110a and 110b form a source electrode layer and a drain electrode layer. The conductive layer 110a and 110b functioning as the source electrode and the drain electrode, which are formed separately from each other, correspond to the oxide semiconductor layers 111a and 111b which are formed separately from each other. That is, the conductive layer 110a is provided over the oxide semiconductor layer 111a, and the conductive layer 110b is provided over the oxide semiconductor layer 111b. Further, each layer is patterned into a desired shape. Note that the oxide semiconductor layers 111a and 111b are also referred to as n$^+$ layers.

The thin film transistor 150 illustrated in FIGS. 1A and 1B is an example in which a recessed portion is included in the oxide semiconductor layer 107 which are positioned between the oxide semiconductor layers 111a and 111b which form the source region and the drain region. Such a thin film transistor is also referred to as a channel-etched thin film transistor.

In FIG. 1B, a barrier film 113 is provided over the conductive layers 110a and 110b. In addition, the barrier film 113 is provided in contact with a part of the oxide semiconductor layer 107. The barrier film 113 is provided to prevent the entry of an impurity such as organic substances and metals; moisture; oxygen; and the like floating in the atmosphere, and is preferably a dense film. A barrier property against an impurity such as moisture and oxygen is improved by formation using a dense film. The barrier film 113 can be formed with a single layer or a stacked layer using an aluminum oxide film, an aluminum nitride film, an aluminum oxynitride film, or an aluminum nitride oxide film. The thickness of the barrier film 113 is preferably greater than or equal to 1 nm and less than or equal to 200 nm. Note that the property of the barrier film 113 can be found by an X-ray reflectometer (XRR), thermal desorption spectroscopy (TDS), auger electron spectroscopy (AES), or secondary ion mass spectroscopy (SIMS).

When the film having a high barrier property against moisture and oxygen is formed over the oxide semiconductor layer to cover the oxide semiconductor layer, moisture and oxygen can be prevented from being mixed into the oxide semiconductor layer. Accordingly, oxidation-reduction reaction of the oxide semiconductor layer and variation in an oxygen vacancy concentration can be suppressed. Further, an impurity such as organic substances and metals included in the atmosphere or in a base material can be prevented from being mixed into the oxide semiconductor layer. Therefore, variation in semiconductor characteristics of the semiconductor device in which an oxide semiconductor is used can be suppressed. Moreover, reliability of the semiconductor device can be improved.

In FIG. 1B, in the case where a base insulating film is provided between the substrate 100 and the gate electrode layer 101, the base insulating film can also be formed with a single layer or a stacked layer using an aluminum oxide film, an aluminum nitride film, an aluminum oxynitride film, an aluminum nitride oxide film, or the like. When the base insulating film is formed using a dense film, moisture and oxygen can be prevented from entering the oxide semiconductor layer from the substrate 100 side. In addition, an impurity included in the substrate 100, such as an alkali metal (Li, Cs, Na, or the like), an alkaline earth metal (Ca, Mg, or the like), or another metal element, can be prevented from entering the oxide semiconductor layer. Note that Na is included in the oxide semiconductor layer 107 at less than or equal to $5\times10^{19}/cm^3$, or preferably less than or equal to $1\times10^{18}/cm^3$ when the semiconductor device is completed. Thus, variation in the semiconductor characteristics of the semiconductor device in which the oxide semiconductor is used can be suppressed. Accordingly, reliability of the semiconductor device can be improved.

The thin film transistor 150 illustrated in FIG. 1A can be applied to a pixel transistor provided in a pixel portion of a display device typified by a liquid crystal display device or an electroluminescent (EL) display device. Therefore, in the illustrated example, a contact hole 126 is provided in the barrier film 113, a pixel electrode layer (a transparent conductive layer 114) is provided over the barrier film 113, and the pixel electrode layer (the transparent conductive layer 114) and the conductive layer 110b are connected to each other through the contact hole 126 provided in the barrier film 113.

As illustrated in FIG. 1A, one of the source electrode and the drain electrode of the thin film transistor 150 has a U-shape (or a rotated C-shape or a horseshoe shape), and surrounds the other of the source electrode and the drain electrode. A distance between the source electrode and the drain electrode is kept almost constant.

The thin film transistor 150 has the above shape, whereby the channel width of the thin film transistor 150 can be increased and thus the amount of current is increased. Further, variation in electric characteristics can be reduced. Further, decrease in reliability due to misalignment of a mask pattern in a manufacturing process can be suppressed. This embodiment is not limited to this shape, and one of the source electrode and the drain electrode of the thin film transistor 150 does not necessarily have a U-shape.

Next, an example of a manufacturing process of the semiconductor device is described with reference to FIGS. 2A to 2E.

First, the gate electrode layer 101 is formed over the substrate 100 having the insulating surface, and then the gate insulating film 102 is formed over the gate electrode layer 101. After that, an oxide semiconductor film 103 and an oxide semiconductor film 104 are formed to be stacked (see FIG. 2A).

As the substrate 100 having the insulating surface, for example, a glass substrate having a visible-light-transmitting property used for a liquid crystal display device or the like, can be used. The aforementioned glass substrate is preferably an alkali-free glass substrate. As a material of the alkali-free glass substrate, a glass material such as aluminosilicate glass, aluminoborosilicate glass, or barium borosilicate glass is used, for example. In addition, as the substrate 100 having the insulating surface, an insulating substrate formed from an insulator such as a ceramic substrate, a quartz substrate, or a sapphire substrate; a semiconductor substrate which is formed from a semiconductor material such as silicon and whose surface is covered with an insulating material; a conductive substrate which is formed from a conductor such as metal or stainless steel and whose surface is covered with an insulating material; or the like can be used.

Note that as illustrated in FIG. 2A, an insulating film 130 which is to be a base film may be provided over the substrate 100 having the insulating surface. The insulating film 130 has a function of preventing diffusion of an impurity from the substrate 100, such as an alkali metal (Li, Cs, Na, or the like), an alkaline earth metal (Ca, Mg, or the like), or another metal element. Note that Na is included in the oxide semiconductor layer 107 at less than or equal to $5\times10^{19}/cm^3$, or preferably less than or equal to $1\times10^{18}/cm^3$ when the semiconductor device is completed. The insulating film 130 can be formed with a stacked-structure of one or a plurality of films selected from a silicon nitride film, a silicon oxide film, a silicon nitride oxide film, a silicon oxynitride film, an aluminum oxide film, an aluminum nitride film, an aluminum oxynitride film, and an aluminum nitride oxide film.

After a conductive film is formed over the substrate 100, the conductive film is selectively etched using a resist mask formed by a photolithography method, whereby the gate electrode layer 101 can be formed. In this case, in order to improve the coverage with the gate insulating film 102 formed later and prevent disconnection, edge portions of the gate electrode layer 101 are preferably etched so as to have a tapered shape. Note that the gate electrode layer 101 includes electrodes and wirings which are formed using the conductive film, such as a gate wiring.

The gate electrode layer 101 can be formed with a single layer or a stacked layer using a metal material such as aluminum, copper, molybdenum, titanium, chromium, tantalum, or tungsten; an alloy material including any of these materials as a main component; or a nitride including any of these materials as a main component. The gate electrode layer 101 is desirably formed using a low-resistant conductive material such as aluminum. Note that in the case where aluminum is used for the wirings and the electrodes, since the use of aluminum alone brings disadvantages such as low heat-resistance and a tendency to be corroded, aluminum is preferably used in combination with a heat-resistant conductive material.

As the heat-resistant conductive material, an element selected from titanium, tantalum, tungsten, molybdenum, and chromium, or an alloy including any of these elements, an alloy film including a combination of these elements, or a nitride including any of these elements can be used. A film formed from such a heat-resistant conductive material, and aluminum (or copper) are stacked, so that the wirings and electrodes can be formed.

The gate insulating film 102 can be formed with a single layer or stacked layer using a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film. The gate insulating film 102 can be formed to a thickness of greater than or equal to 50 nm and less than or equal to 250 nm by a sputtering method or the like. For example, as the gate insulating film 102, a silicon oxide film with a thickness of 100 nm can be formed by a sputtering method. Alternatively, an aluminum oxide film with a thickness of 100 nm can be formed by a sputtering method.

When the insulating film 130 or the gate insulating film 102 is formed using a dense film, moisture and oxygen can be prevented from entering the oxide semiconductor layer from the substrate 100 side. In addition, an impurity included in the substrate 100, such as an alkali metal (Li, Cs, Na, or the like), an alkaline earth metal (Ca, Mg, or the like), or another metal element, can be prevented from entering the oxide semiconductor layer. Note that Na is included in the oxide semiconductor layer 107 at less than or equal to $5\times10^{19}/cm^3$ or preferably less than or equal to $1\times10^{18}/cm^3$ when the semiconductor device is completed. Thus, variation in the semiconductor characteristics of the semiconductor device in which the oxide semiconductor is used can be suppressed. Accordingly, reliability of the semiconductor device can be improved.

Before the oxide semiconductor film 103 is formed over the gate insulating film 102, a surface of the gate insulating film 102 may be subjected to plasma treatment. By plasma treatment, dust attached to the surface of the gate insulating film 102 can be removed.

Plasma treatment can be performed in such a manner that an inert gas such as an argon (Ar) gas is introduced into a vacuum chamber, and a bias voltage is applied to a processing object (here, the gate insulating film 102 formed over the substrate 100) so that a plasma state is generated. In the case where an Ar gas is introduced in to the chamber, electrons and cations of Ar exist in the plasma and cations of Ar are accelerated in a cathode direction (toward the substrate 100 side). The accelerated cations of Ar collide with the surface of the gate insulating film 102 formed over the substrate 100, whereby the surface of the gate insulating film 102 is etched by sputtering to be reformed. Such plasma treatment described above is also referred to as "reverse sputtering" in some cases. In this embodiment, a bias voltage is applied to the substrate 100 side in the plasma treatment. Alternatively, plasma treatment may be performed without application of a bias voltage as long as the surface of the gate insulating film 102 can be reformed.

In place of an argon gas, a helium gas may be used as the gas used in the plasma treatment. Alternatively, an argon atmosphere to which oxygen, hydrogen, nitrogen, or the like is added may be employed. Further alternatively, an argon atmosphere to which $Cl_2$, $CF_4$, or the like is added may be employed.

The oxide semiconductor film 103 can be formed using an In—Ga—Zn—O based non-single-crystal film. For example, the oxide semiconductor film 103 is formed by a sputtering method using an oxide semiconductor target including In, Ga, and Zn ($In_2O_3$:$Ga_2O_3$:$ZnO$=1:1:1). The following conditions may be employed for the sputtering, for example: a distance between the substrate 100 and the target is 30 mm to 500 mm; the pressure is 0.1 Pa to 2.0 Pa; the DC power source is 0.25 kW to 5.0 kW (when the target with a size of 8-inch in diameter is used); and the atmosphere is an argon atmosphere, an oxygen atmosphere, or a mixed atmosphere of argon and oxygen.

A pulsed DC power source is preferably used because dust can be reduced and a thickness can be uniformed. In addition, the above plasma treatment is performed, and then the oxide semiconductor film 103 is formed without being exposed to the atmosphere, so that dust and moisture can be prevented from attaching to an interface between the gate insulating film 102 and the oxide semiconductor film 103. The thickness of the oxide semiconductor film 103 may be approximately 5 nm to 200 nm.

As the above sputtering method, an RF sputtering method in which a high frequency power source is used as a sputtering power source, a DC sputtering method, a pulsed DC sputtering method in which direct current bias is applied in pulses, or the like can be employed. An RF sputtering method is mainly used in the case of forming an insulating film, and a DC sputtering method is mainly used in the case of forming a metal film.

Alternatively, a multi-target sputtering apparatus in which a plurality of targets which are formed of different materials from each other may be used. In a multi-target sputtering apparatus, a stack of different films can be formed in one chamber, or one film can be formed by sputtering using plural kinds of materials at the same time in one chamber. Alternatively, a method using a magnetron sputtering apparatus in which a magnetic field generating system is provided inside the chamber (a magnetron sputtering method), an ECR sputtering method in which plasma generated by using a micro wave is used, or the like may be employed. Further alternatively, a reactive sputtering method in which a target substance and a sputtering gas component are chemically reacted with each other to form a compound thereof at the time of film formation, a bias sputtering method in which a voltage is applied also to the substrate at the time of film formation, or the like may be employed.

Next, the oxide semiconductor film 104 having higher conductivity than the oxide semiconductor film 103 is formed over the oxide semiconductor film 103. The oxide semiconductor film 104 can be formed using an In—Ga—Zn—O based non-single-crystal film. For example, the oxide semiconductor film 104 can be formed over the oxide semiconductor film 103 by a sputtering method using an oxide semiconductor target including In, Ga, and Zn ($In_2O_3:Ga_2O_3:ZnO=1:1:1$).

In addition, the oxide semiconductor film 104 can be formed using the target ($In_2O_3:Ga_2O_3:ZnO=1:1:1$) used for formation of the oxide semiconductor film 103. As for sputtering conditions, for example, the temperature can be 20° C. to 100° C., the pressure can be 0.1 Pa to 2.0 Pa, the power is 250 W to 3 kW (in the case of 8-inch $\phi$). In addition, an argon gas is introduced at a flow rate of 40 sccm. By controlling a ratio of components of the target or other sputtering formation conditions as appropriate, the presence or absence, density, and the like of a crystal grain can be controlled. The diameter of the crystal grain can be 1 nm to 10 nm approximately. The thickness of the oxide semiconductor film 104 may be 2 nm to 20 nm approximately. Needless to say, when the crystal grain is included in the film, the size of the crystal grain does not exceed the thickness of the film.

Here, it is preferable that the formation conditions of the oxide semiconductor film 103 are different from those of the oxide semiconductor film 104. For example, the flow rate ratio of an oxygen gas to an argon gas in the formation conditions of the oxide semiconductor film 103 is made larger than the flow rate ratio of an oxygen gas to an argon gas in the formation conditions of the oxide semiconductor film 104. Specifically, for the formation condition of the oxide semiconductor film 104, a rare gas (argon, helium, or the like) atmosphere, or an atmosphere including an oxygen gas at 10% or less and a rare gas at 90% or more is employed. For the formation conditions of the oxide semiconductor film 103, an oxygen atmosphere or an atmosphere in which the flow rate ratio of an oxygen gas to a rare gas is 1 or more is employed. The oxide semiconductor film 104 may be successively formed so that the oxide semiconductor film 103 is not exposed to the atmosphere. Note that the oxide semiconductor film 103 and the oxide semiconductor film 104 may be formed using different materials.

Next, a resist mask 106 is formed over the oxide semiconductor film 104, and the oxide semiconductor film 103 and the oxide semiconductor film 104 are selectively etched using the resist mask 106, so that the island-shaped oxide semiconductor layer 107 and an island-shaped oxide semiconductor layer 108 are formed (see FIG. 2B).

Either wet etching or dry etching can be employed as an etching method at this time. Here, the island-shaped oxide semiconductor layer 107 and the island-shaped oxide semiconductor layer 108 are formed by removing unnecessary portions of the oxide semiconductor film 103 and the oxide semiconductor film 104 by wet etching using a mixed solution of acetic acid, nitric acid, and phosphoric acid. Note that after the above etching, the resist mask 106 is removed. In addition, an etchant used for the wet etching is not limited to the above solution as long as the oxide semiconductor film 103 and the oxide semiconductor film 104 can be etched using the etchant. When dry etching is performed, a gas including chlorine or a gas including chlorine to which oxygen is added is preferably used. This is because by using a gas including chlorine and oxygen, etching selectivity of the oxide semiconductor film 103 (and the oxide semiconductor film 104) with respect to the gate insulating film 102 can be easily obtained, and damage to the gate insulating film 102 can be sufficiently reduced.

In this embodiment, an example is described in which the oxide semiconductor layer 107 and the oxide semiconductor layer 108 having higher conductivity than the oxide semiconductor layer 107 are stacked. Alternatively, a single layer of the oxide semiconductor layer 107 can be formed alone.

Next, a conductive film is formed over the island-shaped oxide semiconductor layer 107. The conductive film can be formed by a sputtering method, a vacuum evaporation method, or the like, using a material formed of a metal including an element selected from aluminum, copper, titanium, tantalum, tungsten, molybdenum, nickel, manganese, chromium, neodymium, and scandium; an alloy including any of the above elements; nitride including any of the above elements; or the like. Note that in the case where heat treatment (e.g., heat treatment at approximately 200° C. to 600° C.) is performed after formation of the conductive film, the conductive film preferably has given heat resistance.

For example, the conductive film can be formed with a single-layer structure of a titanium film. Alternatively, the conductive film may be formed with a stacked-layer structure. For example, the conductive film can be formed with a stacked-layer structure of an aluminum film and a titanium film. Further alternatively, a three-layer structure of a titanium film, an aluminum (Al—Nd) film including neodymium, and a titanium film may be employed. Further alternatively, the conductive film may be formed with a single-layer structure of an aluminum film including silicon.

Next, resist masks 109a and 109b are formed over the conductive film, and then the conductive film is selectively etched to form the conductive layers 110a and 110b. At the same time, the island-shaped oxide semiconductor layer 108 is etched to form semiconductor regions (the oxide semiconductor layers 111a and 111b) having higher conductivity than the oxide semiconductor layer 107, and part of the oxide semiconductor layer 107 (part near a surface thereof) is removed (channel-etched), so that a recessed portion 112 is formed in the oxide semiconductor layer 107 (see FIG. 2C).

The recessed portion 112 formed by removing the part of the oxide semiconductor layer 107 corresponds to a region between the conductive layer 110a and the conductive layer 110b and also between the semiconductor region (the oxide semiconductor layer 111a) having higher conductivity than the oxide semiconductor layer 107 and the semiconductor region (the oxide semiconductor layer 111b) having higher conductivity than the oxide semiconductor layer 107. Therefore, the conductive layer 110a functions as one of a source electrode and a drain electrode of a transistor, whereas the conductive layer 110b functions as the other of the source electrode and the drain electrode of the transistor. Note that after the above etching, the resist masks 109a and 109b are removed.

Either wet etching or dry etching can be employed as an etching method at this time. Here, dry etching is preferably performed using a gas including chlorine. The use of dry etching enables miniaturization of a wiring structure or the like as compared to the case of using wet etching. In addition, removal of the oxide semiconductor layer 107 can be performed with high controllability by dry etching owing to high controllability of dry etching. More preferably, oxygen is added to the gas including chlorine. This is because by using the gas including chlorine and oxygen, etching selectivity of the oxide semiconductor layer 107 (and the oxide semiconductor layer 108) with respect to the gate insulating film 102 can be easily obtained, and damage to the gate insulating film 102 can be sufficiently reduced.

After that, heat treatment is preferably performed at 200° C. to 600° C., typically 300° C. to 500° C. Here, heat treatment is performed at 350° C. under a nitrogen atmosphere for 1 hour. By this heat treatment, rearrangement at an atomic level of the In—Ga—Zn—O based oxide semiconductor included in the oxide semiconductor layer 107 and the oxide semiconductor layers 111a and 111b is performed. This heat treatment (also including photo annealing or the like) is important because this heat treatment enables release of distortion which interrupts transfer of carriers in the oxide semiconductor layer 107 and the oxide semiconductor layers 111a and 111b. Note that there is no particular limitation on timing of the above heat treatment as long as the heat treatment is performed after formation of the oxide semiconductor layer 107.

Next, the surface of the oxide semiconductor layer 107 is preferably subjected to plasma treatment before the barrier film 113 is formed. As the plasma treatment for the surface of the oxide semiconductor layer 107, oxygen radical treatment by an oxygen radical or reverse sputtering may be performed.

The oxygen radical treatment by an oxygen radical is preferably performed in an atmosphere of $O_2$, $N_2O$, $N_2$ including oxygen, He including oxygen, Ar including oxygen, or the like. Alternatively, the oxygen radical treatment may be performed in an atmosphere in which $Cl_2$ or $CF_4$ is added to the above atmosphere. Note that the radical treatment is preferably performed without application of a bias voltage to the substrate 100 side. By performing the oxygen radical treatment, the thin film transistor in which the island-shaped oxide semiconductor layer 107 includes a channel formation region can be normally-off transistor, which is in off state when voltage is not applied to the gate electrode. Further, by performing the radical treatment, damage to the island-shaped oxide semiconductor layer 107 due to etching can be recovered.

Reverse sputtering can be performed in such a manner that an inert gas such as an argon (Ar) gas is introduced into a vacuum chamber, and a bias voltage is applied to a processing object (here, the substrate 100) so that a plasma state is generated. In this case, electrons and cations of Ar exist in the plasma and cations of Ar are accelerated in a cathode direction (toward the substrate 100 side). The accelerated cations of Ar collide with the surfaces of the oxide semiconductor layer 107, the gate insulating film 102, and the conductive layers 110a and 110b which are formed over the substrate 100, whereby the surfaces are etched by sputtering to be reformed. Note that a helium gas may be used in place of an argon gas. Alternatively, an argon atmosphere to which oxygen, hydrogen, nitrogen, or the like is added may be used. Further alternatively, an argon atmosphere to which $Cl_2$, $CF_4$, or the like is added may be used.

When the surface of the oxide semiconductor layer 107 is subjected to reverse sputtering, an oxide formed due to exposure of the surface of the oxide semiconductor layer 107 to the atmosphere and an organic substance adsorbed can be removed by etching. In addition, the surface of the oxide semiconductor layer 107 can be activated and therefore, a chemical bond with the barrier film 113 formed next can be strengthened. The reverse sputtering is preferably performed employing an RF sputtering method. This is because when the barrier film 113 formed next is formed by an RF sputtering method, the barrier film 113 can be formed without being exposed to the atmosphere.

Next, the barrier film 113 is formed to cover the thin film transistor 150 including the gate electrode layer 101, the oxide semiconductor layer 107, the oxide semiconductor layers 111a and 111b, the conductive layers 110a and 110b, and the like (see FIG. 2D). The barrier film 113 is preferably formed in contact with a region in which the oxide semiconductor layer 107 is exposed. The barrier film can be formed with a single layer or a stacked layer using an aluminum oxide film, an aluminum nitride film, an aluminum oxynitride film, or an aluminum nitride oxide film.

The semiconductor characteristics of the oxide semiconductor layer 107 and the oxide semiconductor layers 111a and 111b are significantly influenced by oxygen vacancy concentrations in the oxide semiconductor layers. Entry of moisture and oxygen into the oxide semiconductor layer 107 and the oxide semiconductor layers 111a and 111b significantly influence the semiconductor characteristics of the oxide semiconductor layers. The barrier film 113 is preferably formed using a dense film capable of preventing the entry of an impurity such as an organic substance and a metal, moisture, oxygen, and the like floating in the atmosphere. When a silicon oxide film or a silicon nitride film is used as the barrier film 113, a barrier property against moisture and oxygen is inhibited by existence of vacancy of silicon atoms due to a molecular chain and the like in the film. In contrast, an aluminum oxide film or the like has a barrier property superior to a silicon oxide film, a silicon nitride film, or the like because of its high density. Therefore, the use of an aluminum oxide film or the like as the barrier film of the oxide semiconductor layer can prevent an impurity such as moisture and oxygen from entering the oxide semiconductor layer.

In the case of forming an aluminum oxide film functioning as the barrier film 113, the aluminum oxide film is formed by a sputtering method, for example, using an aluminum oxide ($Al_2O_3$) target in an argon atmosphere. In order to obtain an extremely high light-transmitting property, the aluminum oxide film may include an impurity, in particular nitrogen at greater than O atom % and less than 2.5 atom %. The nitrogen concentration can be adjusted by adjustment of sputtering conditions (the substrate temperature, the source gas and the flow rate thereof, the formation pressure, and the like), as appropriate. Alternatively, the aluminum oxide film may be formed using an aluminum (Al) target in an atmosphere including an oxygen gas. In particular, the aluminum oxide film is formed by an RF sputtering method using an aluminum target with φ8-inch and employing the following conditions: 1 kW of a formation power; 0.4 Pa of a formation pressure; an argon gas at a flow rate of 10 sccm; an oxygen gas at a flow rate of 5 sccm; 160 mm of a distance between the target and the substrate; 20° C. to 25° C. of a substrate temperature in film formation; and 1.5 nm/min of a film formation rate.

In the case of forming an aluminum nitride film functioning as the barrier film 113, the aluminum nitride film is formed by a sputtering method, for example, using an aluminum nitride (AlN) target in a mixed atmosphere of an argon gas and a nitrogen gas. In particular, the aluminum nitride film is formed using an aluminum nitride (AlN) target in a mixed atmosphere of an argon gas at a flow rate of 20 sccm and a nitrogen gas at a flow rate of 20 sccm. The aluminum nitride film may include an impurity, in particular oxygen at O atom % or more and less than 10 atom %. The oxygen concentration can be adjusted by adjustment of sputtering conditions (the substrate temperature, the source gas and the flow rate thereof, the formation pressure, and the like), as appropriate. Alternatively, the aluminum nitride film may be formed using an aluminum (Al) target in an atmosphere including a nitrogen gas.

In the case of forming an aluminum nitride oxide film functioning as the barrier film 113, the aluminum nitride oxide film is formed by a sputtering method, for example, using an aluminum nitride (AlN) target in a mixed atmosphere of an argon gas, a nitrogen gas, and an oxygen gas. In particular, the aluminum nitride oxide film is formed using an aluminum nitride (AlN) target in a mixed atmosphere of an argon gas at a flow rate of 20 sccm, a nitrogen gas at a flow rate of 15 sccm, and an oxygen gas at a flow rate of 5 sccm. The aluminum nitride oxide film may include nitrogen at several atom % or more or preferably 2.5 atom % to 47.5 atom %. The nitrogen concentration can be adjusted by adjustment of sputtering conditions (the substrate temperature, the source gas and the flow rate thereof, the formation pressure, and the like), as appropriate. Alternatively, the aluminum nitride oxide film may be formed using an aluminum (Al) target in an atmosphere including a nitrogen gas and an oxygen gas.

Note that a method for forming these films is not limited to a sputtering method. Alternatively, an evaporation method or another known technique may be employed.

In addition, the barrier film 113 formed may be subjected to plasma treatment or treatment with a solution having high oxidizability such as ozone water so that oxygen defects in the barrier film 113 are repaired. The plasma treatment may be performed in an atmosphere of oxygen, nitrogen, dinitrogen monoxide, or a mixed gas of the gas and another gas. By the plasma treatment the barrier film can be denser.

When the film having high barrier property against moisture and oxygen is formed over the oxide semiconductor layer to cover the oxide semiconductor layer, moisture and oxygen can be prevented from being mixed into the oxide semiconductor layer. Accordingly, oxidation-reduction reaction of the oxide semiconductor layer and variation in the oxygen vacancy concentration can be suppressed. Further, an impurity floating in the atmosphere, such as organic substances and a metal, can be prevented from being mixed into the oxide semiconductor layer. Therefore, variation in the semiconductor characteristics of the semiconductor device in which the oxide semiconductor is used can be suppressed. Further, reliability of the semiconductor device can be improved.

Note that in the case where the insulating film 130 functioning as a base film or the gate insulating film 102 is formed using an aluminum oxide film, an aluminum nitride film, an aluminum oxynitride film, or an aluminum nitride oxide film, the above manufacturing method can be employed.

Next, a resist mask is formed over the barrier film 113 and the barrier film 113 is selectively etched to form a contact hole. After that, the transparent conductive layer 114 is formed (see FIG. 2E). Etching at this time is preferably dry etching using a chlorine gas.

The transparent conductive layer 114 can be formed by a sputtering method, a vacuum evaporation method, or the like, using indium oxide ($In_2O_3$), an alloy of indium oxide and tin oxide ($In_2O_3$—$SnO_2$, hereinafter, abbreviated to ITO), an alloy of indium oxide and zinc oxide ($In_2O_3$—$ZnO$), or the like. For example, a transparent conductive film is formed, and then a resist mask is formed over the transparent conductive film. Then, unnecessary portions are removed by etching, so that the transparent conductive layer 114 can be formed.

Through the above process, the thin film transistor 150 can be formed. In this manner, the thin film transistor 150 is formed in which the film having a high barrier property against an impurity such as moisture and oxygen is used to prevent an impurity such as moisture and oxygen from being mixed into the oxide semiconductor. Accordingly, variation in the semiconductor characteristics of the semiconductor device in which the oxide semiconductor is used can be suppressed, and further, reliability of the semiconductor device can be improved.

Next, a manufacturing process of a display device which is an example of the semiconductor device is described with reference to FIGS. 3A to 3C and FIGS. 4A to 4C. Note that many portions of the manufacturing process illustrated in FIGS. 3A to 3C and FIGS. 4A to 4C are common to those illustrated in FIGS. 2A to 2E. Therefore, description of the same portions is omitted and description of different portions is made below in detail.

First, wirings and an electrode (a gate wiring including the gate electrode layer 101, a capacitor wiring 120, and a first terminal 121) are formed over the substrate 100 having an insulating surface (see FIG. 3A). The capacitor wiring 120 and the first terminal 121 can be formed using the same material as the gate electrode layer 101. Note that the material of the substrate 100 and the material and the formation method of the gate electrode layer 101 can be referred to FIG. 2A. In addition, the insulating film 130 which is to be a base film may be provided over the substrate 100 having an insulating surface. The material and the formation method of the insulating film 130 can be referred to FIG. 2A.

Next, the gate insulating film 102 is formed over the gate electrode layer 101, and the island-shaped oxide semiconductor layer 107 and the island-shaped oxide semiconductor layer 108 are formed over the gate electrode layer 101 with the insulating film 102 interposed therebetween (see FIG. 3B). The material and the formation method of the gate insulating film 102 can be referred to FIG. 2A. The materials and the formation methods of the oxide semiconductor layer 107 and the oxide semiconductor layer 108 can be referred to FIGS. 2A and 2B.

Next, a contact hole 122 is formed in the gate insulating film 102 so that the first terminal 121 is exposed, and then, a conductive film 123 is formed to cover the gate insulating film 102, the oxide semiconductor layer 107, and the oxide semiconductor layer 108 (see FIG. 3C).

The conductive film 123 can be formed by a sputtering method, a vacuum evaporation method, or the like, using a material formed of a metal including an element selected from aluminum (Al), copper (Cu), titanium (Ti), tantalum (Ta), tungsten (W), molybdenum (Mo), chromium (Cr), neodymium (Nd), and scandium (Sc); an alloy including any of the above elements; nitride including any of the above elements; or the like. Note that in the case where heat treatment (e.g., heat treatment at approximately 200° C. to 600° C.) is performed after formation of the conductive film 123, the conductive film 123 preferably has a given heat-resistant property.

For example, the conductive film 123 can be formed with a single-layer structure of a titanium film. Alternatively, the conductive film 123 may be formed with a stacked-layer structure. For example, the conductive film 123 can be formed with a stacked-layer structure of an aluminum film and a titanium film. Further alternatively, a three-layer structure of a titanium film, an aluminum (Al—Nd) film including neodymium, and a titanium film may be employed. Further alternatively, the conductive film 123 may be formed with a single-layer structure of an aluminum film including silicon. The conductive film 123 and the first terminal 121 are electrically connected to each other through the contact hole 122.

Next, resist masks 109a, 109b, 109c, and 109d are formed over the conductive film 123, and then the conductive film 123 is selectively etched to form the conductive layers 110a and 110b, a second terminal 124, and a connection electrode 125. At the same time, the oxide semiconductor layer 108 is etched to form semiconductor regions (the oxide semiconductor layers 111a and 111b) having higher conductivity than the oxide semiconductor layer 107, and part of the oxide semiconductor layer 107 (part near the surface thereof) is removed (channel-etched) so that the recessed portion 112 is formed in the oxide semiconductor layer 107 (see FIG. 4A).

The oxide semiconductor layers 111a and 111b function as the source region and the drain region of the transistor. The conductive layer 110a functions as one of the source electrode and the drain electrode of the transistor, and the conductive layer 110b functions as the other of the source electrode and the drain electrode of the transistor. The second terminal 124 can be electrically connected to a source wiring (a source wiring including the conductive layer 110a or the conductive layer 110b). In addition, the connection electrode 125 can be directly connected to the first terminal 121 through the contact hole 122 formed in the gate insulating film 102.

Here, as etching in this step, dry etching is preferably performed. The use of dry etching enables miniaturization of a wiring structure or the like as compared to the case of using wet etching. In addition, removal of the island-shaped oxide semiconductor layer 107 can be performed with high controllability by dry etching owing to high controllability of dry etching. A gas and the like used for the dry etching can be referred to FIG. 2C. Note that after the above etching, the resist masks 109a, 109b, 109c, and 109d are removed.

Next, heat treatment is preferably performed at 200° C. to 600° C., typically 300° C. to 500° C. For example, heat treatment is performed at 350° C. under a nitrogen atmosphere for 1 hour. By this heat treatment, rearrangement at an atomic level of the In—Ga—Zn—O based non-single-crystal film included in the oxide semiconductor layer 107 and the oxide semiconductor layers 111a and 111b is performed. Since distortion which interrupts transfer of carriers can be released by this heat treatment, the heat treatment here (also including photo annealing or the like) is effective. Note that there is no particular limitation on timing of the heat treatment as long as the heat treatment is performed after formation of the oxide semiconductor layer 107 and the oxide semiconductor layers 111a and 111b. For example, the heat treatment may be performed after formation of a pixel electrode.

Next, the surface of the oxide semiconductor layer 107 is preferably subjected to plasma treatment before the barrier film 113 is formed. As the plasma treatment for the surface of the oxide semiconductor layer 107, oxygen radical treatment by an oxygen radical or reverse sputtering may be performed.

The oxygen radical treatment by an oxygen radical is preferably performed in an atmosphere of $O_2$, $N_2O$, $N_2$ including oxygen, He including oxygen, Ar including oxygen, or the like. Alternatively, the oxygen radical treatment may be performed in an atmosphere in which $Cl_2$ or $CF_4$ is added to the above atmosphere. Note that the radical treatment is preferably performed without application of a bias voltage to the substrate 100 side. By performing the oxygen radical treatment, the thin film transistor in which the island-shaped oxide semiconductor layer 107 includes a channel formation region can be normally-off transistor, which is in off state when voltage is not applied to the gate electrode. Further, by performing the radical treatment, damage to the island-shaped oxide semiconductor layer 107 due to etching can be recovered.

Reverse sputtering can be performed in such a manner that an inert gas such as an argon (Ar) gas is introduced into a vacuum chamber, and a bias voltage is applied to a processing object (here, the substrate 100) so that a plasma state is generated. In the case, electrons and cations of Ar exist in the plasma and cations of Ar are accelerated in a cathode direction (toward the substrate 100 side). The accelerated cations of Ar collide with the surfaces of the oxide semiconductor layer 107, the gate insulating film 102, and the conductive layers 110a and 110b which are formed over the substrate 100, whereby the surfaces are etched by sputtering to be reformed. Note that a helium gas may be used in place of an argon gas. Alternatively, an argon atmosphere to which oxygen, hydrogen, nitrogen, or the like is added may be used. Further alternatively, an argon atmosphere to which $Cl_2$, $CF_4$, or the like is added may be used.

When the surface of the oxide semiconductor layer 107 is subjected to reverse sputtering, an oxide formed due to exposure of the surface of the oxide semiconductor layer 107 to the atmosphere and an organic substance adsorbed can be removed by etching. In addition, the surface of the oxide semiconductor layer 107 can be activated and therefore, a chemical bond with the barrier film 113 formed next can be strengthened. The reverse sputtering is preferably performed employing an RF sputtering method. This is because when the barrier film 113 formed next is formed by an RF sputtering method, the barrier film 113 can be formed without being exposed to the atmosphere.

Next, the barrier film 113 is formed over the thin film transistor 150. The barrier film 113 is preferably provided in contact with a region in which the oxide semiconductor layer 107 is exposed. The barrier film 113 is preferably formed using a dense film because the barrier film 113 is formed to prevent the entry of an impurity such as an organic substance or a metal, moisture, oxygen, or the like floating in the atmosphere. A bather property against an impurity such as moisture and oxygen is improved by formation with the use of a dense film. The barrier film 113 can be formed with a single layer or a stacked layer using an aluminum oxide film, an aluminum nitride film, an aluminum oxynitride film, or an aluminum nitride oxide film by a sputtering method or the like. The manufacturing method of the barrier film 113 can be referred to FIG. 2D.

In addition, the barrier film 113 formed may be subjected to plasma treatment or treatment with a solution having high oxidizability such as ozone water so that oxygen defects in the barrier film are repaired. The plasma treatment may be performed in an atmosphere of oxygen, nitrogen, dinitrogen monoxide, or a mixed gas of the gas and another gas. By the plasma treatment, the barrier film can be denser.

When the film having a high barrier property against moisture and oxygen is formed over the oxide semiconductor layer to cover the oxide semiconductor layer, moisture and oxygen can be prevented from being mixed into the oxide semiconductor layer. Accordingly, oxidation-reduction reaction of the oxide semiconductor layer and variation in the oxygen vacancy concentration can be suppressed. Further, an impurity floating in the atmosphere such as an organic substance and a metal can be prevented from being mixed into the oxide semiconductor layer. Therefore, variation in the semiconductor characteristics of the semiconductor device in which an oxide semiconductor is used can be suppressed. Accordingly, reliability of the semiconductor device can be improved.

Then, a resist mask is formed over the barrier film 113, and the barrier film 113 is selectively etched so that a contact hole 126b reaching the conductive layer 110b, a contact hole 126c reaching the connection electrode 125, and a contact hole 126a reaching the second terminal 124 are formed (see FIG. 4B). The etching in this step is preferably performed by employing dry etching with the use of a chlorine gas.

Next, a transparent conductive layer 114a electrically connected to the conductive layer 110b, a transparent conductive layer 114c electrically connected to the connection electrode 125, and a transparent conductive layer 114b electrically connected to the second terminal 124 are formed (see FIG. 4C). A top view at this step corresponds to FIG. 1A.

The transparent conductive layers 114a, 114b, and 114c can be formed by a sputtering method, a vacuum evaporation method, or the like, using indium oxide ($In_2O_3$), an alloy of indium oxide and tin oxide ($In_2O_3$—$SnO_2$, hereinafter, abbreviated to ITO), an alloy of indium oxide and zinc oxide ($In_2O_3$—ZnO), or the like. For example, a transparent conductive film is formed, and then a resist mask is formed over the transparent conductive film. Then, unnecessary portions are removed by etching, so that the transparent conductive layers 114a, 114b, and 114c can be formed.

The transparent conductive layer 114a functions as a pixel electrode. The transparent conductive layers 114b and 114c serve as electrodes or wirings which are used for connection to an FPC. In particular, the transparent conductive layer 114c formed over the connection electrode 125 can be used as a connection terminal electrode which functions as an input terminal for the gate wiring. The transparent conductive layer 114b formed over the second terminal 124 can be used as a connection terminal electrode which functions as an input terminal for the source wiring.

In addition, the capacitor wiring 120, the gate insulating film 102, the barrier film 113, and the transparent conductive layer 114a can form a storage capacitor. In this case, the capacitor wiring 120 and the transparent conductive layer 114a serve as electrodes, and the gate insulating film 102 and the barrier film 113 serve as dielectrics.

Further, FIGS. 5A1 and 5A2 are a cross-sectional view of a gate wiring terminal portion at this step and a top view thereof, respectively. FIG. 5A1 is a cross-sectional view taken along line C1-C2 of FIG. 5A2. In FIG. 5A1, the transparent conductive layer 114c formed over the barrier film 113 is a connection terminal electrode functioning as an input terminal. Furthermore, in FIG. 5A1, in the terminal portion, the first terminal 121 formed using the same material as the gate wiring and the connection electrode 125 formed using the same material as the source wiring overlap with each other with the gate insulating film 102 interposed therebetween, and are directly in contact with each other at the terminal portion to be brought into conduction. In addition, the connection electrode 125 and the transparent conductive layer 114c are directly in contact with each other through the contact hole formed in the barrier film 113 and brought into conduction.

FIGS. 5B1 and 5B2 are a cross-sectional view and a top view of a source wiring terminal portion, respectively. FIG. 5B1 corresponds to the cross-sectional view taken along line D1-D2 in FIG. 5B2. In FIG. 5B1, the transparent conductive layer 114b formed over the barrier film 113 is a connection terminal electrode functioning as an input terminal. In addition, FIG. 5B1 illustrates the case where an electrode 127 whose material is the same as the material of the gate wiring is positioned below the second terminal 124 which is electrically connected to the source wiring, and overlaps with the second terminal 124 at the terminal portion with the gate insulating film 102 interposed therebetween. The electrode 127 is not electrically connected to the second terminal 124. If the electrode 127 is set to a potential different from the potential of the second terminal 124, such as floating, GND, 0 V, or the like, a capacitor which is useful against noise or static electricity can be formed. In addition, the second terminal 124 is electrically connected to the transparent conductive layer 114b with the barrier film 113 interposed therebetween.

A plurality of gate wirings, source wirings, and capacitor wirings are provided depending on the pixel density. Also in the terminal portion, a plurality of first terminals at the same potential as gate wirings, a plurality of second terminals at the same potential as source wirings, a plurality of third terminals at the same potential as capacitor wirings, and the like are arranged. There is no particular limitation on the number of each of the terminals, and the number of the terminals may be determined by a practitioner as appropriate.

Through the above process, elements such as an n-channel bottom-gate thin film transistor and a storage capacitor can be completed with the use of six photomasks. In addition, these elements are arranged in matrix so as to correspond to respective pixels, whereby one substrate used for manufacturing an active matrix display device can be obtained. In this specification, such a substrate is referred to as an active matrix substrate, for convenience.

When an active matrix liquid crystal display device is manufactured, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 6:
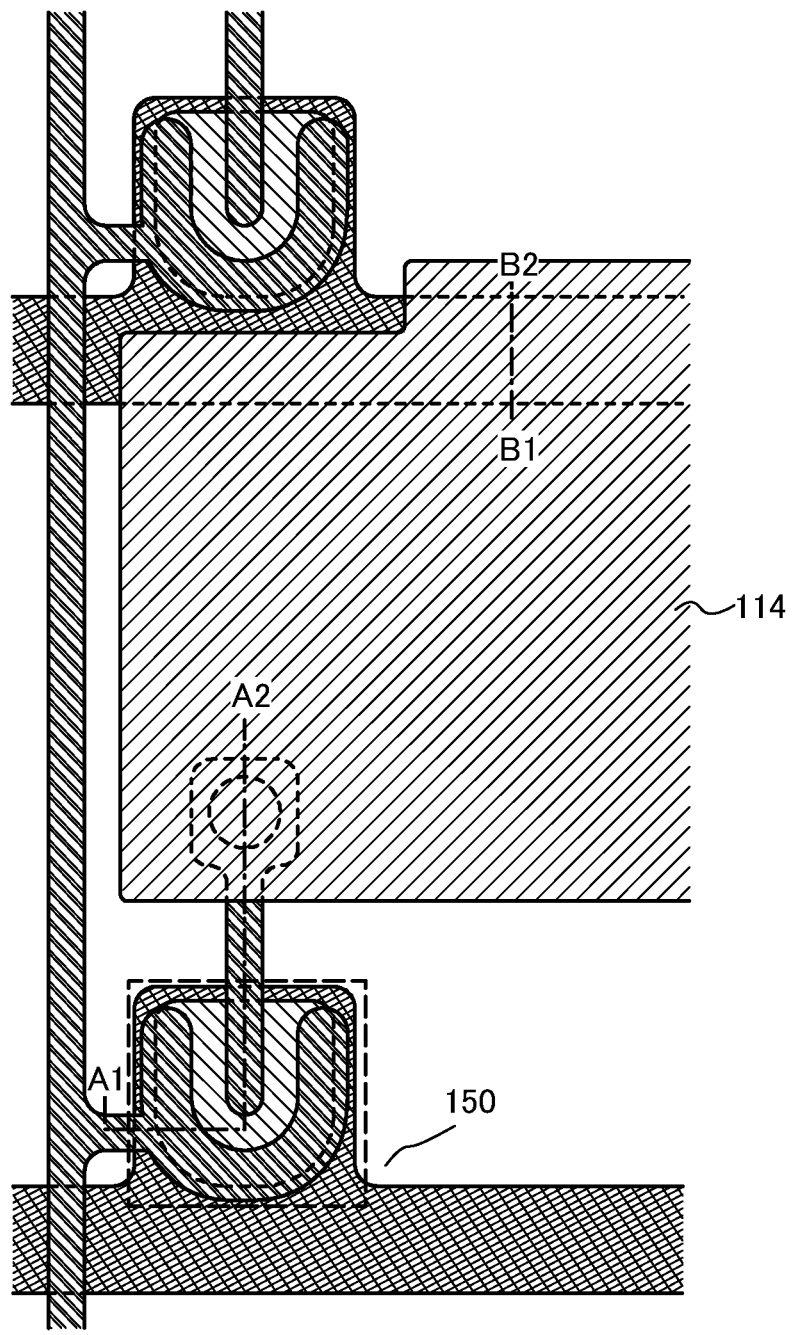
FIG. 6 illustrates a semiconductor device according to Embodiment 1.

The structure according to this embodiment is not limited to the pixel structure illustrated in FIG. 1A. Another example of the structure is illustrated in FIG. 6. FIG. 6 illustrates the structure in which the pixel electrode and a gate wiring of the adjacent pixel serve as electrodes, and the barrier film and the gate insulating film serve as dielectrics, whereby the storage capacitor is formed without the capacitor wiring. In this case, the capacitor wiring and the third terminal connected to the capacitor wiring can be omitted.

This embodiment can be implemented in combination with any of the other embodiments as appropriate.

Embodiment 2

In this embodiment, a semiconductor device which is different from that of Embodiment 1 and a manufacturing process thereof are described with reference to FIGS. 7A and 7B, FIGS. 8A to 8C, FIGS. 9A and 9B, and FIGS. 10A to 10C. Note that many portions of the semiconductor device and the manufacturing process described in this embodiment are same as those described in Embodiment 1. Therefore, description of the same portions is omitted and description of different portions is made below in detail.

Figure 7A:
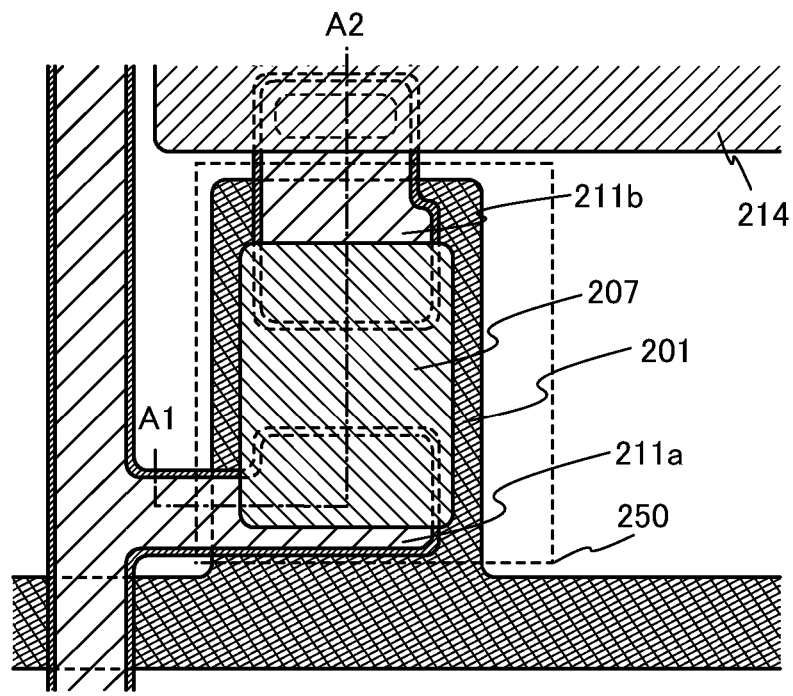
FIG. 7A is a plan view of a semiconductor device according to Embodiment 2.
Figure 7B:
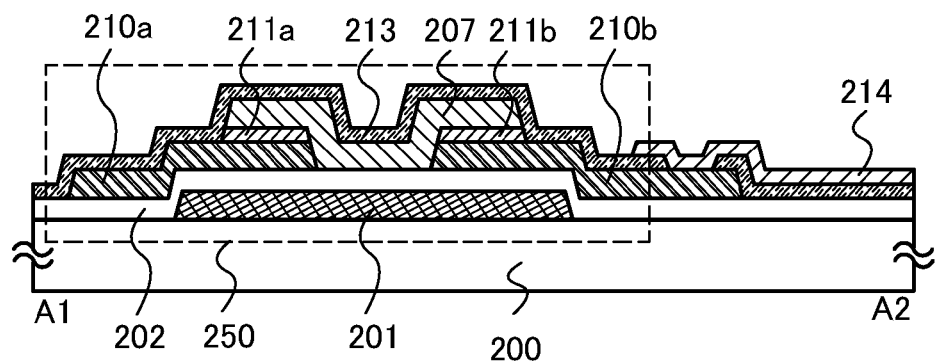
FIG. 7B is a cross-sectional view taken along line A1-A2 in FIG. 7A.

FIGS. 7A and 7B illustrate a thin film transistor of this embodiment. FIG. 7A is a plan view, and FIG. 7B is a cross-sectional view taken along line A1-A2 of FIG. 7A.

FIGS. 7A and 7B illustrate a thin film transistor 250 in which a gate electrode layer 201 is formed over a substrate 200 having an insulating surface and a gate insulating film 202 is formed over the gate electrode layer 201. Conductive layers 210a and 210b functioning as a source electrode and a drain electrode are provided over the gate insulating film 202 overlapping with the gate electrode layer 201. In addition, oxide semiconductor layers 211a and 211b are provided over the conductive layers 210a and 210b, respectively. An oxide semiconductor layer 207 is provided to cover the oxide semiconductor layers 211a and 211b. The oxide semiconductor layer 207 is formed using an In—Ga—Zn—O based non-single-crystal film. The oxide semiconductor layers 211a and 211b, which are In—Ga—Zn—O based non-single-crystal films having higher conductivity than the oxide semiconductor layer 207, form a source region and a drain region. Note that the oxide semiconductor layers 211a and 211b are also referred to as n$^+$ layers.

In addition, as illustrated in FIG. 7B, a barrier film 213 is provided in contact with the oxide semiconductor layer 207, and a transparent conductive layer 214 is provided so as to contact the conductive layer 210b in a contact hole of the barrier film 213.

The thin film transistor 250 illustrated in FIGS. 7A and 7B has a structure called a bottom-gate bottom-contact structure. In a semiconductor device described in this embodiment, the gate insulating film 202 exists in all the region that includes the thin film transistor 250, and the gate electrode layer 201 is provided between the gate insulating film 202 and the substrate 200 having an insulating surface. In addition, wirings including the conductive layers 210a and 210b functioning as the source electrode and the drain electrode over the gate insulating film 202, and the oxide semiconductor layer 207 is provided over the conductive layers 210a and 210b. Further, the wirings extend to the outside of the peripheral portion of the oxide semiconductor layer 207. The oxide semiconductor layers 211a and 211b are stacked over the conductive layers 210a and 210b, respectively.

Next, an example of a manufacturing process of the semiconductor device is described with reference to FIGS. 8A to 8C, and 9A and 9B.

First, the gate electrode layer 201 is formed over the substrate 200 having an insulating surface. Sequentially, the gate insulating film 202 is formed over the gate electrode layer 201 (see FIG. 8A).

The material of the substrate 200, and the materials and the formation methods of the gate electrode layer 201 and the gate insulating film 202 can be referred to the substrate 100, the gate electrode layer 101, and the gate insulating film 102 which are described in Embodiment 1. In addition, an insulating film 230 functioning as a base insulating film may be provided over the substrate 200 having an insulating surface. The material and the formation method of the insulating film 230 can be referred to the insulating film 130 described in Embodiment 1.

Then, a conductive film is formed over the gate insulating film 202. The material and the formation method of the conductive film can be referred to the conductive film 123 described in Embodiment 1.

Sequentially, a first oxide semiconductor film is formed over the conductive film. The material and the formation method of the first oxide semiconductor film can be referred to the oxide semiconductor film 104 described in Embodiment 1. Note that the conductive film and the first oxide semiconductor film are preferably formed successively. The conductive film and the first oxide semiconductor film are formed by a sputtering method without being exposed to the air, so that adhesion of dust to the conductive film due to exposure of the conductive film can be prevented in the manufacturing process.

Next, a resist mask is formed over the first oxide semiconductor film. Unnecessary portions of the conductive film and the first oxide semiconductor film are removed by selective etching using the resist mask to form the conductive layers 210a and 210b and the oxide semiconductor layers 211a and 211b (see FIG. 8B). The oxide semiconductor layers 211a and 211b function as the source region and the drain region. The conductive film and the first oxide semiconductor film can be etched by either wet etching or dry etching.

Next, a second oxide semiconductor film having lower conductivity than the first oxide semiconductor film is formed over the oxide semiconductor layers 211a and 211b. The material and the formation method of the second oxide semiconductor film can be referred to the oxide semiconductor film 103 described in Embodiment 1.

Next, a resist mask is formed over the second oxide semiconductor film. Unnecessary portions of the second oxide semiconductor film are removed by selective etching using the resist mask, so that the oxide semiconductor layer 207 is formed (see FIG. 8C). Further, at this time, parts of the oxide semiconductor layers 211a and 211b other than a region overlapping with the oxide semiconductor layer 207 are also etched. The second oxide semiconductor film can be etched by either wet etching or dry etching.

In this embodiment, an example is described in which the oxide semiconductor layers 211a and 211b and the oxide semiconductor layer 207 having lower conductivity than the oxide semiconductor layers 211a and 211b are provided. Alternatively, a single layer of the oxide semiconductor layer 207 can be formed alone.

After that, heat treatment is preferably performed at 200° C. to 600° C., typically 300° C. to 500° C. Here, heat treatment is performed at 350° C. under a nitrogen atmosphere for 1 hour. By this heat treatment, rearrangement at an atomic level of the In—Ga—Zn—O based oxide semiconductor included in the island-shaped oxide semiconductor layer 207 and the oxide semiconductor layers 211a and 211b is performed. This heat treatment (also including photo annealing or the like) is important because this heat treatment enables release of distortion which interrupts transfer of carriers in the island-shaped oxide semiconductor layer 207. Note that there is no particular limitation on timing of the above heat treatment as long as the heat treatment is performed after formation of the oxide semiconductor layer 207 and the oxide semiconductor layers 211a and 211b.

The surface of the oxide semiconductor layer 207 is preferably subjected to plasma treatment before the barrier film 213 is formed. As the plasma treatment for the surface of the oxide semiconductor layer 207, oxygen radical treatment by an oxygen radical or reverse sputtering may be performed. The method of oxygen radical treatment or reverse sputtering performed on the surface of the oxide semiconductor layer 207 can be referred to the method of the oxygen radical treatment or the reverse sputtering performed on the surface of the oxide semiconductor layer 107 described in Embodiment 1.

Figure 9A:
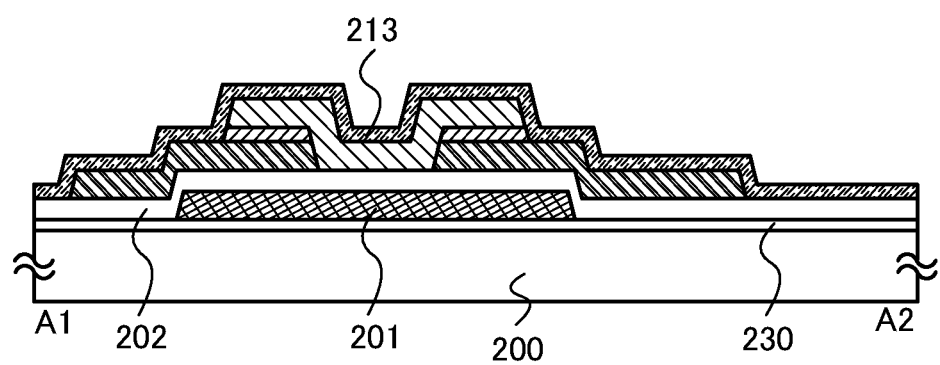
FIGS. 9A and 9B illustrate the manufacturing method of the semiconductor device according to Embodiment 2.
Figure 9B:
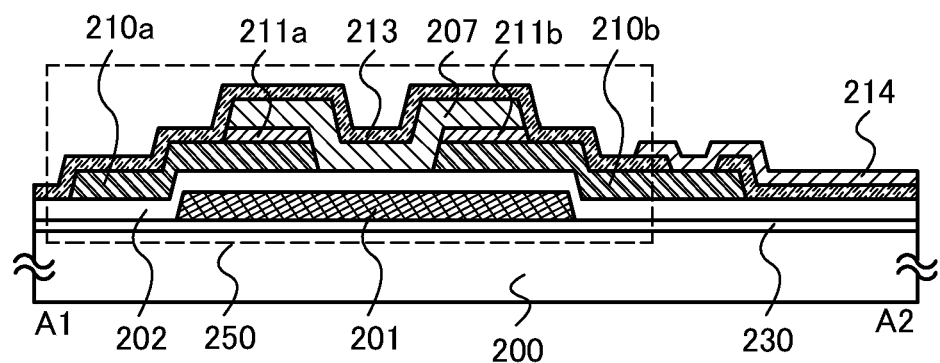

Next, the barrier film 213 is formed over the thin film transistor 250 (see FIG. 9A). The barrier film 213 is preferably provided in contact with the oxide semiconductor layer 207. The barrier film 213 is preferably formed using a dense film because the barrier film 213 is formed to prevent the entry of an impurity such as an organic substance and a metal, moisture, oxygen, or the like floating in the atmosphere. A barrier property against an impurity such as moisture and oxygen is improved by formation with the use of a dense film. The barrier film 213 can be formed with a single layer or a stacked layer using an aluminum oxide film, an aluminum nitride film, an aluminum oxynitride film, or an aluminum nitride oxide film by a sputtering method or the like. The manufacturing method of the barrier film 213 can be referred to the barrier film 113 described in Embodiment 1. In addition, the barrier film 213 formed may be subjected to plasma treatment or treatment with a solution having high oxidizability such as ozone water so that oxygen defect in the barrier film is repaired.

When the film having a high barrier property against moisture and oxygen is formed over the oxide semiconductor layer to cover the oxide semiconductor layer, moisture and oxygen can be prevented from being mixed into the oxide semiconductor layer. Accordingly, oxidation-reduction reaction of the oxide semiconductor layer and variation in an oxygen vacancy concentration can be suppressed. Further, an impurity floating in the atmosphere such as an organic substance or a metal can be prevented from being mixed into the oxide semiconductor layer. Therefore, variation in semiconductor characteristics of the semiconductor device in which an oxide semiconductor is used can be suppressed, and further, reliability of the semiconductor device can be improved.

Next, a resist mask is formed over the barrier film 213 and the barrier film 213 is selectively etched to form a contact hole reaching the conductive layer 210b. After that, a transparent conductive layer 214 is formed (see FIG. 9B). Etching at this time is preferably dry etching using a chlorine gas. Note that a top view at this step corresponds to FIG. 7A. The material and the formation method of the transparent conductive layer 214 can be referred to the transparent conductive layer 114 described in Embodiment 1.

Through the above process, the thin film transistor 250 can be formed. In this manner, the thin film transistor 250 is formed in which the film having a high barrier property against an impurity such as moisture and oxygen is used to prevent an impurity such as moisture and oxygen from being mixed into the oxide semiconductor. Accordingly variation in the semiconductor characteristics of the semiconductor device in which an oxide semiconductor is used can be suppressed, and further, reliability of the semiconductor device can be improved.

The semiconductor device and the manufacturing process thereof described in this embodiment are not limited to those illustrated in FIGS. 7A and 7B, FIGS. 8A to 8C, and FIGS. 9A and 9B. Another semiconductor device of this embodiment and another manufacturing process thereof are described with reference to FIGS. 10A to 10C. Note that description of the same portions as FIGS. 7A and 7B, FIGS. 8A to 8C, and FIGS. 9A and 9B is omitted and description of different portions is made.

Figure 8A:
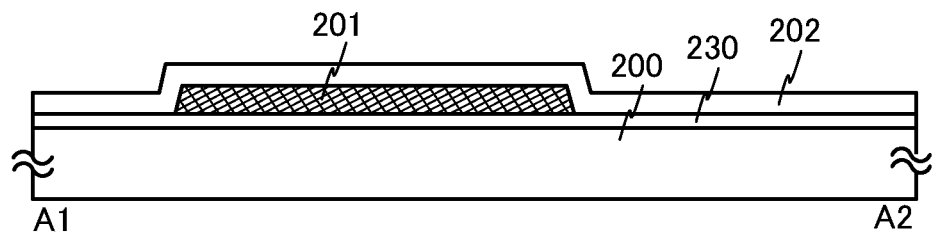
FIGS. 8A to 8C illustrate a manufacturing method of a semiconductor device according to Embodiment 2.
Figure 8B:
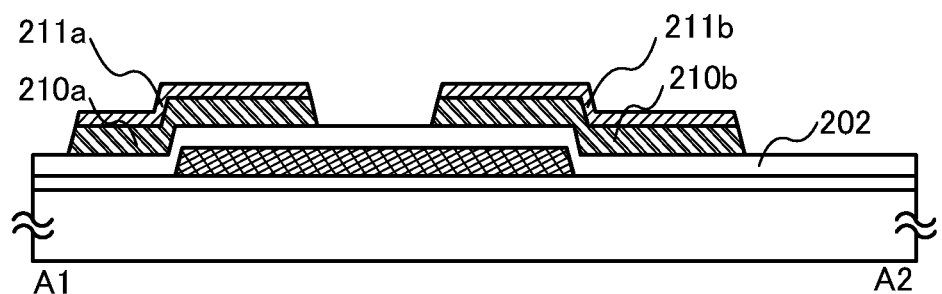
Figure 8C:
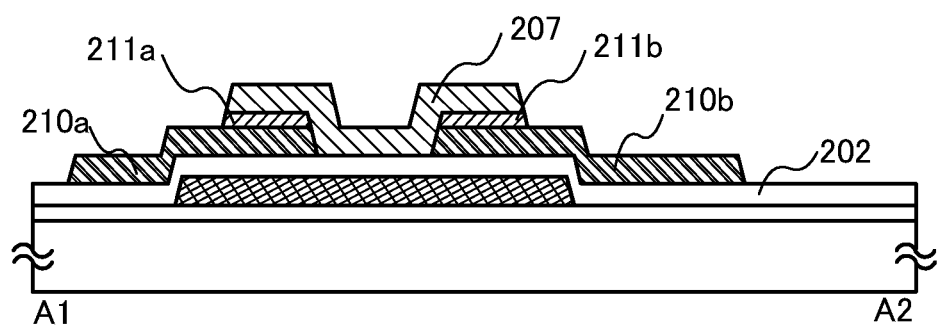
Figure 10A:
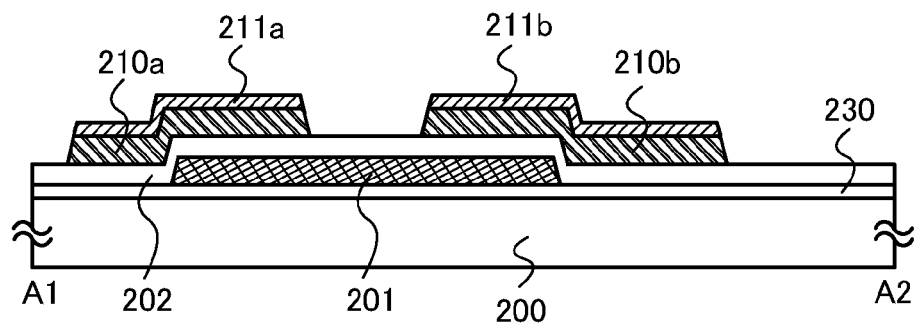
FIGS. 10A to 10C illustrate a manufacturing method of a semiconductor device according to Embodiment 2.

In FIG. 10A, the insulating film 230, the gate electrode layer 201, the gate insulating film 202, the conductive layers 210a and 210b, and the oxide semiconductor layers 211a and 211b are formed over the substrate 200 in accordance with the method illustrated in FIGS. 8A and 8B.

Next, an oxide semiconductor film 203 having lower conductivity than the oxide semiconductor layers 211a and 211b is formed over the oxide semiconductor layers 211a and 211b. The material and the formation method of the oxide semiconductor film 203 can be referred to the oxide semiconductor film 103 described in Embodiment 1.

Figure 10B:
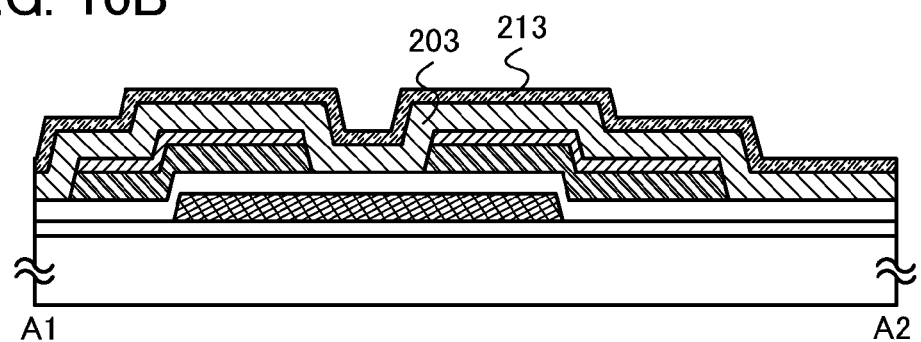
Figure 10C:
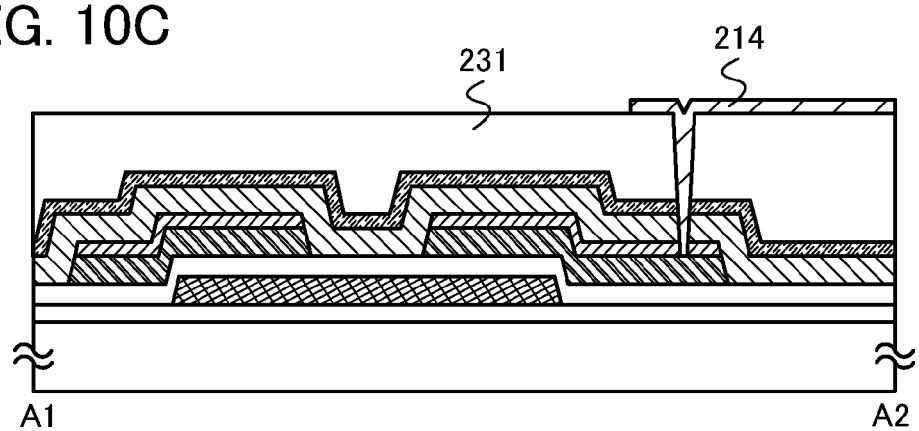

Next, the barrier film 213 is formed over the oxide semiconductor film 203 (see FIG. 10B). The material and the formation method of the barrier film 213 can be referred to the barrier film 113 described in Embodiment 1.

Next, an interlayer insulating film 231 is formed over the barrier film 213. The interlayer insulating film 231 can be formed using an insulating film formed of an organic material such as an acrylic resin, a polyimide resin, a polyamide resin, a phenol resin, a novolac resin, a melamine resin, an epoxy resin, an urethane resin, or the like. Furthermore, for the interlayer insulating film 231, an insulating film formed of an inorganic material such as a silicon oxide film, a silicon nitride film, a silicon oxynitride film, or a silicon nitride oxide film, or a siloxane (including a skeleton structure formed by the bond of silicon (Si) and oxygen (O)) resin can be used, or stacked layers of any of these insulating films formed of the organic material and any of these insulating films formed of the inorganic material may be used as well.

Next, a resist mask is formed over the interlayer insulating film 231, and the interlayer insulating film 231, the barrier film 213, the oxide semiconductor film 203 and the oxide semiconductor layer 211b are selectively etched, so that a contact hole reaching the conductive layer 210b is formed. After that, the transparent conductive layer 214 is formed (see FIG. 10C).

The semiconductor device illustrated in FIG. 10 can be formed without etching the oxide semiconductor film 203. Therefore, a mask used for etching the oxide semiconductor film 203 can be omitted, so that the manufacturing process can be reduced as compared to that illustrated in FIGS. 7A and 7B, FIGS. 8A to 8C, and FIGS. 9A and 9B.

This embodiment can be implemented in combination with any of the other embodiments as appropriate.

Embodiment 3

In this embodiment, a semiconductor device which is different from those of Embodiments 1 and 2 and a manufacturing process thereof are described with reference to FIGS. 11A and 11B and FIGS. 12A to 12D. Note that many portions of the manufacturing process described in this embodiment are same as those described in Embodiments 1 and 2. Therefore, description of the same portions is omitted and description of different portions is made in detail.

Figure 11A:
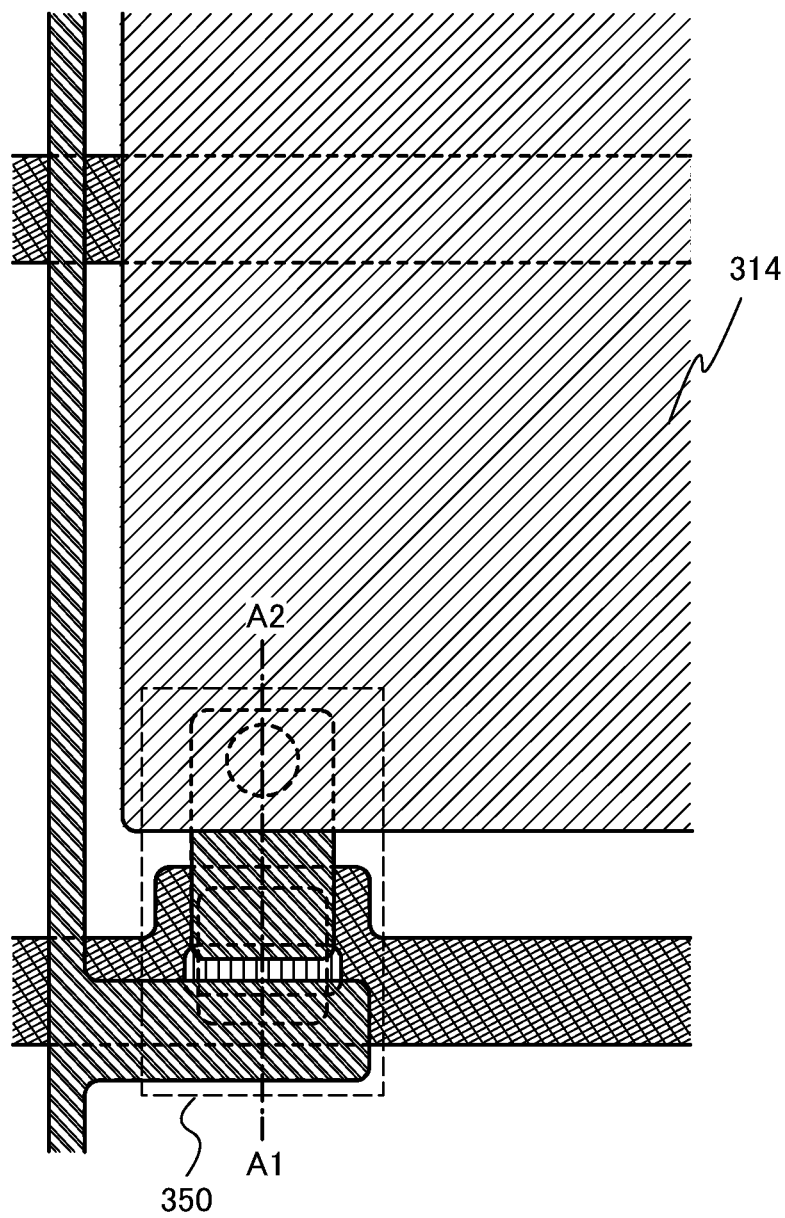
FIG. 11A is a plan view of a semiconductor device according to Embodiment 3.
Figure 11B:
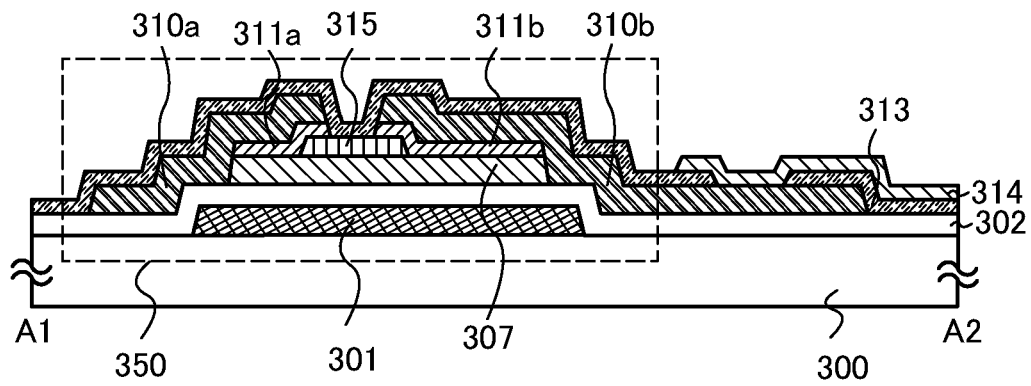
FIG. 11B is a cross-sectional view taken along line A1-A2 in FIG. 11A.

FIGS. 11A and 11B illustrate a thin film transistor of this embodiment. FIG. 11A is a plan view and FIG. 11B is a cross-sectional view taken along line A1-A2 of FIG. 11A.

FIGS. 11A and 11B illustrate a thin film transistor 350 in which a gate electrode layer 301 is formed over a substrate 300 having an insulating surface, and a gate insulating film 302 is formed over the gate electrode layer 301. An oxide semiconductor layer 307 and a channel protective layer 315 which covers a region overlapping with a channel formation region of the oxide semiconductor layer 307 are formed over the gate insulating film 302. Conductive layers 310a and 310b are formed so as to face each other over the gate electrode layer 301 with the oxide semiconductor layer 307 interposed therebetween.

The oxide semiconductor layer 307 is provided below the conductive layers 310a and 310b facing each other to cover the gate electrode layer 301 with the gate insulating film 302 interposed between the oxide semiconductor layer 307 and the gate electrode layer 301. That is, the oxide semiconductor layer 307 is provided in contact with a bottom surface of the channel protective layer 315 which covers the region overlapping with the channel formation region, a top surface of the gate insulating film 302 overlapping with the gate electrode layer 301, and bottom surfaces of the oxide semiconductor layers 311a and 311b. Here, the second oxide semiconductor layer 311a and the conductive layer 310a are stacked in this order from the oxide semiconductor layer 307 side. In a similar manner, the oxide semiconductor layer 311b and the conductive layer 310b are stacked in this order from the oxide semiconductor layer 307 side. The oxide semiconductor layer 307 is formed using an In—Ga—Zn—O based non-single-crystal film. The oxide semiconductor layers 311a and 311b, which are In—Ga—Zn—O based non-single-crystal layers having higher conductivity than the oxide semiconductor layer 307, form a source region and a drain region. Note that the oxide semiconductor layers 311a and 311b are also referred to as n+ layers. A barrier film 313 and a transparent conductive layer 314 are provided as shown in FIGS. 11A and 11B FIG. 11B illustrates a cross-sectional structure of an inverted-staggered (bottom-gate) transistor. In particular, the transistor illustrated in FIG. 11B has a channel protective (channel stop) structure.

Next, an example of the manufacturing process of the semiconductor device is described with reference to FIGS. 12A to 12D.

First, the gate electrode layer 301 is formed over the substrate 300 having an insulating surface. Sequentially, the gate insulating film 302 is formed over the gate electrode layer 301. The material of the substrate 300, and the materials and the formation methods of the gate electrode layer 301 and the gate insulating film 302 can be referred to the substrate 100, the gate electrode layer 101, and the gate insulating film 102 which are described in Embodiment 1. In addition, an insulating film 330 functioning as a base insulating film may be provided.

Figure 12A:
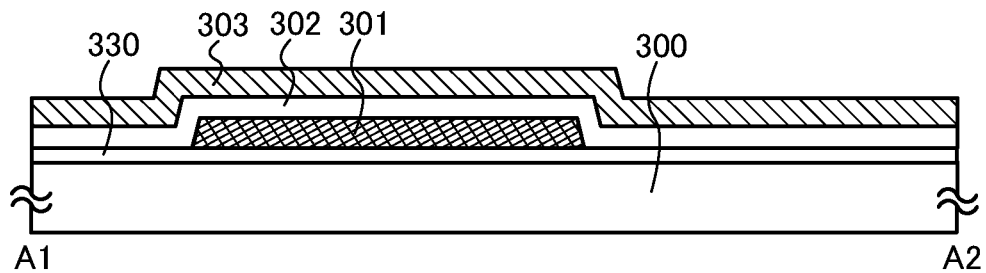
FIGS. 12A to 12D illustrate a manufacturing method of the semiconductor device according to Embodiment 3.
Figure 12B:
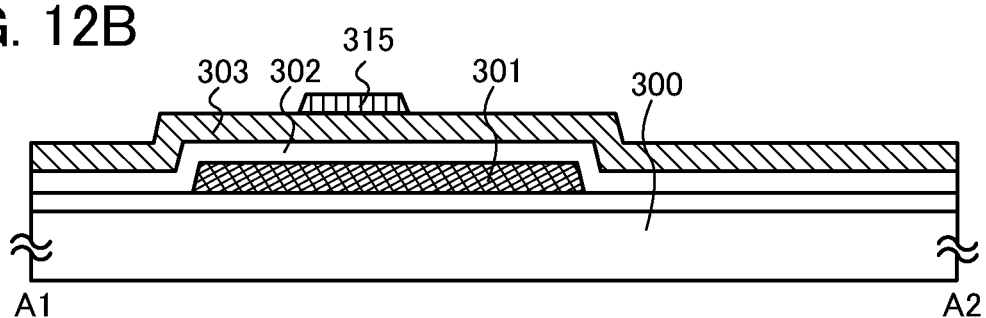

Next, a first oxide semiconductor film 303 is formed over the electrode layer 301 with the gate insulating film 302 interposed therebetween (see FIG. 12A). The material and the formation method of the first oxide semiconductor film 303 can be referred to the oxide semiconductor film 103 described in Embodiment 1.

Next, an insulating film is formed over the first oxide semiconductor film 303. The insulating film can be formed with a single layer or a stacked layer using an aluminum oxide film, an aluminum nitride film, an aluminum oxynitride film, or an aluminum nitride oxide film by a sputtering method or the like. The insulating film is preferably formed to a thickness of greater than 0 nm and less than or equal to 5 nm. The manufacturing method of the insulating film can be referred to the barrier film 113 described in Embodiment 1. A resist mask is formed over the insulating film. Unnecessary portions of the insulating film are removed by selective etching using the resist mask, so that the channel protective layer 315 is formed (see FIG. 12B). The insulating film can be etched by either wet etching or dry etching.

The channel protective layer 315 is provided in contact with the region overlapping with the channel formation region of the oxide semiconductor layer 307. The channel protective layer 315 is provided, so that damage to the channel formation region of the oxide semiconductor layer 307 (e.g., reduction in thickness due to plasma or an etchant in etching, or oxidation) can be prevented in the manufacturing process. Therefore, reliability of the thin film transistor 350 can be improved. In addition, the channel protective layer 315 can be formed to a thickness of greater than 0 nm and less than or equal to 5 nm Therefore, reduction in the thickness of the oxide semiconductor layer 307 due to etching can be suppressed.

A surface of the oxide semiconductor layer 307 is preferably subjected to plasma treatment before the channel protective layer 315 is formed. As the plasma treatment for the surface of the oxide semiconductor layer 307, oxygen radical treatment by an oxygen radical, or reverse sputtering may be performed. The method of oxygen radical treatment or reverse sputtering performed on the surface of the oxide semiconductor layer 307 can be referred to the method of the oxygen radical treatment or the reverse sputtering performed on the surface of the oxide semiconductor layer 107 described in Embodiment 1.

Then, a second oxide semiconductor film is formed over the first oxide semiconductor film and the channel protective layer 315. The material and the formation method of the second oxide semiconductor film can be referred to the oxide semiconductor film 104 described in Embodiment 1.

Next, a resist mask is formed over the second oxide semiconductor film, and the first oxide semiconductor film and the second oxide semiconductor film are selectively etched, so that the island-shaped oxide semiconductor layer 307 and the island-shaped oxide semiconductor layer 308 are formed.

In this embodiment, an example is described in which the oxide semiconductor layer 307 and the oxide semiconductor layer 308 having higher conductivity than the oxide semiconductor layer 307 are provided. Alternatively, a single layer of the oxide semiconductor layer 307 can be formed alone.

Figure 12C:
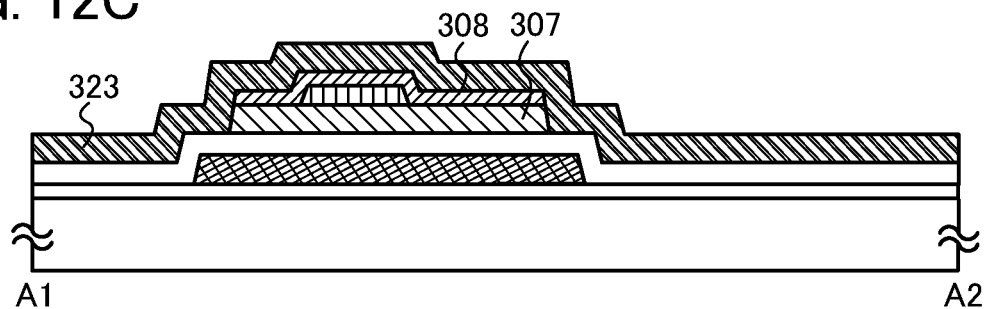
Figure 12D:
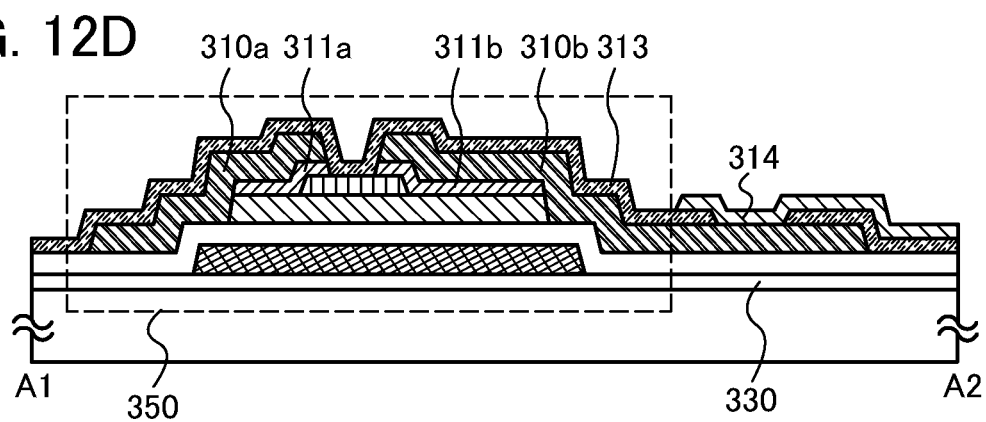

Next, a conductive film 323 is formed over the oxide semiconductor layer 308 and the gate insulating film 302 (see FIG. 12C). The material and the formation method of the conductive film 323 can be referred to the conductive film 123 described in Embodiment 1.

A resist mask is formed over the conductive film 323 and unnecessary portions of the conductive film 323 are removed by selective etching using the resist mask, so that the conductive layers 310a and 310b are formed. At the same time, the island-shaped oxide semiconductor layer 308 is etched to form semiconductor regions having high conductivity (the oxide semiconductor layers 311a and 311b) (see FIG. 12D). The oxide semiconductor layers 311a and 311b function as the source region and the drain region.

After that, heat treatment is preferably performed at 200° C. to 600° C., typically 300° C. to 500° C. Here, heat treatment is performed at 350° C. under a nitrogen atmosphere for 1 hour. By this heat treatment, rearrangement at an atomic level of the In—Ga—Zn—O based oxide semiconductor included in the island-shaped oxide semiconductor layer 307 is performed. This heat treatment (also including photo annealing or the like) is important because this heat treatment enables release of distortion which interrupts transfer of carriers in the island-shaped oxide semiconductor layer 307. Note that there is no particular limitation on timing of the above heat treatment as long as the heat treatment is performed after formation of the oxide semiconductor layer 307.

Next, the barrier film 313 is formed to cover the thin film transistor 350 including the gate electrode layer 301, the oxide semiconductor layer 307, the oxide semiconductor layers 311a and 311b, the conductive layers 310a and 310b, and the like. The barrier film 313 is preferably provided in contact with the channel protective layer 315. The barrier film 313 is preferably formed using a dense film because the barrier film 313 is formed to prevent the entry of an impurity such as an organic substance and a metal, moisture, oxygen, or the like floating in the atmosphere. A barrier property against an impurity such as moisture and oxygen is improved by formation with the use of a dense film. The barrier film 313 can be formed with a single layer or a stacked-layer using an aluminum oxide film, an aluminum nitride film, an aluminum oxynitride film, or an aluminum nitride oxide film by a sputtering method or the like.

In this embodiment, the channel protective layer 315 is formed with a single layer or a stacked layer using an aluminum oxide film, an aluminum nitride film, an aluminum oxynitride film, or an aluminum nitride oxide film. Therefore, as the barrier film 313, a silicon oxide film, a silicon nitride film, a silicon oxynitride film, or a silicon nitride oxide film may be used.

The channel protective layer 315 which covers the region overlapping with the channel formation region of the oxide semiconductor layer 307 is formed, so that moisture and oxygen can be prevented from entering the oxide semiconductor layer. Accordingly, oxidation-reduction reaction of the oxide semiconductor layer and variation in an oxygen vacancy concentration can be suppressed.

Next, a resist mask is formed over the barrier film 313 and the barrier film 313 is selectively etched to form a contact hole reaching the conductive layer 310b. After that, a transparent conductive layer 314 is formed (see FIG. 12D). Note that a top view at this step corresponds to FIG. 11A. The material and the formation method of the transparent conductive layer 314 can be referred to the transparent conductive layer 114 described in Embodiment 1.

Through the above process, the thin film transistor 350 can be formed. In this manner, the thin film transistor 350 is formed in which the film having a high barrier property against an impurity such as moisture and oxygen is used to prevent an impurity such as moisture and oxygen from being mixed into the oxide semiconductor. Accordingly, variation in the semiconductor characteristics of the semiconductor device in which an oxide semiconductor is used can be suppressed, and further, reliability of the semiconductor device can be improved.

This embodiment can be implemented in combination with any of the other embodiments as appropriate.

Embodiment 4

In this embodiment, an example in which at least part of a driver circuit and a thin film transistor disposed in a pixel portion are formed over one substrate in a display device will be described.

The thin film transistor disposed in the pixel portion is formed according to Embodiment 1. Further, the thin film transistor described in Embodiment 1 is an n-channel TFT. Thus, part of a driver circuit that can be formed using n-channel TFTs among driver circuits is formed over the same substrate as the thin film transistor of the pixel portion.

Figure 14A:
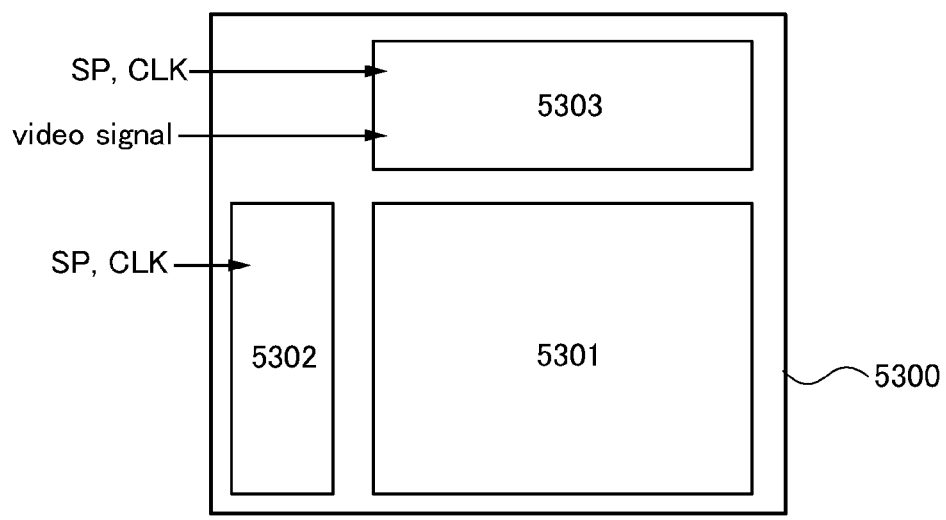
FIGS. 14A and 14B are block diagrams each illustrating a semiconductor device.

FIG. 14A illustrates an example of a block diagram of an active matrix liquid crystal display device, which is an example of a display device. The display device illustrated in FIG. 14A includes, over a substrate 5300, a pixel portion 5301 including a plurality of pixels each provided with a display element; a scanning line driver circuit 5302 that selects a pixel; and a signal line driver circuit 5303 that controls a video signal input to the selected pixel.

In addition, the thin film transistor described in Embodiment 1 is an n-channel TFT, and a signal line driver circuit including the n-channel TFT is described with reference to FIG. 15.

Figure 15:
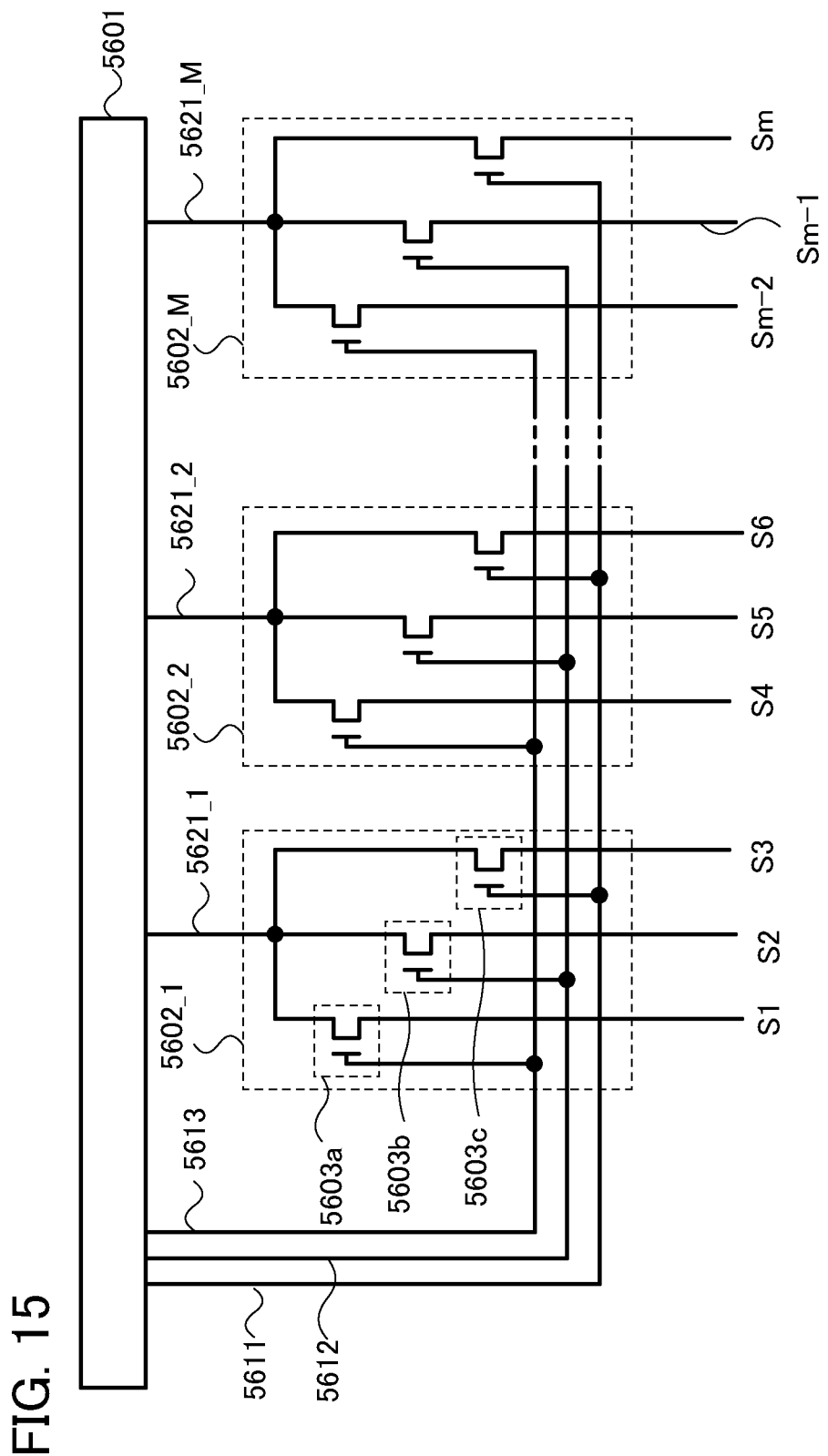
FIG. 15 illustrates a structure of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines (a signal line Sm−2, a signal line Sm−1, and a signal line Sm (m=3M)) via the first thin film transistor 5603a, the second thin film transistor 5603b, and the third thin film transistor 5603c. For example, a wiring 5621_J of the J-th column (any one of the wirings 5621_1 to 5621_M) is connected to a signal line Sj−2, a signal line Sj−1, and a signal line Sj (j=3J) via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed using a single crystal semiconductor. The switch groups 5602_1 to 5602_M are preferably formed over the same substrate as the pixel portion. Therefore, the driver IC 5601 and the switch groups 5602_1 to 5602_M are preferably connected through an FPC or the like. Alternatively, the driver IC 5601 may be formed using a single crystal semiconductor formed over the same substrate as the pixel portion by a method such as bonding.

Figure 16:
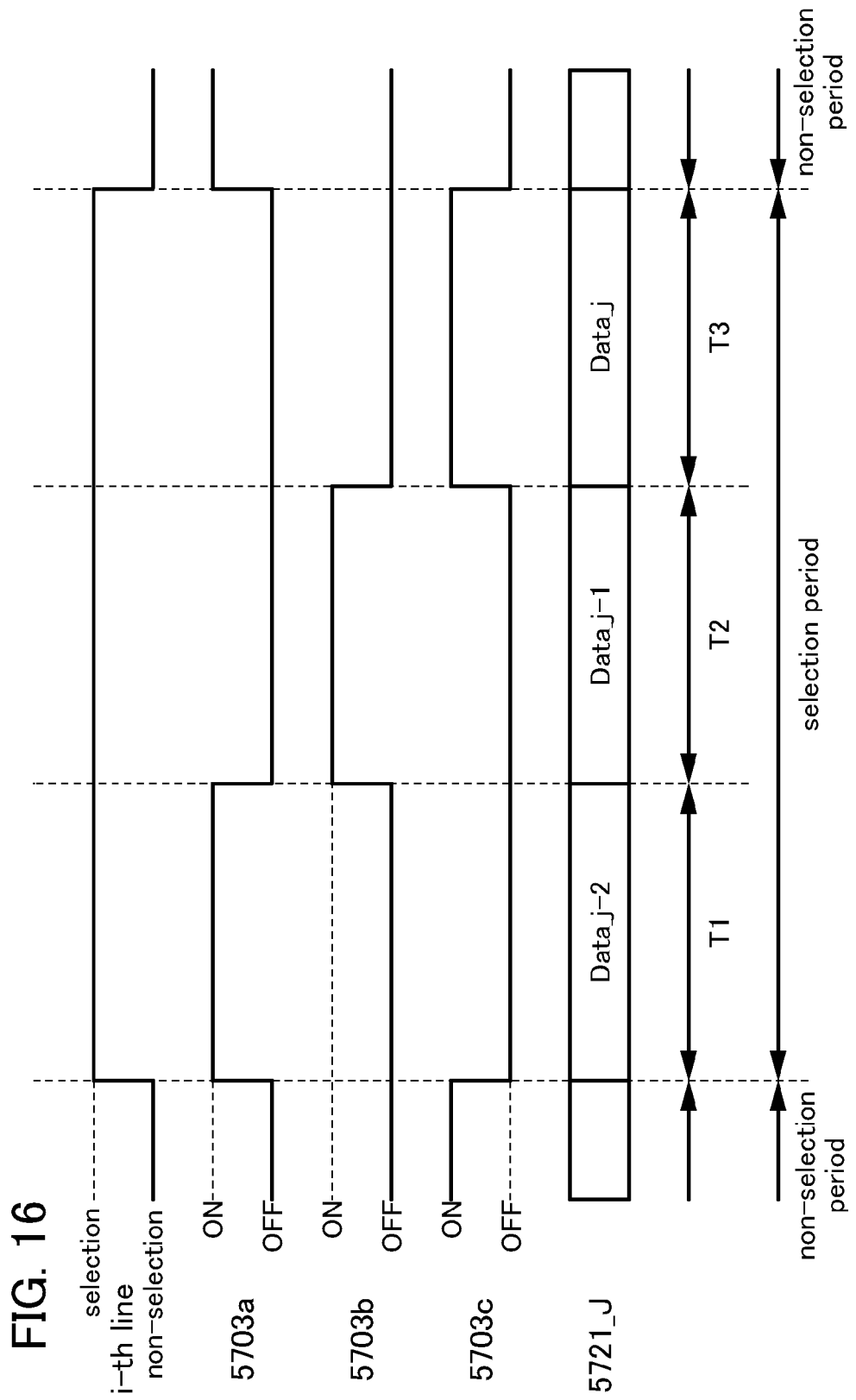
FIG. 16 is a timing chart illustrating operation of the signal line driver circuit.

Next, operation of the signal line driver circuit illustrated in FIG. 15 is described with reference to a timing chart in FIG. 16. The timing chart in FIG. 16 shows the case where a scanning line Gi of the i-th stage is selected. A selection period of the scanning line Gi of the i-th stage is divided into a first sub-selection period T1, a second sub-selection period T2, and a third sub-selection period T3. In addition, the signal line driver circuit in FIG. 15 operates as shown in FIG. 16 even when a scanning line of another stage is selected.

Note that the timing chart in FIG. 16 shows the case where the wiring 5621_J in the J-th column is connected to the signal line Sj−2, the signal line Sj−1, and the signal line Sj via the first thin film transistor 5603a, the second thin film transistor 5603b, and the third thin film transistor 5603c, respectively.

The timing chart in FIG. 16 shows timing at which the scanning line Gi of the i-th stage is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. In addition, in the first sub-selection period T1, the second sub-selection period T2, and the third sub-selection period T3, the video signals input to the wiring 5621_J are denoted by Data_j−2, Data_j−1, and Data_j, respectively.

As shown in FIG. 16, in the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 via the first thin film transistor 5603a. In the second sub-selection period T2, the second thin film transistor 5603b is turned on, and the first thin film transistor 5603a and the third thin film transistor 5603c are turned off. At this time, Data_j−1 input to the wiring 5621_J is input to the signal line Sj−1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal line driver circuit in FIG. 15, by dividing one gate selection period into three, video signals can be input to three signal lines from one wiring 5621_J in one gate selection period. Therefore, in the signal line driver circuit in FIG. 15, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 16.

For example, when a video signal is input to each of three or more signal lines from one wiring in each of three or more sub-selection periods, it is necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
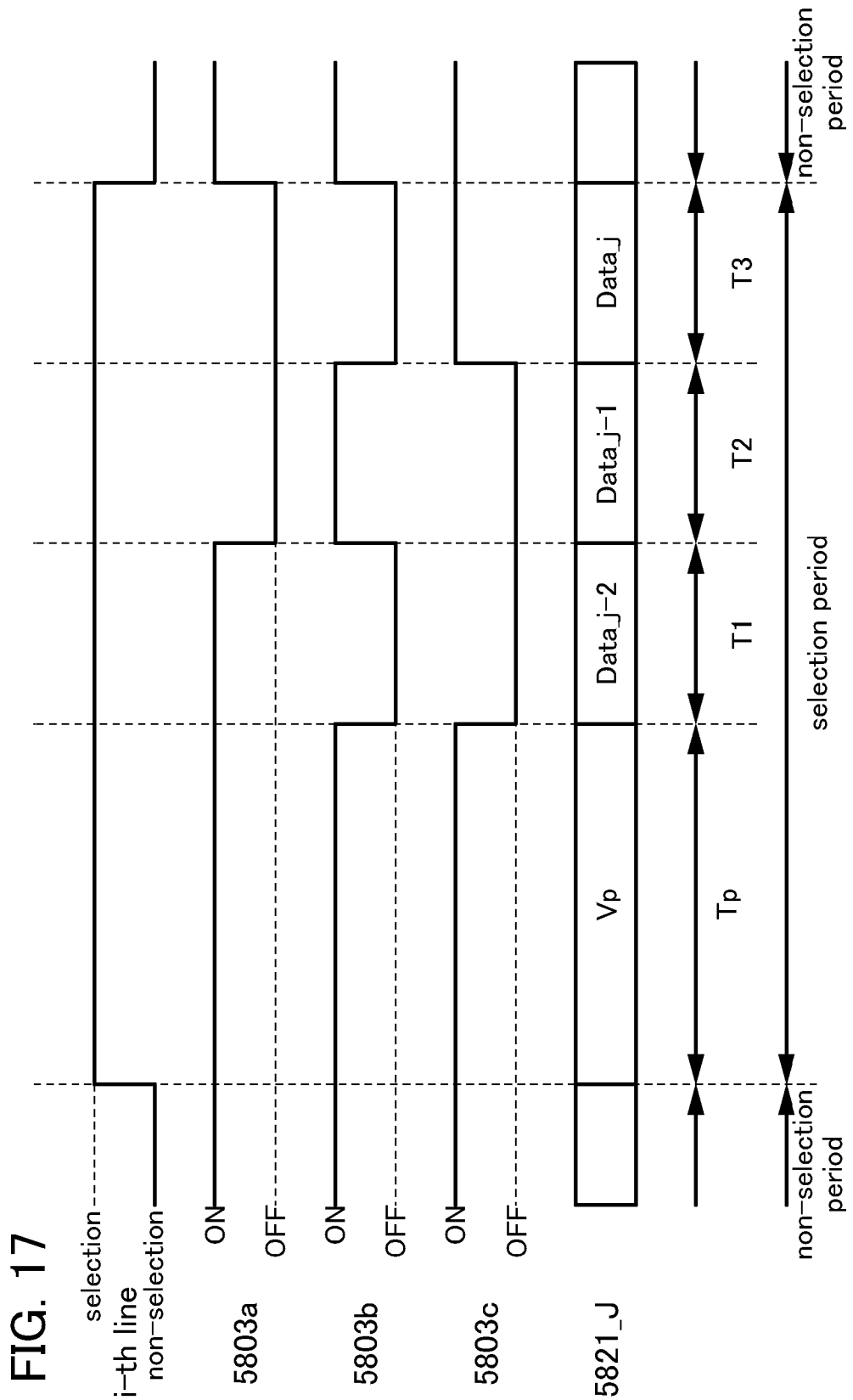
FIG. 17 is a timing chart illustrating operation of the signal line driver circuit.

As another example, one selection period may be divided into a precharge period Tp, the first sub-selection period T1, the second sub-selection period T2, and the third sub-selection period T3 as illustrated in a timing chart in FIG. 17. The timing chart in FIG. 17 illustrates timing at which the scanning line Gi of the i-th stage is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 17, the first thin film transistor 5603a, the second thin film transistor 5603b, and the third thin film transistor 5603c are tuned on in the precharge period Tp. At this time, precharge voltage Vp input to the wiring 5621_J is input to the signal line Sj−2, the signal line Sj−1, and the signal line Sj via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 via the first thin film transistor 5603a. In the second sub-selection period T2, the second thin film transistor 5603b is turned on, and the first thin film transistor 5603a and the third thin film transistor 5603c are turned off. At this time, Data_j−1 input to the wiring 5621_J is input to the signal line Sj−1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal line driver circuit in FIG. 15 to which the timing chart in FIG. 17 is applied, the video signal can be written to the pixel at high speed because the signal line can be precharged by providing a precharge selection period before a sub-selection period. Note that portions in FIG. 17 which are similar to those of FIG. 16 are denoted by common reference numerals and detailed description of the portions which are the same and portions which have similar functions is omitted.

Further, a structure of a scanning line driver circuit is described. The scanning line driver circuit includes a shift register and a buffer. In addition, the scanning line driver circuit may include a level shifter in some cases. In the scanning line driver circuit, when a clock signal (CLK) and a start pulse signal (SP) are input to the shift register, a selection signal is produced. The generated selection signal is buffered and amplified by the buffer, and the resulting signal is supplied to a corresponding scanning line. Gate electrodes of transistors in pixels of one line are connected to the scanning line. Further, since the transistors in the pixels of one line have to be turned on at the same time, a buffer which can feed a large current is used.

One mode of a shift register which is used for part of a scanning line driver circuit is described with reference to FIG. 18 and FIG. 19.

Figure 18:
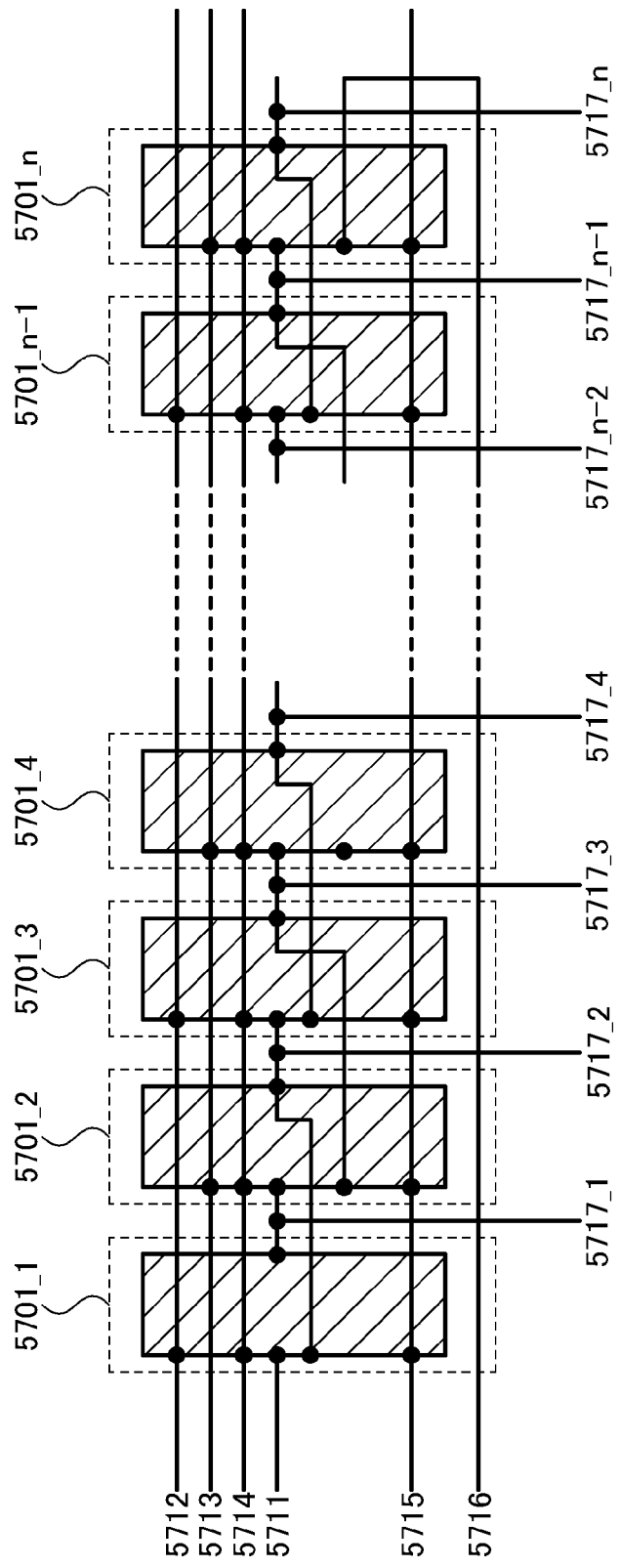
FIG. 18 illustrates a structure of a shift register.

FIG. 18 illustrates a circuit structure of the shift register. The shift register illustrated in FIG. 18 includes a plurality of flip-flops which are flip-flops 5701_1 to 5701_n. In addition, the shift register is operated with input of a first clock signal, a second clock signal, a start pulse signal, and a reset signal.

The connection relation of the shift register illustrated in FIG. 18 is described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, the flip-flop 5701_i (any one of the flip-flops 5701_1 to 5701_n) of an i-th stage is connected to one of the second wiring 5712 and the third wiring 5713, the fourth wiring 5714, the fifth wiring 5715, a seventh wiring 5717_i−1, a seventh wiring 5717_i, and a seventh wiring 5717_i+1. Here, when the "i" is an odd number, the flip-flop 5701_i of the i-th stage is connected to the second wiring 5712; when the "i" is an even number, the flip-flop 5701_i of the i-th stage is connected to the third wiring 5713.

The flip-flop 5701_n of an n-th stage is connected to one of the second wiring 5712 and the third wiring 5713, the fourth wiring 5714, the fifth wiring 5715, a seventh wiring 5717_n−1, the seventh wiring 5717_n, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Figure 19:
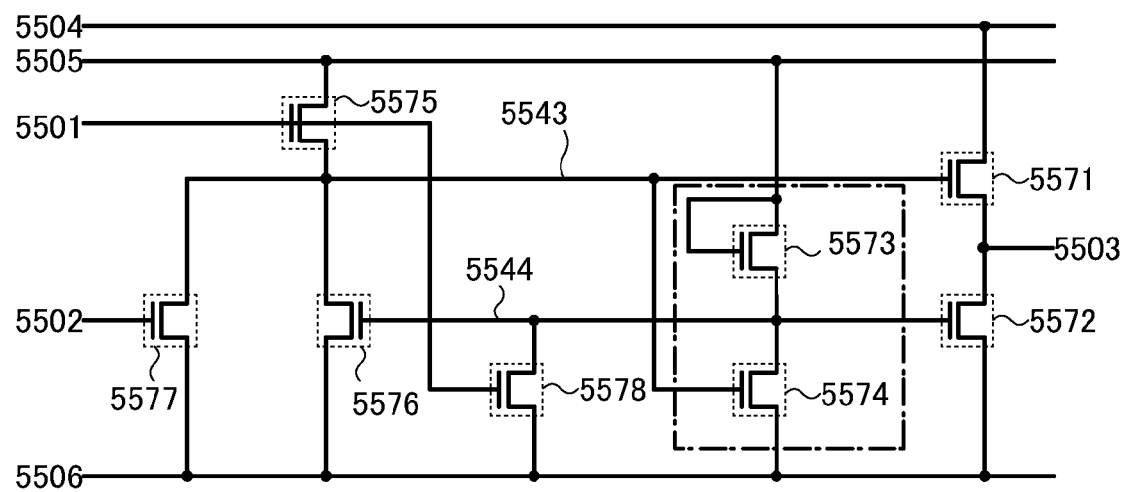
FIG. 19 illustrates a connection structure of the flip-flop illustrated in FIG. 18.

Next, FIG. 19 illustrates details of the flip-flop illustrated in FIG. 18. A flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage (Vgs) exceeds the threshold voltage (Vth).

In addition, the flip-flop illustrated in FIG. 19 includes a first wiring 5501, a second wiring 5502, a third wiring 5503, a fourth wiring 5504, a fifth wiring 5505, and a sixth wiring 5506.

Note that all thin film transistors here are enhancement-mode n-channel transistors; however, the present invention is not limited thereto. For example, the driver circuit can be operated using depression-mode n-channel transistors.

Next, a connection structure of the flip-flop illustrated in FIG. 19 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506 and a second electrode of the second thin film transistor 5572 is connected to the third wiring 5503.

A first electrode and a gate electrode of the third thin film transistor 5573 are connected to the fifth wiring 5505 and a second electrode of the third thin film transistor 5573 is connected to the gate electrode of the second thin film transistor 5572.

A first electrode of the fourth thin film transistor 5574 is connected to the sixth wiring 5506, a gate electrode of the fourth thin film transistor 5574 is connected to the gate electrode of the first thin film transistor 5571, and a second electrode of the fourth thin film transistor 5574 is connected to the gate electrode of the second thin film transistor 5572.

A first electrode of the fifth thin film transistor 5575 is connected to the fifth wiring 5505, a gate electrode of the fifth thin film transistor 5575 is connected to the first wiring 5501, and a second electrode of the fifth thin film transistor 5575 is connected to the gate electrode of the first thin film transistor 5571.

A first electrode of the sixth thin film transistor 5576 is connected to the sixth wiring 5506, a gate electrode of the sixth thin film transistor 5576 is connected to the gate electrode of the second thin film transistor 5572, and a second electrode of the sixth thin film transistor 5576 is connected to the gate electrode of the first thin film transistor 5571.

A first electrode of the seventh thin film transistor 5577 is connected to the sixth wiring 5506, a gate electrode of the seventh thin film transistor 5577 is connected to the second wiring 5502, and a second electrode of the seventh thin film transistor 5577 is connected to the gate electrode of the first thin film transistor 5571.

A first electrode of the eighth thin film transistor 5578 is connected to the sixth wiring 5506, a gate electrode of the eighth thin film transistor 5578 is connected to the first wiring 5501, and a second electrode of the eighth thin film transistor 5578 is connected to the gate electrode of the second thin film transistor 5572.

Note that a point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. A point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In the flip-flop 5701_$i$ of the i-th stage, the first wiring 5501 in FIG. 19 is connected to the seventh wiring 5717_$i$−1 in FIG. 18. The second wiring 5502 in FIG. 19 is connected to the seventh wiring 5717_$i$+1 in FIG. 18. The third wiring 5503 in FIG. 19 is connected to the seventh wiring 5717_$i$. The sixth wiring 5506 in FIG. 19 is connected to the fifth wiring 5715.

If the "i" is an odd number, the fourth wiring 5504 in FIG. 19 is connected to the second wiring 5712 in FIG. 18; if the "i" is an even number, the fourth wiring 5504 in FIG. 19 is connected to the third wiring 5713 in FIG. 18. In addition, the fifth wiring 5505 in FIG. 19 is connected to the fourth wiring 5714 in FIG. 18.

Note that in the flip-flop 5701_1 of the first stage, the first wiring 5501 in FIG. 19 is connected to the first wiring 5711 in FIG. 18. In addition, in the flip-flop 5701_$n$ of the n-th stage, the second wiring 5502 in FIG. 19 is connected to the sixth wiring 5716 in FIG. 18.

Note that the signal line driver circuit and the scanning line driver circuit can be formed using only the n-channel TFTs described in Embodiment 1. The n-channel TFT described in Embodiment 1 has high mobility, and thus a driving frequency of a driver circuit can be increased. In addition, in the n-channel TFT illustrated in Embodiment 1, since parasitic capacitance is reduced by the source region and the drain region formed using an In—Ga—Zn—O based non-single-crystal film, the frequency characteristics (referred to as f characteristics) are high. For example, a scanning line driver circuit using the n-channel TFT described in Embodiment 1 can operate at high speed, and thus a frame frequency can be increased and insertion of black images and the like can be realized.

In addition, when the channel width of the transistor in the scanning line driver circuit is increased or a plurality of scanning line driver circuits are provided, a higher frame frequency can be realized. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized. In addition, output of a signal to one scanning line by a plurality of scanning line driver circuits has an advantage of upsizing of the display device.

Figure 14B:
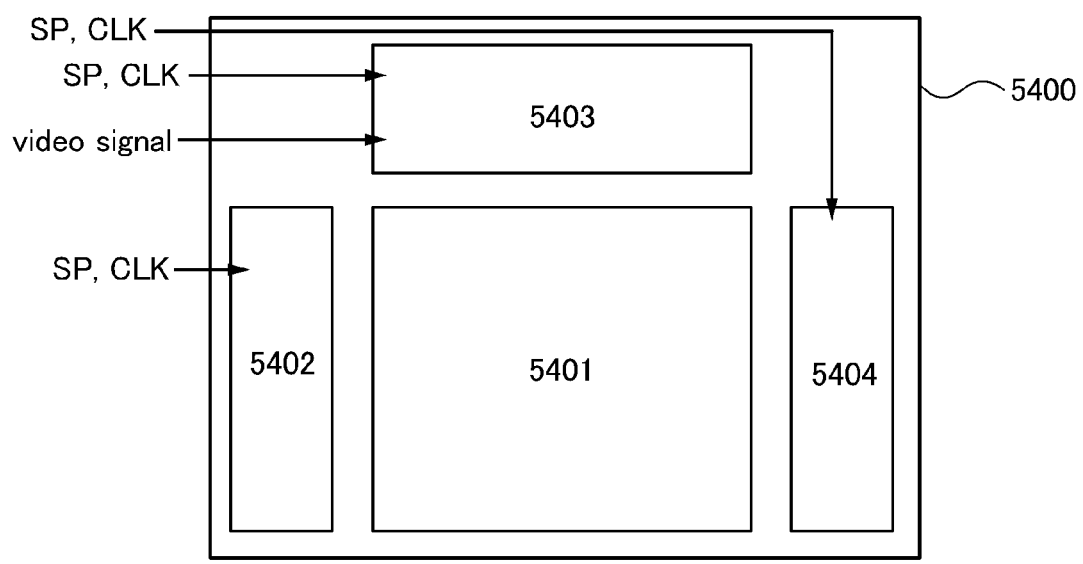

Further, when an active matrix light-emitting display device, which is an example of a display device, is manufactured, a plurality of transistors are arranged in at least one pixel, and thus a plurality of scanning line driver circuits are preferably arranged. FIG. 14B is a block diagram illustrating an example of an active matrix light-emitting display device.

The light-emitting display device illustrated in FIG. 14B includes, over a substrate 5400, a pixel portion 5401 having a plurality of pixels each provided with a display element, a first scanning line driver circuit 5402 and a second scanning line driver circuit 5404 that select a pixel, and a signal line driver circuit 5403 that controls input of a video signal to the selected pixel.

When the video signal input to a pixel of the display device illustrated in FIG. 14B is a digital signal, a pixel is in a light-emitting state or a non-light-emitting state by switching of on/off of a transistor. Thus, grayscale can be displayed using an area ratio grayscale method or a time ratio grayscale method. An area ratio grayscale method refers to a driving method by which one pixel is divided into a plurality of sub-pixels and each sub-pixel is driven independently based on a video signal so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid crystal elements. In the case of displaying with a time gray scale method, one frame period is divided into a plurality of sub-frame periods. Then, in accordance with video signals, the light-emitting element in the pixel is set in a light-emitting state or a non-light-emitting state in each sub-frame period. By dividing one frame into a plurality of sub-frames, the total length of time, in which pixels emit light in one frame period, can be controlled with video signals so that gray scales are displayed.

In the light-emitting display device illustrated in FIG. 14B, in the case where two switching TFTs are arranged in one pixel, the first scanning line driver circuit 5402 generates a signal which is input to a first scanning line serving as a gate wiring of one switching TFT, and the second scanning line driver circuit 5404 generates a signal which is input to a second scanning line serving as a gate wiring of the other switching TFT; however, one scanning line driver circuit may generate both the signals which is input to the first scanning line and the signal which is input to the second scanning line. In addition, for example, there is a possibility that a plurality of scanning lines used for controlling the operation of the switching element are provided in each pixel, depending on the number of the switching TFTs included in one pixel. In that case, one scanning line driver circuit may generate all signals that are input to the plurality of scanning lines, or a plurality of scanning line driver circuits may generate signals that are input to the plurality of scanning lines.

In addition, also in the light-emitting display device, a part of a driver circuit that can be formed by n-channel TFTs among driver circuits can be formed over the same substrate as the thin film transistors of the pixel portion. Alternatively, the signal line driver circuit and the scanning line driver circuit can be formed using only the n-channel TFTs described in Embodiment 1.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. For example, electrophoretic displays include a plurality of microcapsules dispersed in a solvent or a solute, each microcapsule includes a first particle which is positively charged and a second particle which is negatively charged. In this case, by applying an electric field to the microcapsules, the particles in the microcapsules are moved in opposite directions to each other and only the color of the particles concentrated on one side can be exhibited. Note that the first particle and the second particle each include pigment and do not move without an electric field. Moreover, the colors of the first particle and the second particle are different from each other (including colorless or achroma).

In this way, an electrophoretic display is a display that utilizes a system in which particles are moved by an electric field or the like. An electrophoretic display does not need a polarizer and a counter substrate, which are required in a liquid crystal display device, whereby both the thickness and weight of the electrophoretic display can be reduced remarkably.

A solution obtained by dispersing the aforementioned microcapsules throughout a solvent is referred to as electronic ink. This electronic ink can be printed on a surface of glass, plastic, cloth, paper, or the like. Furthermore, by the use of a color filter or particles that have a pigment, color display is possible, as well.

When a plurality of microcapsules are arranged over an active matrix substrate and the microcapsules are interposed between an electrode formed over the active matrix substrate and another electrode, an active matrix display device is completed. The active matrix display device can perform display by application of an electric field to the microcapsules. As the active matrix substrate, for example, the active matrix substrate with the use of the thin film transistor obtained in Embodiment 1 can be used.

Note that the first particle and the second particle in the microcapsule may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above process, a highly reliable display device can be manufactured as a semiconductor device.

This embodiment can be implemented in combination with any of the other embodiments as appropriate.

Embodiment 5

In this embodiment, a thin film transistor is manufactured, and a semiconductor device having a display function (also referred to as a display device) can be manufactured using the thin film transistor for a pixel portion and further for a driver circuit. Further, a part or whole of a driver circuit can be formed over the same substrate as a pixel portion, using the thin film transistor according to an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as electronic ink, can be used.

In addition, the display device includes a panel in which the display element is sealed, and a module in which an IC including a controller or the like is mounted on the panel. The display device includes an element substrate corresponding to one mode before the display element is completed in a manufacturing process of the display device, and the element substrate is provided with a means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device is shown as an example of a semiconductor device. The appearance and a cross section of a liquid crystal display panel, which is one embodiment of the semiconductor device of the present invention, will be described with reference to FIGS. 22A1 to 22B. FIGS. 22A1 and 22A2 are top views of a panel in which highly reliable thin film transistors 4010 and 4011 each of which includes the In—Ga—Zn—O based non-single-crystal film described in Embodiment 1 as a semiconductor layer and are provided with a barrier film, and a liquid crystal element 4013 are sealed between a first substrate 4001 and a second substrate 4006 with a sealant 4005. FIG. 22B is a cross-sectional view along line M-N of FIGS. 22A1 and 22A2.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scanning line driver circuit 4004 provided over the first substrate 4001 each include a plurality of thin film transistors. FIG. 22B illustrates the thin film transistor 4010 included in the pixel portion 4002 and the thin film transistor 4011 included in the scanning line driver circuit 4004. The Barrier film 4020 and an insulating layer 4021 are provided over the thin film transistors 4010 and 4011.

Each of the thin film transistors 4010 and 4011 corresponds to the highly reliable thin film transistor described in Embodiment 1, in which an In—Ga—Zn—O based non-single-crystal film is included as a semiconductor layer. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating film 4032 and an insulating film 4033 respectively which each function as an alignment film, and sandwich the liquid crystal layer 4008 with the insulating layers 4032 and 4033 interposed therebetween.

Note that the first substrate 4001 and the second substrate 4006 can be formed by using glass, metal (typically, stainless steel), ceramic, or plastic. As an example of plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used. In addition, the counter electrode layer 4031 is electrically connected to a common potential line formed over the same substrate as the thin film transistor 4010. The counter electrode layer 4031 and the common potential line are electrically connected to each other using a common connecting portion, with conductive particles which are arranged between the pair of substrates interposed therebetween. Note that the conductive particles are included in the sealant 4005.

Alternatively, liquid crystal showing a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition in which a chiral agent at 5 wt % or more is mixed is used for the liquid crystal layer 4008 in order to improve the temperature range. The liquid crystal composition which includes liquid crystal showing a blue phase and a chiral agent have such characteristics that the response speed is as short as 10 μs to 100 μs, the alignment process is unnecessary because the liquid crystal composition has optical isotropy, and viewing angle dependency is small.

Note that the liquid crystal display device described in this embodiment is an example of a transmissive liquid crystal display device; however, the liquid crystal display device described in this embodiment can be applied to a reflective liquid crystal display device and a semi-transmissive liquid crystal display device.

In this embodiment, an example of the liquid crystal display device is described in which a polarizing plate is provided in a position outer than the substrate (on the viewer side) and a coloring layer and the electrode layer used for a display element are provided in a position inner than the substrate; however, the polarizing plate may be provided in an inner position than the substrate. The stacked structure of the polarizing plate and the coloring layer is not limited to this embodiment and may be set as appropriate depending on materials of the polarizing plate and the coloring layer or conditions of manufacturing steps. Further, a light-blocking film functioning as a black matrix may be provided.

In this embodiment, the thin film transistor obtained in Embodiment 1 is covered with insulating layers (the barrier film 4020 and the insulating layer 4021) functioning as protective layers or planarization insulating films so that unevenness of the surface of the thin film transistor is reduced and reliability of the thin film transistor is improved. The thickness of the barrier film 4020 is preferably greater than or equal to 1 nm and less than or equal to 200 nm. Note that the barrier film 4020 is provided to prevent the entry of a contaminant impurity such as an organic substance, a metal substance, or moisture floating in the air and is preferably a dense film. A barrier property against an impurity such as moisture and oxygen is improved by formation with the use of a dense film. The barrier film 4020 can be formed with a single layer or a stacked layer formed using a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method. In this embodiment, the protective film is formed by a sputtering method; however, this embodiment is not particularly limited thereto. The protective film may be formed by any of various methods.

Here, the bather film 4020 is formed using an aluminum oxide film. When the film having a high bather property against moisture and oxygen is formed to cover the oxide semiconductor layer, moisture and oxygen can be prevented from being mixed into the oxide semiconductor layer. Accordingly, oxidation-reduction reaction of the oxide semiconductor layer and variation in an oxygen vacancy concentration can be suppressed. Further, an impurity floating in the atmosphere in a base material such as an organic substance and a metal can be prevented from being mixed into the oxide semiconductor layer. Therefore, variation in semiconductor characteristics of the semiconductor device in which an oxide semiconductor is used can be suppressed. Moreover, reliability of the semiconductor device can be improved.

In addition, a silicon nitride film, a silicon oxide film, a silicon nitride oxide film, or silicon oxynitride film may be formed over the barrier film 4020 (not illustrated). For example, a silicon nitride film is formed over the barrier film 4020 by a sputtering method. When a silicon nitride film is provided over the barrier film 4020, it is possible to prevent movable ions such as sodium from entering a semiconductor region to vary the electrical characteristics of the TFT.

In addition, after forming the barrier film 4020, the semiconductor layer may be annealed (at 300° C. to 400° C.).

In addition, the insulating layer 4021 is formed over the bather film 4020. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane-based material as a starting material and having the bond of Si—O—Si. The siloxane-based resin may include, as a substituent, an organic group (e.g., an alkyl group or an aryl group) or a fluoro group. In addition, the organic group may include a fluoro group.

There are no particular limitations on formation method of the insulating layer 4021 and any of the following methods can be employed depending on the material of the insulating layer 4021: a sputtering method, an SOG method, spin coating, dipping, spray coating, a droplet discharge method (e.g., an ink-jet method, screen printing, offset printing, or the like), a doctor knife, a roll coater, a curtain coater, a knife coater, and the like. When the insulating layer 4021 is formed using a material solution, the semiconductor layer may be annealed (at 300° C. to 400° C.) at the same time as a baking step of the insulating layer 4021. The baking step of the insulating layer 4021 serves also as the annealing step of the semiconductor layer, and a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like.

In addition, a conductive composition containing a conductive high molecule (also referred to as a conductive polymer) can be used for forming the pixel electrode layer 4030 and the counter electrode layer 4031. The pixel electrode formed of the conductive composition has preferably a sheet resistance of less than or equal to $1.0 \times 10^4$ Ω/square and a transmittance of greater than or equal to 70% at a wavelength of 550 nm Further, the resistivity of the conductive high molecule contained in the conductive composition is preferably less than or equal to 0.1 Ω·cm.

As the conductive high molecule, a so-called π electron conjugated conductive high molecule can be used. As examples thereof, polyaniline or a derivative thereof, polypyrrole or a derivative thereof, polythiophene or a derivative thereof, a copolymer of two or more kinds of them, and the like can be given.

Further, a variety of signals and a potential are supplied to the signal line driver circuit 4003 which is formed separately, the scanning line driver circuit 4004, and the pixel portion 4002 from an FPC 4018.

In this embodiment, a connection terminal electrode 4015 is formed using the same conductive film as the pixel electrode layer 4030 included in the liquid crystal element 4013, and a terminal electrode 4016 is formed with the same conductive film as the source electrode layers and the drain electrode layers of the thin film transistors 4010 and 4011.

The connection terminal electrode 4015 is electrically connected to a terminal included in the FPC 4018 through an anisotropic conductive film 4019.

Note that FIGS. 22A1 to 22B illustrate examples in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 23:
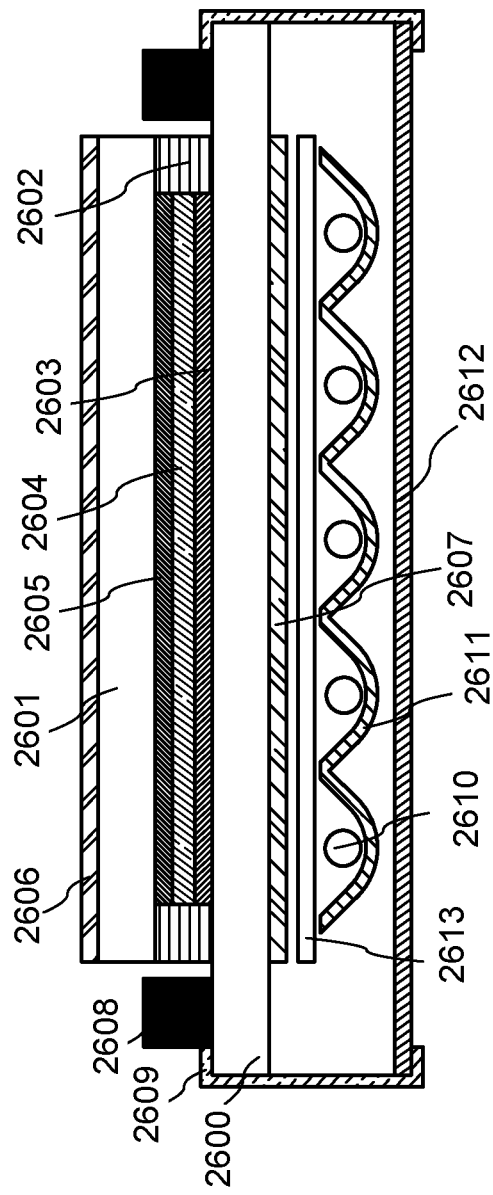
FIG. 23 illustrates a semiconductor device according to Embodiment 5.

FIG. 23 illustrates an example in which a TFT substrate 2600 is used for a liquid crystal display module which corresponds to one mode of the semiconductor device.

FIG. 23 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, a coloring layer 2605, and a polarizing plate 2606 are provided between the substrates to form a display region. The coloring layer 2605 is necessary to perform color display. In the case of the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, liquid crystal of a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display device can be manufactured as a semiconductor device.

This embodiment can be implemented in combination with any of the other embodiments as appropriate.

Embodiment 6

In this embodiment, electronic paper is described as an example of a semiconductor device.

Figure 13:
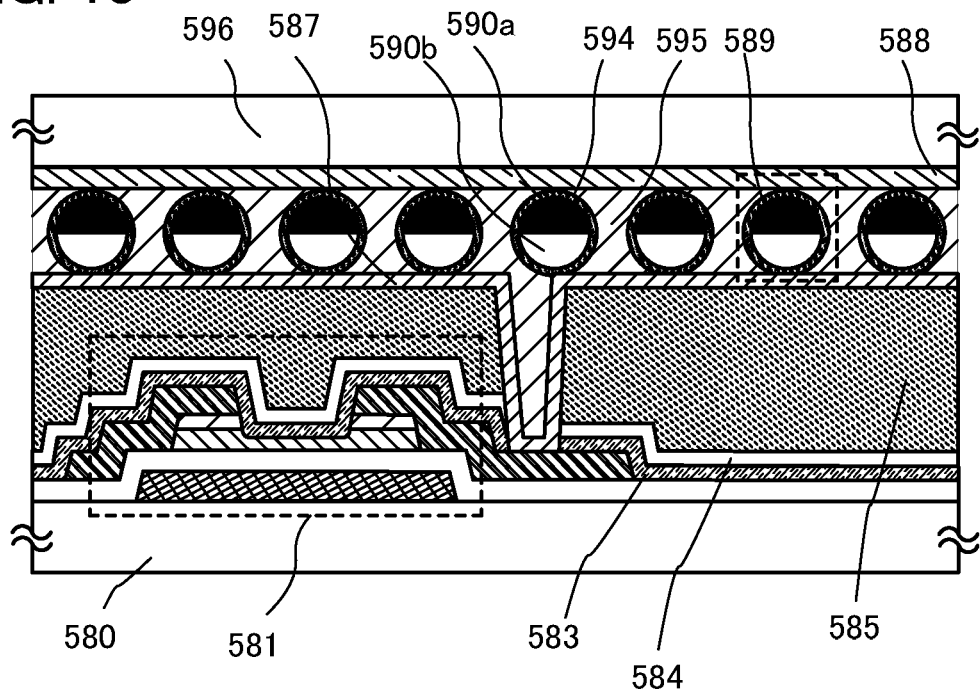
FIG. 13 illustrates a semiconductor device according to Embodiment 6.

FIG. 13 illustrates active matrix electronic paper as an example of a semiconductor device. A thin film transistor 581 used for the semiconductor device can be manufactured in a manner similar to the thin film transistor described in any of Embodiments 1 to 3. The semiconductor device described in this embodiment is the semiconductor device described in Embodiment 1.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 13 illustrates an example in which a barrier layer is formed with a two-layer structure. The thin film transistor 581 formed over a substrate 580 is a thin film transistor with a bottom-gate structure, and a source electrode layer or a drain electrode layer is electrically connected to a first electrode layer 587 through a contact hole formed in a barrier film 583, a barrier film 584, and an insulating layer 585. Between the first electrode layer 587 and a second electrode layer 588, spherical particles 589 each having a black region 590a and a white region 590b are provided, which are surrounded by a cavity 594 filled with liquid. A space around the spherical particles 589 is filled with a filler 595 such as resin (see FIG. 13). In FIG. 13, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 provided for the substrate 596 and the common potential electrode can be electrically connected to each other using the common connection portion described in the above embodiment, with the conductive particles which are arranged between the pair of substrates interposed therebetween.

Further, instead of the twisting ball, an electrophoretic element can also be used. In this case, a microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be implemented in combination with any of the structures described in the other embodiments as appropriate.

Embodiment 7

In this embodiment, a light-emitting display device is described as an example of a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film-type inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film-type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
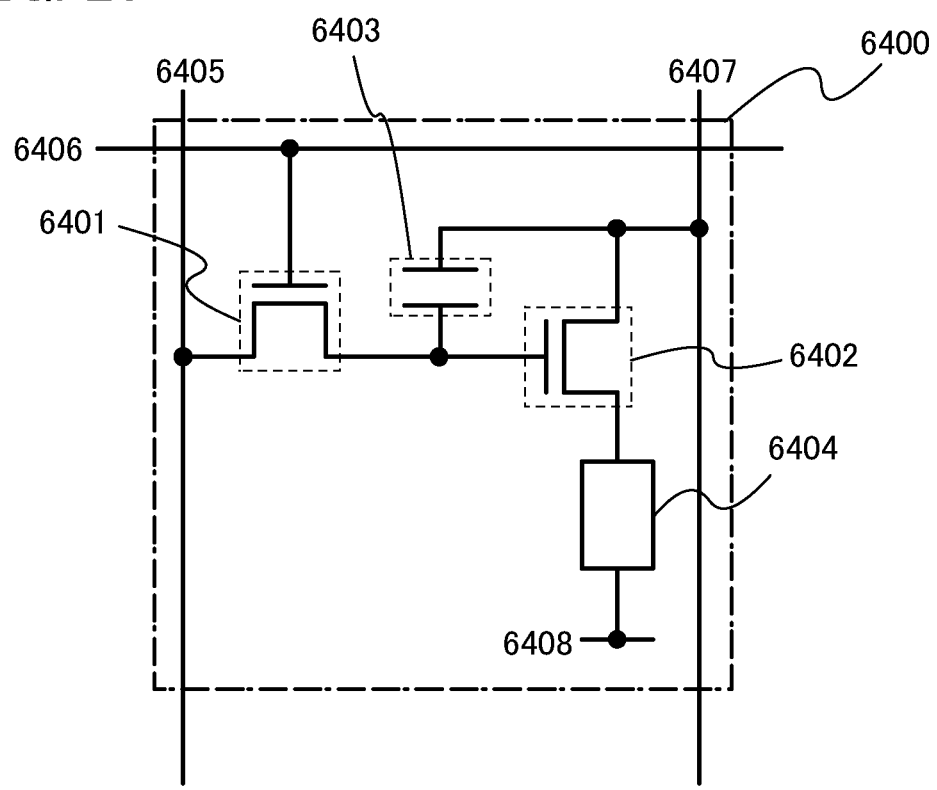
FIG. 20 illustrates an equivalent circuit of a pixel in a semiconductor device according to Embodiment 7.

FIG. 20 illustrates an example of a pixel structure to which digital time grayscale driving can be applied, as an example of a semiconductor device.

A structure and operation of a pixel to which digital time grayscale driving can be applied are described. In this example, one pixel includes two n-channel transistors each of which includes an oxide semiconductor layer (an In—Ga—Zn—O based non-single-crystal film) as a channel formation region.

A pixel 6400 includes a switching transistor 6401, a driver transistor 6402, a light-emitting element 6404, and a capacitor 6403. A gate of the switching transistor 6401 is connected to a scanning line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over the same substrate. The common electrode 6408 is electrically connected to the common potential line formed over the same substrate.

The second electrode (common electrode 6408) of the light-emitting element 6404 is set to a low power supply potential. Note that the low power supply potential is a potential satisfying "the low power supply potential<a high power supply potential" with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to "voltage of the power supply line+Vth of the driver transistor 6402" is applied to the signal line 6405.

In the case of performing analog grayscale driving instead of digital time grayscale driving, the same pixel structure as that in FIG. 20 can be used by changing input signal.

In the case of performing analog grayscale driving, a voltage higher than or equal to "forward voltage of the light-emitting element 6404+Vth of the driver transistor 6402" is applied to the gate of the driver transistor 6402. "The forward voltage of the light-emitting element 6404" indicates a voltage at which a desired luminance is obtained, and is at least higher than a forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 20 is not limited thereto. For example, a switch, a resistor, a capacitor, a transistor, a logic circuit, or the like may be added to the pixel illustrated in FIG. 20.

Next, structures of the light-emitting element is described with reference to FIGS. 21A to 21C. A cross-sectional structure of a pixel is described by taking an n-channel driver TFT as an example. Driver TFTs 7001, 7011, and 7021 used for semiconductor devices illustrated in FIGS. 21A to 21C can be manufactured in a manner similar to the thin film transistor described in Embodiment 1 and are highly reliable thin film transistors each including an In—Ga—Zn—O based non-single-crystal film as a semiconductor layer. In addition, in FIGS. 21A to 21C, a barrier film is provided with a two-layer structure.

Figure 21A:
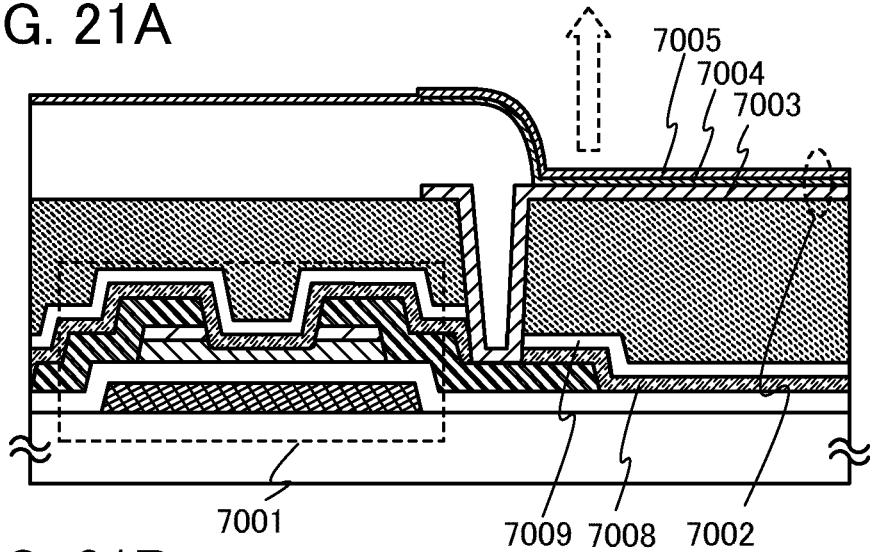
FIGS. 21A to 21C each illustrate a semiconductor device according to Embodiment 7.

In FIG. 21A, barrier films 7008 and 7009 can be formed using an aluminum oxide film, an aluminum nitride film, an aluminum oxynitride film, or an aluminum nitride oxide film. Further, barrier films 7018 and 7019 in FIG. 21B and barrier films 7028 and 7029 can also be formed using an aluminum oxide film, an aluminum nitride film, an aluminum oxynitride film, or an aluminum nitride oxide film.

When the film having high bather property against moisture and oxygen is formed to cover the oxide semiconductor layer, moisture and oxygen can be prevented from being mixed into the oxide semiconductor layer. Accordingly, oxidation-reduction reaction of the oxide semiconductor layer and variation in the oxygen vacancy concentration can be suppressed. Further, an impurity floating in the atmosphere or included in a base material such as an organic substance and a metal can be prevented from being mixed into the oxide semiconductor layer. Therefore, variation in the semiconductor characteristics of the semiconductor device in which an oxide semiconductor is used can be suppressed. Further, reliability of the semiconductor device can be improved.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of an embodiment of the present invention can be applied to a light-emitting element having any of these emission structures.

A light-emitting element having a top emission structure is described with reference to FIG. 21A.

FIG. 21A is a cross-sectional view of a pixel in the case where the driver TFT 7001 is an n-channel TFT and light is emitted from a light-emitting element 7002 to an anode 7005 side. In FIG. 21A, a cathode 7003 of the light-emitting element 7002 is electrically connected to the driver TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, $CaF_2$, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive material such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure is described with reference to FIG. 21B. FIG. 21B is a cross-sectional view of a pixel in the case where the driver TFT 7011 is an n-channel transistor and light is emitted from a light-emitting element 7012 to a cathode 7013 side. In FIG. 21B, the cathode 7013 of the light-emitting element 7012 is formed over a light-transmitting conductive film 7017 that is electrically connected to the driver TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 21A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 21A, the light-emitting layer 7014 may be formed using either a single layer or a plurality of layers stacked. The anode 7015 is not required to transmit light, but can be formed using a light-transmitting conductive material as in the case of FIG. 21A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driver TFT 7021, and a light-emitting layer 7024 and an anode 7025 are stacked in this order over the cathode 7023. As in the case of FIG. 21A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 21A, the light-emitting layer 7024 may be formed using either a single layer or a plurality of layers stacked. The anode 7025 can be formed using a light-transmitting conductive material as in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driver TFT) which controls the driving of a light-emitting element is electrically connected to the light-emitting element; however, a structure may be employed in which a TFT for current control is connected between the driver TFT and the light-emitting element.

Figure 21B:
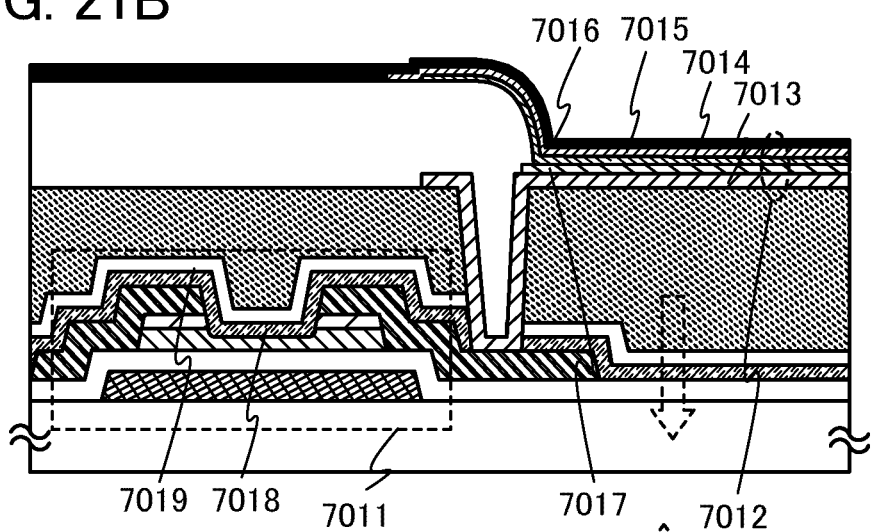
Figure 21C:
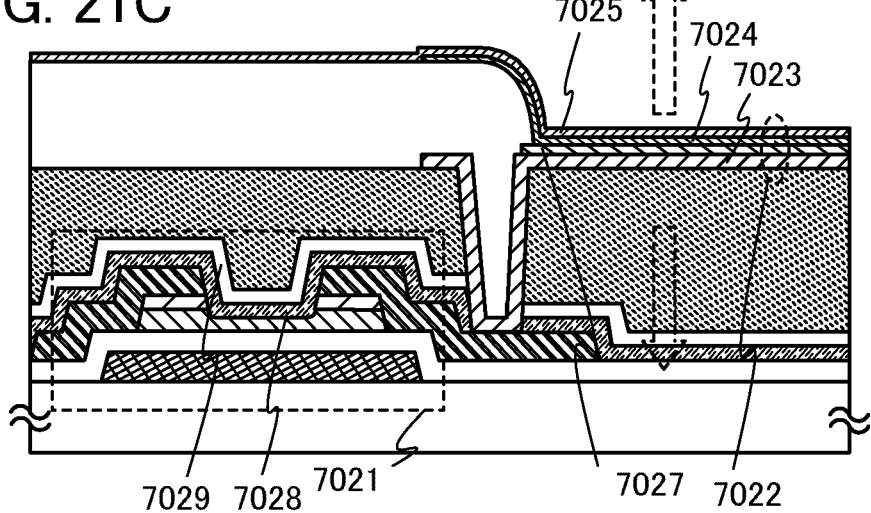

A semiconductor device described in this embodiment is not limited to the structures illustrated in FIGS. 21A to 21C and can be modified in various ways based on the spirit of techniques according to the present invention.

Next, the appearance and the cross section of a light-emitting display panel (also referred to as a light-emitting panel), which is one embodiment of a semiconductor device, are described with reference to FIGS. 24A and 24B. FIG. 24A is a top view of a panel in which highly reliable thin film transistors 4509 and 4510 which are formed over a first substrate 4501 described in Embodiment 1 and each of which includes an In—Ga—Zn—O based non-single-crystal film as a semiconductor layer, and a light-emitting element 4511 are sealed between the first substrate 4501 and a second substrate 4506 with a sealant 4505. FIG. 24B is a cross-sectional view taken along line H-I of FIG. 24A.

A sealant 4505 is provided so as to surround a pixel portion 4502, signal line driver circuits 4503a and 4503b, and scanning line driver circuits 4504a and 4504b which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 24B.

As each of the thin film transistors 4509 and 4510, the highly reliable thin film transistor described in Embodiment 1, in which an In—Ga—Zn—O based non-single-crystal film is included as a semiconductor layer, can be used. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scanning line driver circuits 4504a and 4504b, and the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be provided as driver circuits formed using a single crystal semiconductor film or polycrystalline semiconductor film over a substrate separately prepared. In addition, only the signal line driver circuits or part thereof, or the scanning line driver circuits or part thereof may be separately formed and mounted. This embodiment is not limited to the structure illustrated in FIGS. 24A and 24B.

Through the above process, a highly reliable light-emitting display device (display panel) can be manufactured as a semiconductor device.

This embodiment can be implemented in combination with any of the other embodiments as appropriate.

Embodiment 8

A semiconductor device according to the present invention can be applied to electronic paper. Electronic paper can be used for electronic devices of a variety of fields as long as they can display data. For example, electronic paper according to the present invention can be applied to an electronic book (e-book) reader, a poster, an advertisement in a vehicle such as a train, displays of various cards such as a credit card, and the like. Examples of the electronic devices are illustrated in FIGS. 25A and 25B and FIG. 26.

Figure 25A:
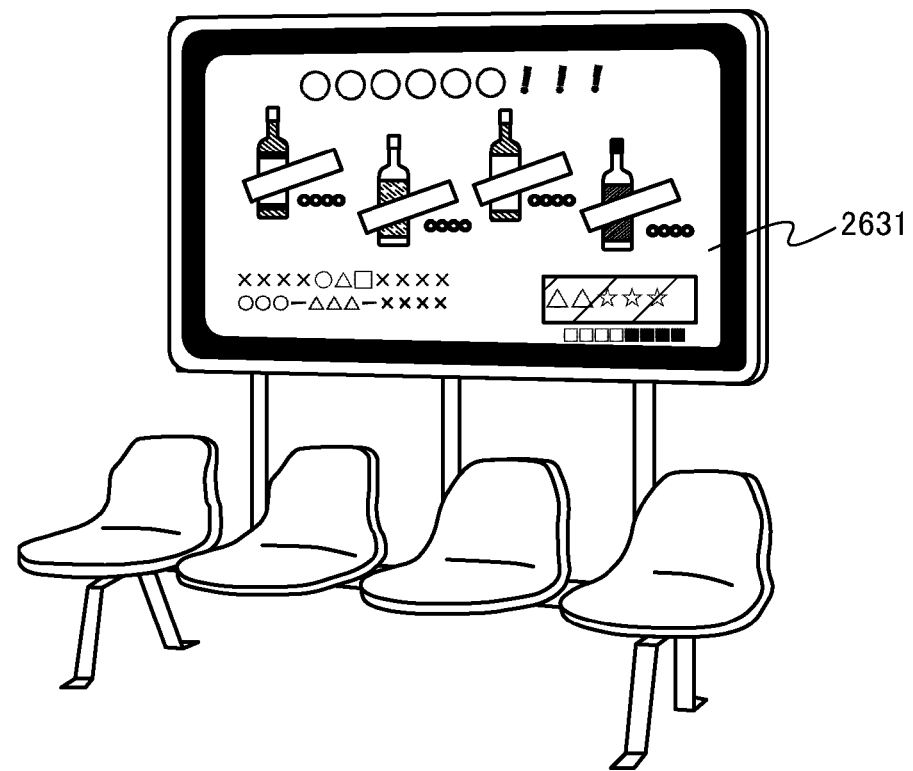
FIGS. 25A and 25B each illustrate an example of a usage pattern of electronic paper.

FIG. 25A illustrates a poster 2631 formed using electronic paper. In the case where an advertising medium is printed paper, the advertisement is replaced by manpower; however, by using electronic paper, the advertising display can be changed in a short time. Further, an image can be stably displayed without being distorted. Note that the poster may be configured to transmit and receive data wirelessly.

Figure 25B:
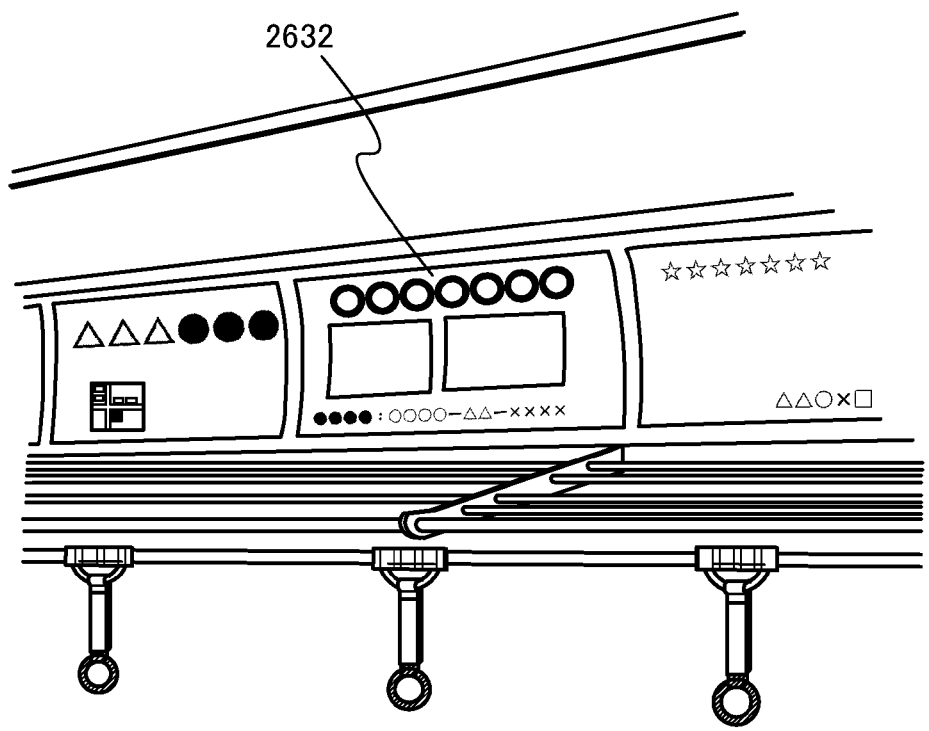

FIG. 25B illustrates an advertisement 2632 in a vehicle such as a train. In the case where an advertising medium is printed paper, the advertisement is replaced by manpower; however, by using electronic paper, the advertising display can be changed in a short time without a lot of manpower. Further, an image can be stably displayed without being distorted. Note that the advertisement in a vehicle may be configured to transmit and receive data wirelessly.

Figure 26:
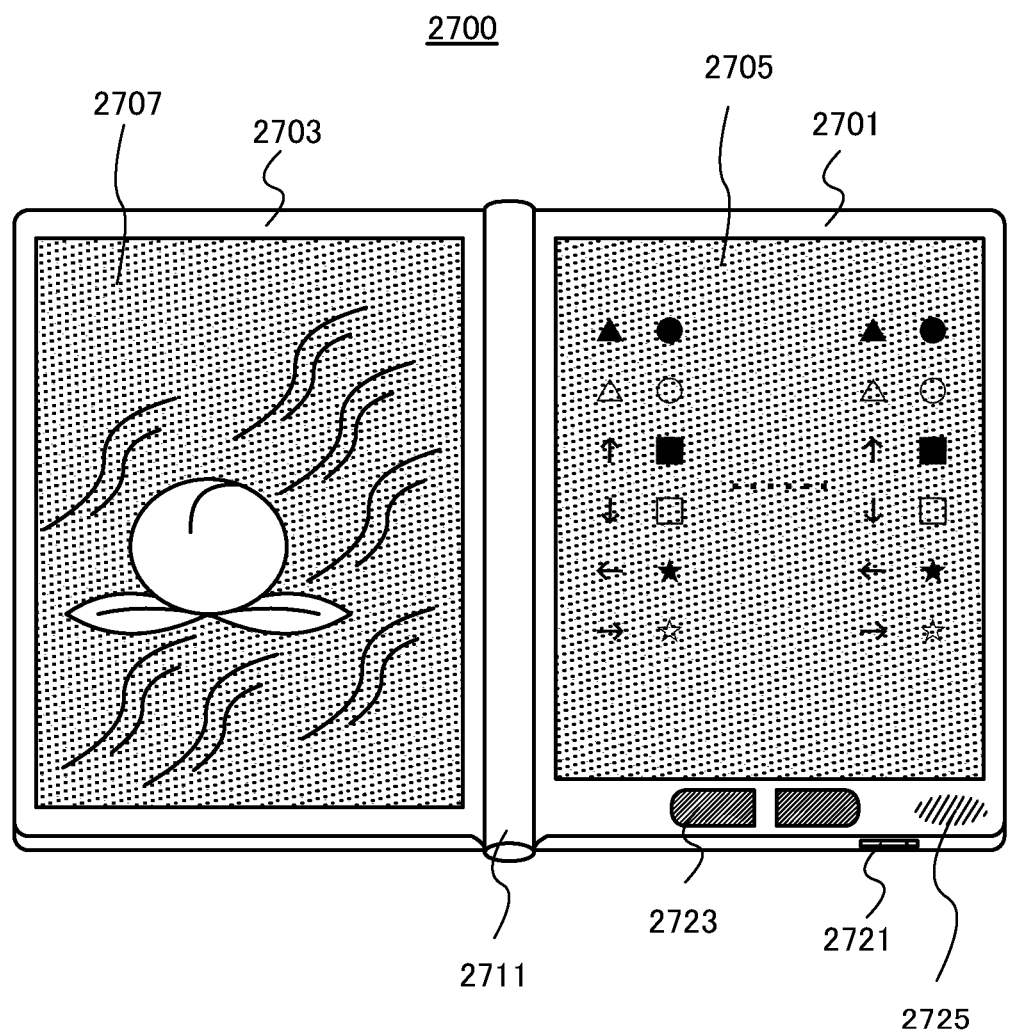
FIG. 26 is an external view of an example of an electronic book reader.

FIG. 26 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 26) can display text and a display portion on the left side (the display portion 2707 in FIG. 26) can display graphics.

FIG. 26 illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Embodiment 9

A semiconductor device according to the present invention can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 27A:
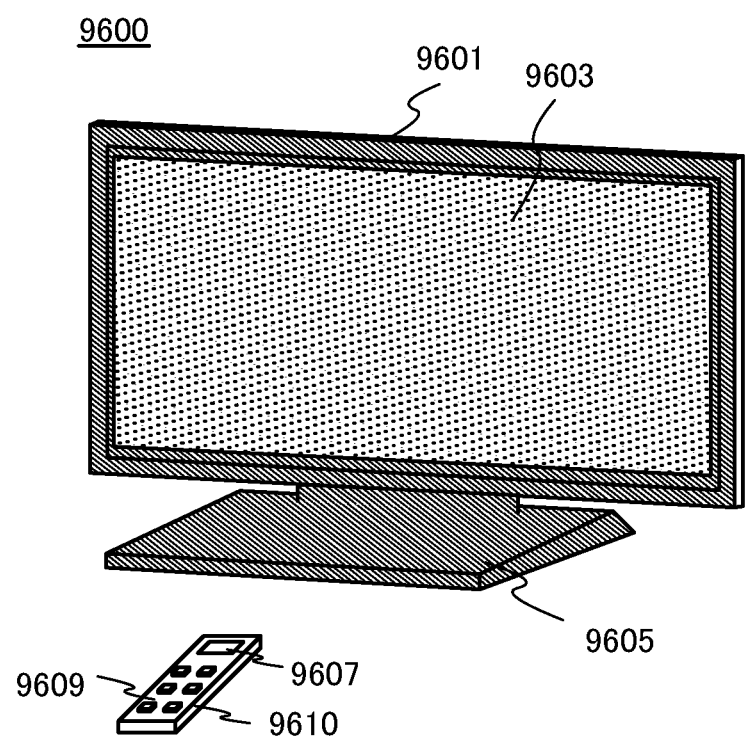
FIG. 27A is an external view of an example of a television device and FIG. 27B is an external view of an example of a digital photo frame.

FIG. 27A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 27B:
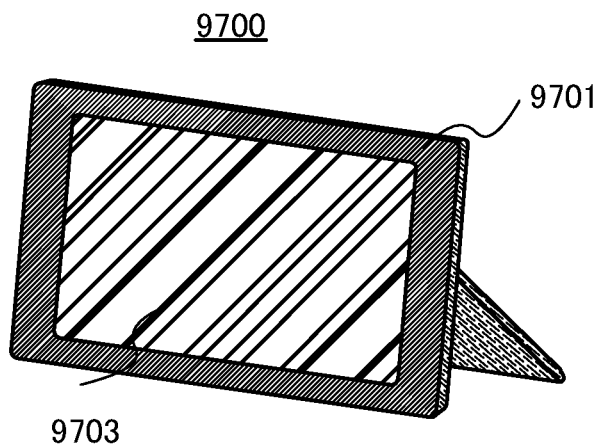

FIG. 27B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 28A:
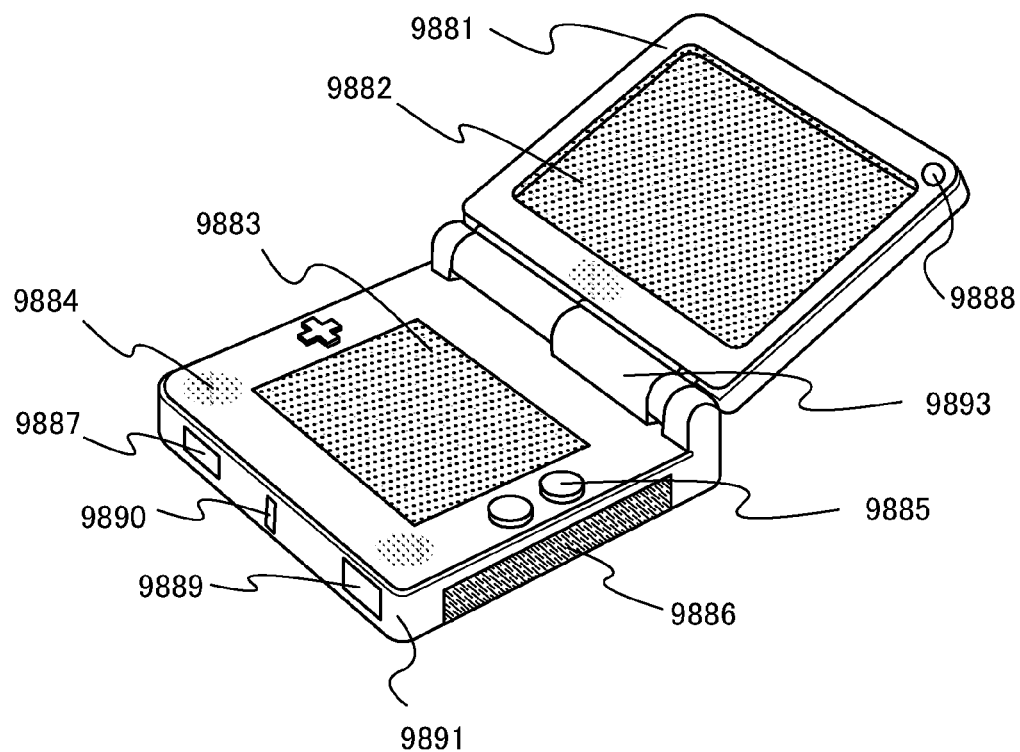
FIGS. 28A and 28B each illustrate an example of an amusement machine.

FIG. 28A is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 28A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device is provided. The portable game machine illustrated in FIG. 28A has a function of reading a program or data stored in a recording medium to display it on the display portion, and a function of sharing information with another portable game machine by wireless communication. Note that a function of the portable game machine illustrated in FIG. 28A is not limited to those described above, and the portable game machine can have a variety of functions.

Figure 28B:
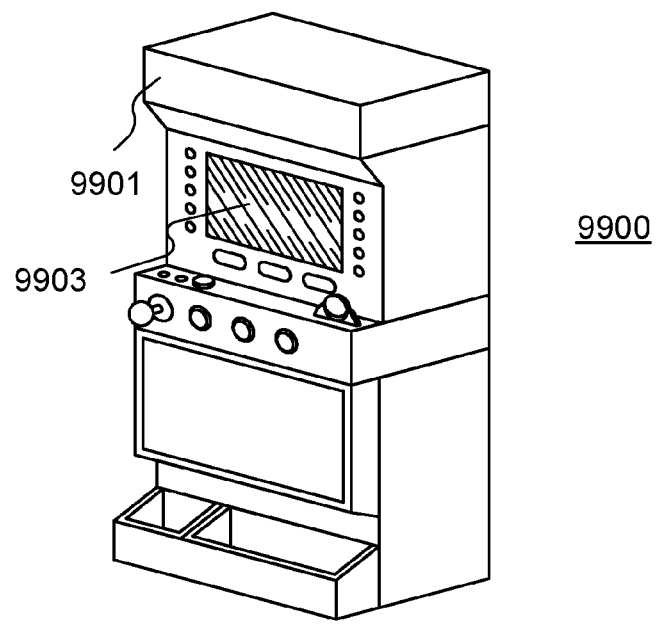

FIG. 28B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to the present invention is provided.

Figure 29A:
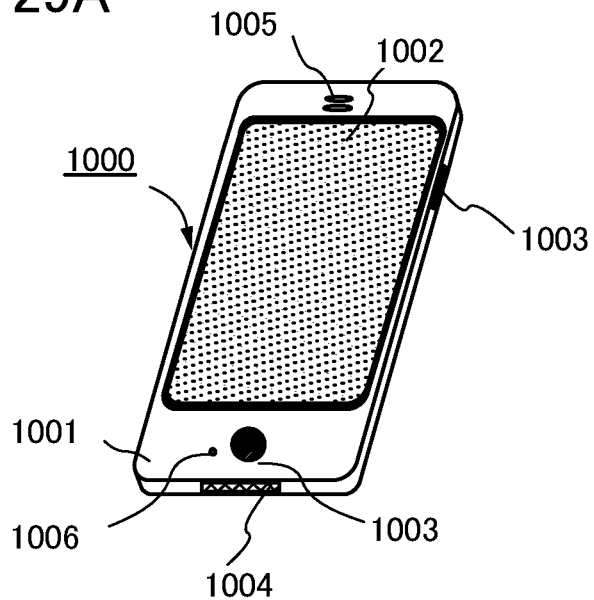
FIGS. 29A and 29B each illustrate an example of a mobile phone.

FIG. 29A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 29A is touched with a finger or the like, data can be input into the mobile phone handset 1000. Further, operations such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion is the one of moving image data, the screen mode is changed to the display mode. When the signal is text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 29B:
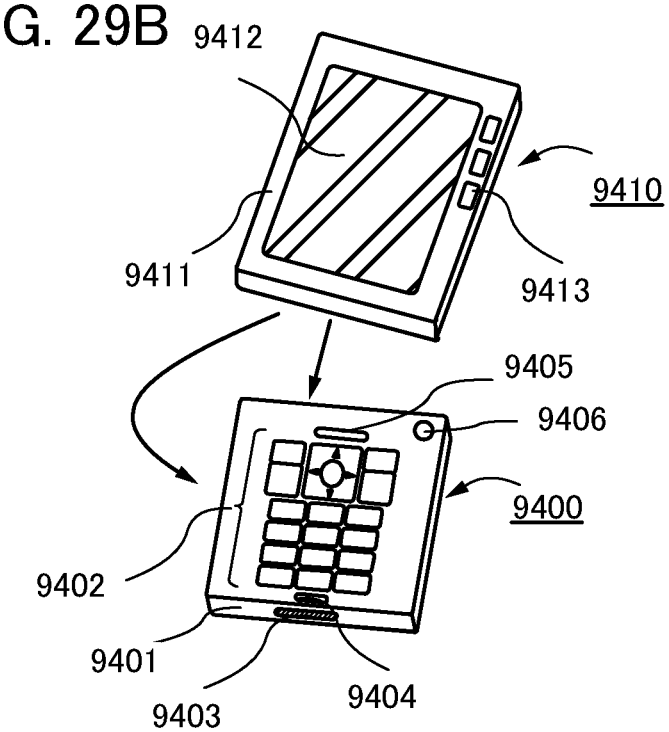

FIG. 29B also illustrates an example of a mobile phone handset. The mobile phone handset in FIG. 29B includes a display device 9410 and a communication device 9400. The display device 9410 includes a housing 9411 including a display portion 9412 and operation buttons 9413. The communication device 9400 includes a housing 9401 including operation buttons 9402, an external input terminal 9403, a microphone 9404, a speaker 9405, and a light-emitting portion 9406 which emits light when an incoming call is received. The display device 9410 having a display function can be detached from the communication device 9400 in two directions indicated by arrows. Therefore, the display device 9410 and the communication device 9400 having a telephone function can be attached to each other along either minor axes thereof or major axes thereof. When only the display function is need, the display device 9410 can be used independently while the communication device 9400 is detached from the display device 9410. The communication device 9400 and the display device 9410 each can transmit and receive images or input information by wireless communication or wired communication and each have a rechargeable battery.

This application is based on Japanese Patent Application serial no. 2008-286278 filed with Japan Patent Office on Nov. 7, 2008, the entire contents of which are hereby incorporated by reference.

EXPLANATION OF REFERENCE

100: substrate, 101: gate electrode layer, 102: gate insulating film, 103: oxide semiconductor film, 104: oxide semiconductor film, 106: resist mask, 107: oxide semiconductor layer, 108: oxide semiconductor layer, 109*a*: resist mask, 109*b*: resist mask, 110*a*: conductive layer, 110*b*: conductive layer, 111*a*: oxide semiconductor layer, 111*b*: oxide semiconductor layer, 112: recessed portion, 113: barrier film, 114: transparent conductive layer, 114*a*: transparent conductive layer, 114*b*: transparent conductive layer, 114*c*: transparent conductive layer, 120: capacitor wiring, 121: first terminal, 122: contact hole, 123: conductive film, 124: second terminal, 125: connection electrode, 126: contact hole, 126*a*: contact hole, 126*b*: contact hole, 126*c*: contact hole, 127: electrode, 130: insulating film, 150: thin film transistor, 200: substrate, 201: gate electrode layer, 202: gate insulating film, 203 oxide semiconductor film, 207: oxide semiconductor layer, 210*a*: conductive layer, 210*b*: conductive layer, 211*a*: oxide semiconductor layer, 211*b*: oxide semiconductor layer, 213: barrier film, 214: transparent conductive layer, 230: insulating film, 250: thin film transistor, 300: substrate, 301: gate electrode layer, 302: gate insulating film, 303: first oxide semiconductor film, 307: oxide semiconductor layer, 308: oxide semiconductor layer, 310*a*: conductive layer, 310*b*: conductive layer, 311*a*: oxide semiconductor layer, 311*b*: oxide semiconductor layer, 313: barrier film, 314: transparent conductive layer, 315: channel protective layer, 323: conductive layer, 330: insulating film, 350: thin film transistor, 580: substrate, 581: thin film transistor, 583: barrier film, 584: barrier film, 585: insulating layer, 587: first electrode layer, 588: second electrode layer, 589: spherical particle, 590*a*: black region, 590*b*: white region, 594: cavity, 595: filler, 596: substrate, 1000: cellular phone, 1001: housing, 1002: display portion, 1003: operation buttons, 1004: external connection port, 1005: speaker, 1006: microphone, 2600: TFT substrate, 2601: counter substrate, 2602: sealant, 2603: pixel portion, 2604: display element, 2605: colored layer, 2606: polarizing plate, 2607: polarizing plate, 2608: wiring circuit portion, 2609: flexible wiring board, 2610: cold cathode tube, 2611: reflective plate, 2612: circuit substrate, 2613: diffusion plate, 2631: poster, 2632: advertisement in a vehicle, 2700: e-book reader, 2701: housing, 2703: housing, 2705: display portion, 2707: display portion, 2711: axis portion, 2721: power switch, 2723: operation key, 2725: speaker, 4001: first substrate, 4002: pixel portion, 4003: signal line driver circuit, 4004: scanning line driver circuit, 4005: sealant, 4006: second substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: barrier film, 4021: insulating layer, 4030: pixel electrode layer, 4031: counter electrode layer, 4032: insulating layer, 4033 insulating film, 4035: columnar spacer, 4501: first substrate, 4502: pixel portion, 4503*a*: signal line driver circuit, 4503*b*: signal line driver circuit, 4504*a*: scanning line driver circuit, 4504*b*: scanning line driver circuit, 4505: sealant, 4506: second substrate, 4507: filler, 4509: thin film transistor, 4510: thin film transistor, 4511: light-emitting element, 4512: electroluminescent layer, 4513: second electrode layer, 4515: connection terminal electrode, 4516: terminal electrode, 4517: first electrode layer, 4518*a*: FPC, 4518*b*: FPC, 4519: anisotropic conductive film, 4520: partition wall, 5300: substrate, 5301: pixel portion, 5302: scanning line driver circuit, 5303: single line driver circuit, 5400: substrate, 5401: pixel portion, 5402: first scanning line driver circuit, 5403: single line driver circuit, 5404: second scanning line driver circuit, 5501: first wiring, 5502: second wiring, 5503: third wiring, 5504: fourth wiring, 5505: fifth wiring, 5506: sixth wiring, 5543: node, 5544: node, 5571: first thin film transistor, 5572: second thin film transistor, 5573: third thin film transistor, 5574: fourth thin film transistor, 5575: fifth thin film transistor, 5576: sixth thin film transistor, 5577: seventh thin film transistor, 5578: eighth thin film transistor, 5601: driver IC, 5602_1 to 5602_M: switch groups, 5603*a*: first thin film transistor, 5603*b*: second thin film transistor, 5603*c*: third thin film transistor, 5611: first wiring, 5612: second wiring, 5613: third wiring, 5621_1 to 5621_M: wirings, 5701: flip-flop, 5703*a*: timing, 5703*b*: timing, 5703*c*: timing, 5711: first wiring, 5712: second wiring, 5713: third wiring, 5714: fourth wiring, 5715: fifth wiring, 5716: sixth wiring, 5717_1 to 5717__n: seventh wirings, 5721_J: signal, 5803*a*: timing, 5803*b*: timing, 5803*c*: timing, 5821_J: signal, 6400: pixel, 6401: switching transistor, 6402: driver transistor, 6403: capacitor element, 6404: light-emitting element, 6405: signal line, 6406: scanning line, 6407: power supply line, 6408: common electrode, 7001: driver TFT, 7002: light-emitting element, 7003: cathode, 7004: light-emitting layer, 7005: anode, 7008: barrier film, 7009: barrier film, 7011: driver TFT, 7012: light-emitting element, 7013: cathode, 7014: light-emitting layer, 7015: anode, 7016: light-blocking film, 7017: conductive film, 7018: barrier film, 7019: barrier film, 7021: driver TFT, 7022: light-emitting element, 7023: cathode, 7024: light-emitting layer, 7025: anode, 7027: conductive film, 7028: barrier film, 7029: barrier film, 9400: communication device, 9401: housing, 9402: operation button, 9403: external input terminal, 9404: microphone, 9405: speaker, 9406: light-emitting portion, 9410: display device, 9411: housing, 9412: display portion, 9413: operation button, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation keys, 9886: recording medium insertion portion, 9887: connection terminal, 9888: sensor, 9889: microphone, 9890: LED lamp, 9891: housing, 9893: connection portion, 9900: slot machine, 9901: housing, 9903: display portion.

The invention claimed is:

1. A semiconductor device comprising:
a substrate;
a base film over the substrate;
a gate electrode layer over the base film;
a gate insulating film over the gate electrode layer;
a source electrode and a drain electrode over the gate insulating film;
a first oxide semiconductor layer over the source electrode and the drain electrode;
a source region between the source electrode and the first oxide semiconductor layer, and a drain region between the drain electrode and the first oxide semiconductor layer; and
a barrier film in contact with the first oxide semiconductor layer,
wherein a concentration of sodium in the first oxide semiconductor layer is less than or equal to $5 \times 10^{19}$ cm$^{-3}$.

2. A semiconductor device comprising:
a substrate;
a base film over the substrate;
a gate electrode layer over the base film;
a gate insulating film over the gate electrode layer;
a first oxide semiconductor layer over the gate electrode layer with the gate insulating film interposed therebetween;
a source region and a drain region which are provided separately from each other over the first oxide semiconductor layer;
a source electrode over and in contact with the source region, and a drain electrode over and in contact with the drain region; and
a barrier film in contact with a part of the first oxide semiconductor layer,
wherein a concentration of sodium in the first oxide semiconductor layer is less than or equal to $5 \times 10^{19}$ cm$^{-3}$.

3. A semiconductor device comprising:
a substrate;
a base film over the substrate;
a gate electrode layer over the base film;
a gate insulating film over the gate electrode layer;
a first oxide semiconductor layer over the gate insulating film;
a channel protective layer provided in a region overlapping with a channel formation region of the first oxide semiconductor layer;
a source electrode and a drain electrode over the first oxide semiconductor layer;
a source region between the source electrode and the first oxide semiconductor layer, and a drain region between the drain electrode and the first oxide semiconductor layer; and
a barrier film in contact with a part of the channel protective layer,
wherein a concentration of sodium in the first oxide semiconductor layer is less than or equal to $5 \times 10^{19}$ cm$^{-3}$.

4. The semiconductor device according to any one of claims 1 to 3, wherein the barrier film includes one or more of an aluminum oxide film, an aluminum nitride film, an aluminum oxynitride film, and an aluminum nitride oxide film.

5. The semiconductor device according to any one of claims 1 to 3, wherein a thickness of the barrier film is greater than or equal to 1 nm and less than or equal to 200 nm.

6. The semiconductor device according to any one of claims 1 to 3, wherein the gate insulating film includes one or more of an aluminum oxide film, an aluminum nitride film, an aluminum oxynitride film, and an aluminum nitride oxide film.

7. The semiconductor device according to any one of claims 1 to 3, wherein the first oxide semiconductor layer includes indium, gallium, and zinc.

8. The semiconductor device according to any one of claims 1 to 3, wherein the source region and the drain region are formed from second oxide semiconductor layers having higher conductivity than the first oxide semiconductor layer.

9. The semiconductor device according to claim 8, wherein the second oxide semiconductor layers include indium, gallium, and zinc.

10. The semiconductor device according to any one of claims 1 to 3, wherein the first oxide semiconductor layer includes a crystal grain.

11. The semiconductor device according to claim 10, wherein a diameter of the crystal grain is greater than or equal to 1 nm and less than or equal to 10 nm.

* * * * *

UNITED STATES PATENT AND TRADEMARK OFFICE
CERTIFICATE OF CORRECTION

PATENT NO. : 8,502,216 B2
APPLICATION NO. : 12/612700
DATED : August 6, 2013
INVENTOR(S) : Kengo Akimoto et al.

It is certified that error appears in the above-identified patent and that said Letters Patent is hereby corrected as shown below:

In the Specification

At column 16, line 36, "bather" should be -- barrier --;

At column 35, line 13, "bather" should be -- barrier --;

At column 35, line 14, "bather" should be -- barrier --;

At column 35, line 38, "bather" should be -- barrier --;

At column 40, line 23, "bather" should be -- barrier --.

Signed and Sealed this
Fifth Day of November, 2013

Teresa Stanek Rea
*Deputy Director of the United States Patent and Trademark Office*